(12) United States Patent
Lablans

(10) Patent No.: US 10,375,252 B2
(45) Date of Patent: Aug. 6, 2019

(54) METHOD AND APPARATUS FOR WIRELESSLY ACTIVATING A REMOTE MECHANISM

(71) Applicant: Peter Lablans, Morris Township, NJ (US)

(72) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 153 days.

(21) Appl. No.: 15/499,849

(22) Filed: Apr. 27, 2017

(65) Prior Publication Data

US 2017/0230509 A1 Aug. 10, 2017

Related U.S. Application Data

(63) Continuation-in-part of application No. 14/752,997, filed on Jun. 28, 2015, now abandoned, which is a continuation-in-part of application No. 14/324,217, filed on Jul. 6, 2014, now Pat. No. 9,100,166, which is a continuation of application No. 13/118,767, filed on May 31, 2011, now Pat. No. 8,817,928, application No. 15/499,849, which is a continuation-in-part of application No. 15/442,556, filed on Feb. 24, 2017, and a continuation-in-part of application No. 15/244,985, filed on Aug. 23, 2016,
(Continued)

(51) Int. Cl.
*H03M 13/00* (2006.01)
*H04M 11/00* (2006.01)
*H04M 1/02* (2006.01)
*G07C 9/00* (2006.01)
*H03K 23/54* (2006.01)
*H04J 13/00* (2011.01)
*H04J 13/10* (2011.01)

(52) U.S. Cl.
CPC ....... *H04M 11/007* (2013.01); *G07C 9/00007* (2013.01); *G07C 9/00174* (2013.01); *G07C 9/00309* (2013.01); *H03K 23/54* (2013.01); *H04J 13/0029* (2013.01); *H04J 13/0033* (2013.01); *H04J 13/0074* (2013.01); *H04J 13/10* (2013.01); *H04M 1/0202* (2013.01); *G07C 9/00571* (2013.01); *G07C 2009/00769* (2013.01)

(58) Field of Classification Search
CPC ............... H03M 13/007; G07C 9/0007; G07C 9/00174; H04J 13/0029; H04J 13/10
See application file for complete search history.

(56) References Cited

U.S. PATENT DOCUMENTS 4,567,594 A * 1/1986 Deodhar ................. G06F 7/724
714/759
4,747,103 A * 5/1988 Iwamura ............. H03M 13/151
714/755

(Continued)

*Primary Examiner* — Esaw T Abraham

(57) ABSTRACT

A system includes a first device to select and transmit a first code by a transmitter to a remote device; the remote device implements a sequence detector based on the first code; the transmitter in the first device generates a first sequence based on the first code; the sequence detector in the remote device detects the first sequence and activates the mechanism based on the detection; the first device may be a smartphone or a smart watch.

20 Claims, 20 Drawing Sheets

Related U.S. Application Data which is a continuation-in-part of application No. 14/975,841, filed on Dec. 20, 2015, which is a continuation-in-part of application No. 14/622,860, filed on Feb. 14, 2015, now Pat. No. 9,218,158, which is a continuation of application No. 14/064,089, filed on Oct. 25, 2013, now abandoned, which is a continuation-in-part of application No. 12/980,504, filed on Dec. 29, 2010, now Pat. No. 8,577,026.

(60) Provisional application No. 61/350,247, filed on Jun. 1, 2010, provisional application No. 62/455,555, filed on Feb. 6, 2017, provisional application No. 62/435,814, filed on Dec. 18, 2016, provisional application No. 62/299,935, filed on Feb. 25, 2016.

(56) References Cited

U.S. PATENT DOCUMENTS

| | | | |
|---|---|---|---|
| 4,747,105 | A | 5/1988 | Wilson et al. |
| 5,073,909 | A | 12/1991 | Kotzin et al. |
| 5,245,661 | A | 9/1993 | Lee et al. |
| 5,420,925 | A | 5/1995 | Michaels |
| 5,517,187 | A | 5/1996 | Bruwer et al. |
| 5,633,813 | A | 5/1997 | Srinivasan |
| 5,754,603 | A | 5/1998 | Thomas et al. |
| 5,799,010 | A | 8/1998 | Lomp et al. |
| 5,811,885 | A | 9/1998 | Griessbach |
| 5,872,513 | A | 2/1999 | Fitzgibbon et al. |
| 5,987,056 | A | 11/1999 | Banister |
| 6,067,028 | A | 5/2000 | Takamatsu |
| 6,212,174 | B1 | 4/2001 | Lomp et al. |
| 6,567,012 | B1 * | 5/2003 | Matsubara ............. B60R 25/24 340/12.18 |
| 6,567,017 | B2 * | 5/2003 | Medlock ................ G06F 7/584 341/50 |
| 6,606,342 | B1 | 8/2003 | Banister |
| 6,611,193 | B1 | 8/2003 | Weigl et al. |
| 6,785,401 | B2 | 8/2004 | Walker et al. |
| 6,788,668 | B1 | 9/2004 | Shah et al. |
| 6,788,708 | B1 | 9/2004 | Rainish et al. |
| 6,810,123 | B2 | 10/2004 | Farris et al. |
| 7,135,957 | B2 | 11/2006 | Wilson |
| 7,246,296 | B2 * | 7/2007 | Yokokawa ............ H03M 13/25 714/755 |
| 7,349,447 | B1 * | 3/2008 | Sung ........................ H04B 1/69 370/203 |
| 7,398,287 | B2 | 7/2008 | An |
| 7,580,472 | B2 * | 8/2009 | Lablans .................. H04J 13/00 331/78 |
| 7,589,613 | B2 | 9/2009 | Kraft |
| 7,623,663 | B2 * | 11/2009 | Farris ................. G07C 9/00182 380/239 |
| 7,634,694 | B2 * | 12/2009 | Green ............... H04L 25/03866 327/307 |
| 7,646,283 | B2 | 1/2010 | Wilcox |
| 7,720,187 | B2 * | 5/2010 | Mo ..................... H04B 1/71632 375/130 |
| 8,422,667 | B2 | 4/2013 | Fitzgibbon et al. |
| 8,712,601 | B2 | 4/2014 | Matsubara |
| 2002/0021686 | A1 | 2/2002 | Ozluturk et al. |
| 2005/0265430 | A1 | 12/2005 | Ozluturk et al. |
| 2009/0010431 | A1 | 1/2009 | De Vries et al. |
| 2010/0052845 | A1 | 3/2010 | Yamamoto et al. |
| 2013/0043973 | A1 | 2/2013 | Greisen et al. |
| 2013/0127593 | A1 | 5/2013 | Kuenzi et al. |
| 2014/0082707 | A1 | 3/2014 | Egan et al. |
| 2014/0340193 | A1 | 11/2014 | Zivkovic et al. |
| 2015/0139423 | A1 | 5/2015 | Hildebrandt et al. |

* cited by examiner

```
% states of shift register of LFSR based on configuration info
xor2=[1 2;2 1]; % XOR function
and2=[1 1;1 2]; % ADD function
conf=[0 0 1 0]+1; % configuration of LFSR without firs/last tap
m1=[conf(1) conf(1) conf(1) conf(1) conf(1)];% multiplier in tap into a2
m2=[conf(2) conf(2) conf(2) conf(2) conf(2)];% multiplier in tap into a3
m3=[conf(3) conf(3) conf(3) conf(3) conf(3)];% multiplier in tap into a4
m4=[conf(4) conf(4) conf(4) conf(4) conf(4)];% multiplier in tap into a5 shifsd=[1 0 0 0 0;0 1 0 0 0;0 0 1 0 0;0 0 0 1 0;0 0 0 0 1]+1;% initial shift register
sift(1,:)=[shifsd(1,:) 9 shifsd(2,:) 9 shifsd(3,:) 9 shifsd(4,:) 9 shifsd(5,:)];% all SR states % START PROCEDURE FOR DETERMINING SHIFT REGISTER CONTENT
for i=1:31
    in=shifsd(5,:);
    in5=m2t(m4,in); % signal in tap into a5
    % function m2t is vector operation for and2
    in4=m2t(m3,in); % signal in tap into a4
    in3=m2t(m2,in); % signal in tap into a3
    in2=m2t(m1,in); % signal in tap into a2 t5=sc2t(shifsd(4,:),in5); % calculated state of a5 after clock signal
    % sc2t is XOR operated over a vector
    t4=sc2t(shifsd(3,:),in4); % calculated state of a4 after clock signal
    t3=sc2t(shifsd(2,:),in3); % calculated state of a3 after clock signal
    t2=sc2t(shifsd(1,:),in2); % calculated state of a2 after clock signal
    % new shift register states after clock signal
    shifsd(5,:)=t5;
    shifsd(4,:)=t4;
    shifsd(3,:)=t3;
    shifsd(2,:)=t2;
    shifsd(1,:)=in;
    % STORE SHIFT REGISTER CONTENT IN MATRIX SIFT
    sift(i+1,:)=[shifsd(1,:) 9 shifsd(2,:) 9 shifsd(3,:) 9 shifsd(4,:) 9 shifsd(5,:)];
end
```

FIG. 15

```
function y=detb(bin)
% determine binary determinant
mb=[1 1;1 2];
sc2=[1 2;2 1];

lent=size(bin);
len=lent(1);

xx=len:-1:1;
xx;
ster=perms(xx);
pent=size(ster);
pen=pent(1);

sum=1;

for j=1:pen
      per=ster(j,:);
      k1=per(1);
      k2=per(2);
      k3=per(3);
      k4=per(4);
      k5=per(5);

a1=bin(1,k1);
      a2=bin(2,k2);
      pel=mb(a1,a2);
      a3=bin(3,k3);
      pel=mb(pel,a3);
      a4=bin(4,k4);
      pel=mb(pel,a4);
      a5=bin(5,k5);
      pel=mb(pel,a5);
      sum=sc2(sum,pel);
  end
  y=sum;
```

FIG. 16

```
% solve equations with Cramer's rule
% output is [1 0 1 1 1] first five symbols
zz=[2 1 2 2 2]'
cac=sift(1:5,25:29)
bac=cac;
bac(:,1)=zz;
a1=detb(bac)

bac=cac;
bac(:,2)=zz;
a2=detb(bac)

bac=cac;
bac(:,3)=zz;
a3=detb(bac)

bac=cac;
bac(:,4)=zz;
a4=detb(bac)

bac=cac;
bac(:,5)=zz;
a5=detb(bac)

```
% solve equations with Cramer's rule
% output is [1 0 1 1 1] five symbols on moments 1, 4, 7, 10 and 13
zz=[2 1 2 2 2]'
cac(1,:)=sift(1,25:29);
cac(2,:)=sift(4,25:29);
cac(3,:)=sift(7,25:29);
cac(4,:)=sift(10,25:29);
cac(5,:)=sift(13,25:29);

bac=cac;
bac(:,1)=zz;
a1=detb(bac)

bac=cac;
bac(:,2)=zz;
a2=detb(bac)

bac=cac;
bac(:,3)=zz;
a3=detb(bac)

bac=cac;
bac(:,4)=zz;
a4=detb(bac)

bac=cac;
bac(:,5)=zz;
a5=detb(bac)

```
% 4-state m-sequence 1
sc4=[1 2 3 4;2 1 4 3;3 4 1 2;4 3 2 1];
m4=[1 1 1 1;1 2 3 4;1 3 4 2;1 4 2 3];
shifts=[1 2 3 0 2]+1;

conf=[3 0 2 0 1 1];
zer=ones(1,5);
i0=zer+conf(1);
i1=zer+conf(2);
i2=zer+conf(3);
i3=zer+conf(4);
i4=zer+conf(5);
i5=zer+conf(6);
shifsd4=[1 0 0 0 0;0 1 0 0 0;0 0 1 0 0;0 0 0 1 0;0 0 0 0 1]+1;% initial shift register
sift4(1,:)=[shifsd(1,:) 9 shifsd(2,:) 9 shifsd(3,:) 9 shifsd(4,:) 9 shifsd(5,:)];% all SR states
% START PROCEDURE FOR DETERMINING SHIFT REGISTER CONTENT for i=1:1023 in=m4t(shifsd4(5,:),i5);
    in4=m4t(in,i4);
    in3=m4t(in,i3);
    in2=m4t(in,i2);
    in1=m4t(in,i1);
    in0=m4t(in,i0);
    t4=sc4t(shifsd4(4,:),in4);
    t3=sc4t(shifsd4(3,:),in3);
    t2=sc4t(shifsd4(2,:),in2);
    t1=sc4t(shifsd4(1,:),in1);
    shifsd4(5,:)=t4;
    shifsd4(4,:)=t3;
    shifsd4(3,:)=t2;
    shifsd4(2,:)=t1;
    shifsd4(1,:)=in0;

% STORE SHIFT REGISTER CONTENT IN MATRIX SIFT4
    sift4(i+1,:)=[shifsd4(1,:) 9 shifsd4(2,:) 9 shifsd4(3,:) 9 shifsd4(4,:) 9 shifsd4(5,:)];
end
```

FIG. 21

```
function y=detb4(bin)
% determine 4-state determinant sc4=[1 2 3 4;2 1 4 3;3 4 1 2;4 3 2 1];
m4=[1 1 1 1;1 2 3 4;1 3 4 2;1 4 2 3];
lent=size(bin);
len=lent(1);

xx=len:-1:1;
xx;
ster=perms(xx);
pent=size(ster);
pen=pent(1);

sum=1;

for j=1:pen
     per=ster(j,:);
     k1=per(1);
     k2=per(2);
     k3=per(3);
     k4=per(4);
     k5=per(5);

a1=bin(1,k1);
     a2=bin(2,k2);
     pel=m4(a1,a2);
     a3=bin(3,k3);
     pel=m4(pel,a3);
     a4=bin(4,k4);
     pel=m4(pel,a4);
     a5=bin(5,k5);
     pel=m4(pel,a5);
     sum=sc4(sum,pel);
  end
  y=sum;
```

FIG. 22

```
% solve equations with Cramer's rule
% output is [1 0 2 3 1] five 4-state symbols
zz=[2 1 3 4 2]'
cac=sift4(1:5,25:29);
bac=cac;
bac(:,1)=zz;
a1=detb4(bac)

bac=cac;
bac(:,2)=zz;
a2=detb4(bac)

bac=cac;
bac(:,3)=zz;
a3=detb4(bac)

bac=cac;
bac(:,4)=zz;
a4=detb4(bac)

bac=cac;
bac(:,5)=zz;
a5=detb4(bac)

METHOD AND APPARATUS FOR WIRELESSLY ACTIVATING A REMOTE MECHANISM

CROSS-REFERENCE TO RELATED APPLICATIONS

This application is a continuation-in-part of and claims the benefit of U.S. Non-provisional patent application Ser. No. 14/752,997 filed on Jun. 28, 2015. U.S. Non-provisional patent application Ser. No. 14/752,997 is a continuation-in-part of and claims the benefit U.S. Non-provisional patent application Ser. No. 14/324,217 filed on Jul. 6, 2014 which is a continuation of and claims the benefit of U.S. Non-provisional patent application Ser. No. 13/118,767 filed on May 31, 2011, which claims the benefit of U.S. Provisional Patent Application Ser. No. 61/350,247, filed Jun. 1, 2010 which are all incorporated by reference herein in their entirety. This application is a continuation-in-part of and claims the benefit of U.S. Non-provisional patent application Ser. No. 15/442,556 filed on Feb. 24, 2017. This application is a continuation-in-part of and claims the benefit of U.S. Non-provisional patent application Ser. No. 15/244,985 filed on Aug. 23, 2016, which is a continuation-in-part of U.S. Non-provisional patent application Ser. No. 14/975,841 filed on Dec. 12, 2015, which is a continuation-in-part of U.S. Non-provisional patent application Ser. No. 14/622,860 filed on Feb. 14, 2015 now U.S. Pat. No. 9,218,158, which is a continuation of U.S. Non-provisional patent application Ser. No. 14/064,089 filed on Oct. 25, 2013, which is a continuation-in-part of U.S. Non-provisional patent application Ser. No. 12/980,504 filed on Dec. 29, 2010 now U.S. Pat. No. 8,577,026 and which are all incorporated herein by reference.

BACKGROUND OF THE INVENTION

The present invention relates to detection by a receiver of a sequence with a sequence detector, the sequence being transmitted by a transmitter. The sequence detector is determined by a code that is also transmitted to the receiver.

Linear Feedback Shift Registers (LFSRs) are known and are applied in applications such as sequence generators, scramblers, coders, descramblers and decoders. An LFSR can be a binary LFSR wherein a shift register element can hold a binary symbol, the binary symbol being represented by a binary signal. An LFSR can be a non-binary LFSR, wherein a shift register element can hold a non-binary symbol; a non-binary symbol having one of n states with n>2. A single non-binary symbol can be represented by a signal. In one embodiment such a signal representing a non-binary symbol can be a single non-binary signal able to have one of n states. A non-binary symbol in another embodiment can be represented by a plurality of signals, for instance, by a plurality of binary signals. For instance, an 8-state symbol can be represented by a word of 3 bits, each bit being represented by a binary signal.

A binary or n-state LFSR can be in Fibonacci or in Galois configuration.

In many applications, including in scrambling and descrambling and in spread-spectrum modulation a sequence of n-state symbols with n≥2 and n>2, some knowledge is required about a phase or synchronization of a sequence that was transmitted from a transmitter in order to be detected or decoded at a receiver. In the instant application, an n-state sequence is assumed to be associated with an n-state LFSR. In some cases one wants to know how a phase or synchronization point of a received sequence relates to an initial state of a sequence generator. In other cases one would like to start generating in parallel to a received sequence a sequence that is synchronized with the received sequence.

Different n-state LFSRs with n=2 or n>2 can be used to generate different n-state sequences that can be detected with corresponding sequence detectors. Applications of sequence generators and detectors are believed to be currently not available for unlocking or activating a mechanism. Accordingly novel and improved combinations of n-state LFSRs with n=2 or n>2 as sequence generators and detectors are required to activate a mechanism.

SUMMARY OF THE INVENTION

In accordance with an aspect of the present invention a method is provided for activating a mechanism by one or more signals representing one or more symbols, comprising activating a first device containing a transmitter to retrieve a first code from a plurality of codes in a memory on the first device, the first code determining a first shift register based sequence generator on the first device to generate the first sequence of symbols, transmitting the first code by the transmitter in the first device to a receiver in a second device that is spatially separated from the first device, the receiver in the second device receiving the first code, configuring on a processor in the second device a sequence detector in a first configuration, the first configuration is retrieved, based on the first code, from a plurality of detector configurations stored in a memory on the second device, generating the first sequence of symbols by the first shift register based sequence generator and transmitting the first sequence of symbols by the transmitter in the first device, the receiver in the second device receiving the first sequence of symbols, processing the first sequence of symbols received by the receiver in the second device by the sequence detector in the first configuration on the processor in the second device and activating the mechanism in the second device when a presence of the first sequence of symbols is detected by the sequence detector in the first configuration on the processor in the second device.

In accordance with a further aspect of the present invention a method is provided, wherein the first code in the memory on the first device is disabled after retrieval from the memory and the first detector configuration is disabled on the memory of the second device after receipt of the first code by the receiver in the second device.

In accordance with yet a further aspect of the present invention a method is provided, further comprising: activating in the first device of a second code being selected from the plurality of codes on the memory of the first device and excluding from activation a previously used code in the memory, the second code determining a second sequence of symbols, transmitting to the receiver in the second device the second code and the second sequence of symbols.

In accordance with yet a further aspect of the present invention a method is provided, wherein the first code determines an n-state feedback shift register with k shift register elements, each enabled to hold an n-state symbol, with k>2 and n>1, a location of a feedback tap and a number of symbols in the first sequence of symbols.

In accordance with yet a further aspect of the present invention a method is provided, wherein the first code determines an n1-state feedback shift register and the second code determines an n2-state feedback shift register, with n1 and n2 being different integers greater than 1.

In accordance with yet a further aspect of the present invention a method is provided, wherein n>3 and an n-state symbol is represented by a plurality of bits.

In accordance with yet a further aspect of the present invention a method is provided, wherein the mechanism is a lock and activating the mechanism unlocks the lock.

In accordance with yet a further aspect of the present invention a method is provided, wherein the mechanism is a lock in a car and activating the mechanism unlocks the lock.

In accordance with yet a further aspect of the present invention a method is provided, wherein the mechanism is a motor.

In accordance with yet a further aspect of the present invention a method is provided, wherein the mechanism is a motor that opens a door.

In accordance with yet a further aspect of the present invention a method is provided, wherein the first device is a smartphone.

In accordance with yet a further aspect of the present invention a method is provided, wherein the plurality of codes is ordered and the processor in the second device disables use of any unused codes in the plurality of codes that precedes a received code.

In accordance with yet a further aspect of the present invention a method is provided, further comprising: the processor in the first device determining on at least two different moments validation data from a sensor that is part of the first device and storing the validation data on the memory in the first device, a second transmitter in the first device transmitting on at least two different moments the validation data to a remote server and the processor on the second device comparing the validation data received from the first device and the validation received from the remote server to validate the first device.

In accordance with another aspect of the present invention a system is provided to activate a mechanism by one or more signals representing a plurality of symbols, comprising: a first device including a transmitter and a memory storing a plurality of codes, each code determining a configuration of a sequence generator to generate a sequence of symbols and a processor, the processor being configured to retrieve instructions from the memory to perform the steps: selecting a first code in the memory and transmitting the first code by the transmitter, retrieving, based on the first code, a first configuration of the sequence generator from the memory to implement the sequence generator on the processor, generating a first sequence of symbols by the implemented sequence generator in the first configuration for transmission and a second device including a receiver, a memory storing a plurality of sequence detector configurations, each sequence detector configuration being determined by a code, a mechanism enabled to be activated by the processor, and a processor on the receiver, the processor on the receiver being configured to retrieve instructions from the memory to perform the steps: receiving the first code from the transmitter and retrieving, based on the first code, a first sequence detector configuration from the memory on the second device to implement a sequence detector on the processor on the second device, receiving the first sequence of symbols from the transmitter, processing the first sequence of symbols from the transmitter by the implemented sequence detector and activating the device when a presence of the first sequence of symbols is detected by the implemented sequence detector.

In accordance with yet another aspect of the present invention a system is provided, wherein the first code in the memory on the first device is disabled after retrieval from the memory and the first detector configuration is disabled on the memory of the second device after receipt of the first code by the receiver in the second device. In accordance with yet another aspect of the present invention a system is provided, wherein the first code determines an n-state feedback shift register with k shift register elements, each enabled to hold an n-state symbol, with k>2 and n>1, a location of a feedback tap and a number of symbols in the first sequence of symbols.

In accordance with yet another aspect of the present invention a system is provided, wherein the mechanism is a lock and activating the mechanism unlocks the lock.

In accordance with yet another aspect of the present invention a system is provided, further comprising: one or more sensors in the first device, a second transmitter on the first device, the processor in the first device enabled to retrieve instructions from the memory in the first device to perform the steps: collecting on at least two different moments data from the one or more sensors and storing the collected data on the memory in the first device, the second transmitter in the first device transmitting on at least two different moments the data collected from the one or more sensors to a remote server and the first transmitter transmitting validation data based on data from the one or more sensors collected on at least two different moments to the receiver on the second device, a second receiver on the second device, the second receiver being enabled to receive validation data based on data from the one or more sensors collected on at least two different moments from the remote server, the processor on the second device being enabled to retrieve instructions from the memory on the secondary device to perform the steps: comparing the validation data received from the first device and the validation received from the remote server to validate the first device.

In accordance with yet a further aspect of the present invention a smartphone is provided, to wirelessly activate a mechanism in a remote device by one or more signals representing one or more symbols, comprising: a memory storing a plurality of codes, each code determining a configuration of a sequence generator to generate a sequence of symbols, a processor and a transmitter and an antenna, wherein the processor is configured to retrieve instructions from the memory to perform the steps: selecting a first code in the memory, the first code representing a first configuration of a sequence generator, providing the first code for transmission by the transmitter to transmit via the antenna to the remote device, retrieving, based on the first code, the first configuration of the sequence generator from the memory to implement the sequence generator on the processor and generating by the implemented sequence generator a first sequence of symbols for transmission by the transmitter via the antenna to the remote device to activate the mechanism.

In accordance with yet a further aspect of the present invention a smartphone is provided, further comprising: one or more sensors from which data is collected on at least two different moments and stored on the memory and the processor is enabled to retrieve instructions from the memory to perform the steps: retrieving from the memory the data collected from the one or more sensors on at least two different moments, creating validation data from the data collected from the one or more sensors on at least two different moments and providing the validation data for transmission by the transmitter to transmit via the antenna to the remote device.

DESCRIPTION OF THE DRAWINGS

FIGS. 15-18 illustrate steps in accordance with one or more aspects of the present invention;

FIGS. 21-23 illustrate further steps in accordance with one or more aspects of the present invention;

DETAILED DESCRIPTION

Figure 1:
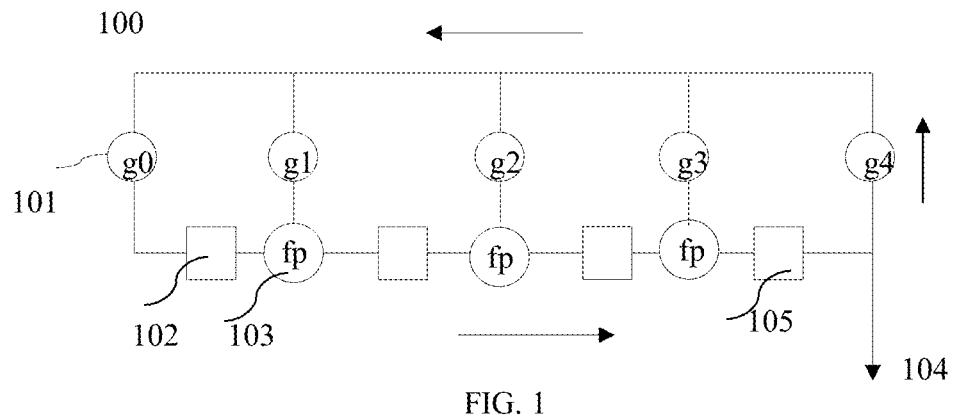
FIGS. 1-2 are examples of n-state LFSRs in Galois and Fibonacci configuration with n≥2.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention. Also, it is to be understood that the phraseology and terminology used herein is for the purpose of description and should not be regarded as limiting. The use of "including," "comprising," or "having" and variations thereof herein are meant to encompass the items listed thereafter and equivalents thereof as well as additional items. Sequences of n-state symbols can be generated by linear feedback shift registers (LFSRs). The LFSR can be used in an autonomous configuration, working off a clock signal starting at an initial setting of the shift register. The LFSR associated sequence generator can be in Galois configuration as shown in FIG. 1. The generator 100 has a 4 element shift register of which first element 102 and last element 105 are identified, each element is able to hold and shift one n-state symbol (with $n \geq 2$). At least two adjacent shift register elements are connected through a device 103 that implements a two-input single output n-state switching function fp. In general, when n=2 (or in binary implementations) fp is the binary XOR function though the EQUAL can also serve that purpose. A multiplier for n=2 is the binary AND function, though for instance the NAND function can also serve that purpose. The truth tables of the XOR and AND are provided below.

| XOR | | | AND | | |
|---|---|---|---|---|---|
| | 0 | 1 | | 0 | 1 |
| 0 | 0 | 1 | 0 | 0 | 0 |
| 1 | 1 | 0 | 1 | 0 | 1 |

For n>2 fp can be any n-state reversible 2-input single output n-state switching function. For instance fp is an adder over GF(n). (wherein GF stands for Galois Field or Finite Field).

For many applications it is beneficial when the sequence generator provides for instance on an output 104 a maximum length or m-sequence. Such a pseudo-random sequence has $n^4-1$ n-state symbol. The length of an n-state sequence depends on the number of shift register elements. When the LFSR has p shift register elements the maximum length is $n^p-1$ n-state symbols. Feed-back loops are created through n-state inverters g0, g1, g2, g3 and g4 of which g0 is identified as 101. In general the applied inverters are multipliers over GF(n). The inverter has shown, for instance, in U.S. Pat. No. 7,487,194 issued on Feb. 3, 2009 and which is incorporated herein by reference that also n-state inverters not being multipliers over GF(n) can be applied.

One way to determine if a sequence of n-state symbols is maximum length is by determining the auto-correlation graph of a sequence of $n^p-1$ n-state symbols. When the sequence is maximum length the autocorrelation graph of such sequence is substantially flat with at least one peak. The inventor has shown in, for instance, U.S. Pat. No. 7,580,472 issued on Aug. 25, 2009, which is incorporated herein by reference, that by only adding a fixed value to a sum when two n-state symbols are identical (and if desired subtracting a fixed value if two n-state symbols are different) that also for n>2 the auto-correlation graph of n-state m-sequences has only one peak.

One can create different 4-stage n-state sequence generators that will generate n-state m-sequences. The inverters g0 and g4 always have to be an inverter not being the multiplier-0 inverter. In the binary case the binary configuration [g0 g1 g2 g3 g4]=[1 0 0 1 1] of FIG. 1 can generate a binary m-sequence of 15 binary symbols. In one case fp is the binary XOR function. In the 8-state case the 8-state configuration [g0 g1 g2 g3 g4]=[4 2 1 2 1] of FIG. 1 can generate an 8-state sequence of 4095 of 8-state symbols. The inverters herein are multipliers over GF(8) and fp is an addition over GF(8).

The following truth tables define the addition and multiplication over GF(8).

The following truth tables describe the 8-state function fp being an adder over GF(8).

| | | | | | b | | | | |
|---|---|---|---|---|---|---|---|---|---|
| c | fp | 0 | 1 | 2 | 3 | 4 | 5 | 6 | 7 |
| | 0 | 0 | 1 | 2 | 3 | 4 | 5 | 6 | 7 |
| | 1 | 1 | 0 | 4 | 7 | 2 | 6 | 5 | 3 |
| a | 2 | 2 | 4 | 0 | 5 | 1 | 3 | 7 | 6 |
| | 3 | 3 | 7 | 5 | 0 | 6 | 2 | 4 | 1 |

| c | fp | b 0 | 1 | 2 | 3 | 4 | 5 | 6 | 7 |
|---|----|-----|---|---|---|---|---|---|---|
|   | 4  | 4   | 2 | 1 | 6 | 0 | 7 | 3 | 5 |
|   | 5  | 5   | 6 | 3 | 2 | 7 | 0 | 1 | 4 |
|   | 6  | 6   | 5 | 7 | 4 | 3 | 1 | 0 | 2 |
|   | 7  | 7   | 3 | 6 | 1 | 5 | 4 | 2 | 0 |

The truth table of the multiplication m8 over GF(8) is provided in the following truth table.

| c | m8 | b 0 | 1 | 2 | 3 | 4 | 5 | 6 | 7 |
|---|----|-----|---|---|---|---|---|---|---|
|   | 0  | 0   | 0 | 0 | 0 | 0 | 0 | 0 | 0 |
|   | 1  | 0   | 1 | 2 | 3 | 4 | 5 | 6 | 7 |
| a | 2  | 0   | 2 | 3 | 4 | 5 | 6 | 7 | 1 |
|   | 3  | 0   | 3 | 4 | 5 | 6 | 7 | 1 | 2 |
|   | 4  | 0   | 4 | 5 | 6 | 7 | 1 | 2 | 3 |
|   | 5  | 0   | 5 | 6 | 7 | 1 | 2 | 3 | 4 |
|   | 6  | 0   | 6 | 7 | 1 | 2 | 3 | 4 | 5 |
|   | 7  | 0   | 7 | 1 | 2 | 3 | 4 | 5 | 6 |

It should be clear that the herein provided generators are illustrative examples only. One may create generators for any value of n≥2 and for any LFSR with p shift register elements with p≥2.

The phase of an n-state sequence of symbols is determined by the number of clock pulses after initialization and the initial state of the sequence generator. At the receiving end one only has the received sequence of symbols.

A maximum-length sequence or m-sequence of n-state symbols generated by an LFSR with p n-state shift register elements has some particular properties that can be used in determining a synchronization state. First of all, an n-state symbol generated on an output at moment t (in the example 105, but other outputs can be used) is associated with the content of the shift register elements (in this case for instance [a b c d] at moment t. In fact, output 105 provides the content of the last shift register element of LFSR 100. When the content of the shift register is [a b c d] then the generated output symbol is symbol 'd'. This is somewhat helpful, as the symbol 'd' will be generated several times (in fact about 512 times in the 8-state example).

Another property of the m-sequence generator is that its performance is cyclic. After $n^p-1$ clock cycles the generator starts all over again with generating the same sequence. Where the sequence generator is at a time t1 depends on the initial state of the shift register elements on 'start time' t0. Another property of the n-state m-sequence generator is that during generation of the m-sequence at each moment the total content of the shift register elements is unique. One may say that at each moment of generating an n-state symbol of the m-sequence the content of the p shift register elements forms a word of p n-state symbols. Each word of p n-state symbols during the generation of n-state symbols on an output is unique. The words repeat again due to the cyclic nature of the m-sequence generator.

One may extend such a word to a second word with symbols of future or past states. These words will also be unique. The smallest unique word is the word of p n-state symbols. Each word of at least p n-state symbols representing a content of the shift register is associated with a generated n-state symbol. One may also divide the n-state m-sequence is a plurality of words of p n-state symbols. This is, for instance, described in U.S. patent application Ser. No. 11/534,837 filed on Sep. 25, 2006, which is incorporated herein by reference in its entirety.

Figure 4:
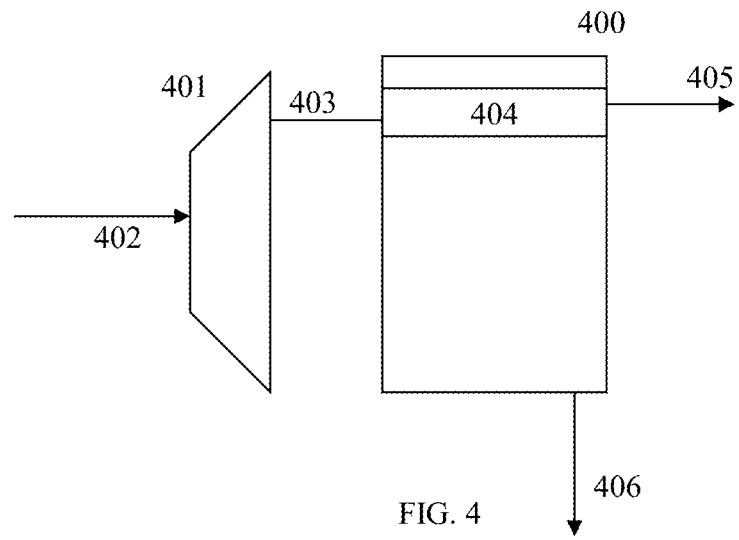
FIG. 4 illustrates an implementation of an n-state sequence generator with an addressable memory as an aspect of the present invention.

An n-state m-sequence that is associated with an LFSR of p n-state shift register elements is thus fully determined by at least p consecutive n-state symbols in the m-sequence. This offers at least one embodiment of synchronization. Assume that an m-sequence of 4095 8-state symbols is being received and a sequence in sync with this sequence is to be generated. The embodiment of FIG. 4 illustrates such synchronization. An input 402 of an address decoder 401 is provided with 4 received consecutive 8-state symbols as an address to an addressable memory 400. The 4 8-state symbols enable memory line 403 so that the content of memory device 404 can be outputted. In one embodiment, 404 is outputted on output 405, wherein the content of 404 is the complete sequence following the received 4 8-state symbols. One may take into account latency in switching devices and provide a delay of one or more clock cycles. In that case, 405 generates the remainder of the 8-state m-sequence which can be under control of a clock so that 405 provides the 8-state symbols at the right moment. In this embodiment, an 8-state symbol may be represented by a single 8-state signal or by a plurality of signals, for instance binary signals.

In a further embodiment a single 8-state (or n-state) symbol is provided by memory 404 on output 406. Enabling a first memory line 403 may be considered as an initialization of the memory. At each following clock cycle, a next memory line is enabled to read the next memory element containing a next symbol in the m-sequence.

After enabling the last memory line the first memory line is enabled to read the first memory to provide the first stored 8-state symbol. Only after providing a new initial address at 402, possibly with enabling a command line, is the memory re-initialized. Each symbol in the memory in this embodiment is associated with the 4 preceding symbols. In case of a desired delay one may associate a to be generated symbol with 4 preceding symbols including 1 or more intervening symbols. In case of no delay the first to be generated symbol is the symbol directly following the 4 symbols at the input of the address decoder. Each following memory line then stores the succeeding symbols in the m-sequence. It should be clear that this synchronization by memory does not distinguish between Fibonacci or Galois configuration generated m-sequences.

The relationship between state of the LFSR and generated n-state symbols will be provided herein for the binary case (n=2) and the 8-state case for an LFSR with 4 shift register elements. It is to be understood that the herein provided approach can also be applied for all other values for n>2 and for all p>2.

The Binary Case

There are 4 shift register elements in the generator of FIG. 1. Assume that the initial value of the shift register elements is [a b c d] wherein a, b, c and d can be an element of for instance {0, 1}. It is not sure which state or value each of a, b, c and d will be. Represent the first shift register element as [a 0 0 0]. This means that the first symbol in [a 0 0 0] can be a 0 or a 1, but the second, third and fourth symbol in [a 0 0 0] are always 0. To make processor manipulation easier [a 0 0 0] is replaced by [1 0 0 0]. The meaning of [1 0 0 0] is the same as [a 0 0 0]; the first symbol ('a') can be 0 or 1, but all others are always 0. The second shift register element is then [0 1 0 0]; the third [0 0 1 0] and the fourth shift register element is [0 0 0 1]. The binary sequence generator has multipliers or inverters [g0 g1 g2 g3 g4]=[1 0 0 1 1].

When the content of the first element is shifted to the second shift register element then the second shift register element is [1 0 0 0]. Looking at FIG. 1 it should be clear that the output of the fourth shift register element [0 0 0 1] is fed back into the LFSR and for instance added (XORed) with the content of the third shift register element [0 0 1 0]. The XOR is associative, commutative and distributive. Adding (XORing) [0 0 1 0]+[0 0 0 1]=[0 0 1 1]. So after the shift the first shift register element will have the content of the fourth shift register element [0 0 0 1], the second shift register element will be [0 1 0 0]. It is easy to check that the third element will be [0 1 0 0] and the fourth will be [0 0 1 1].

Accordingly, the initial content of the LFSR was:
[1 0 0 0]-[0 1 0 0]-[0 0 1 0]-[0 0 0 1].
After the first shift the content of the LFSR is:
[0 0 0 1]-[1 0 0 0]-[0 1 0 0]-[0 0 1 1].
The next shift will provide shift register:
[0 0 1 1]-[0 0 0 1]-[1 0 0 0]-[0 1 1 1].
The following table shows 15 shifts after initialization.

| state based | SR1 | SR2 | SR3 | SR4 | SG |
|---|---|---|---|---|---|
| Init | 1 0 0 0 | 0 1 0 0 | 0 0 1 0 | 0 0 0 1 | 0 0 0 1 |
| 1 | 0 0 0 1 | 1 0 0 0 | 0 1 0 0 | 0 0 1 1 | 0 0 1 1 |
| 2 | 0 0 1 1 | 0 0 0 1 | 1 0 0 0 | 0 1 1 1 | 0 1 1 1 |
| 3 | 0 1 1 1 | 0 0 1 1 | 0 0 0 1 | 1 1 1 1 | 1 1 1 1 |
| 4 | 1 1 1 1 | 0 1 1 1 | 0 0 1 1 | 1 1 1 0 | 1 1 1 0 |
| 5 | 1 1 1 0 | 1 1 1 1 | 0 1 1 1 | 1 1 0 1 | 1 1 0 1 |
| 6 | 1 1 0 1 | 1 1 1 0 | 1 1 1 1 | 1 0 1 0 | 1 0 1 0 |
| 7 | 1 0 1 0 | 1 1 0 1 | 1 1 1 0 | 0 1 0 1 | 0 1 0 1 |
| 8 | 0 1 0 1 | 1 0 1 0 | 1 1 0 1 | 1 0 1 1 | 1 0 1 1 |
| 9 | 1 0 1 1 | 0 1 0 1 | 1 0 1 0 | 0 1 1 0 | 0 1 1 0 |
| 10 | 0 1 1 0 | 1 0 1 1 | 0 1 0 1 | 1 1 0 0 | 1 1 0 0 |
| 11 | 1 1 0 0 | 0 1 1 0 | 1 0 1 1 | 1 0 0 1 | 1 0 0 1 |
| 12 | 1 0 0 1 | 1 1 0 0 | 0 1 1 0 | 0 0 1 0 | 0 0 1 0 |
| 13 | 0 0 1 0 | 1 0 0 1 | 1 1 0 0 | 0 1 0 0 | 0 1 0 0 |
| 14 | 0 1 0 0 | 0 0 1 0 | 1 0 0 1 | 1 0 0 0 | 1 0 0 0 |
| 15 | 1 0 0 0 | 0 1 0 0 | 0 0 1 0 | 0 0 0 1 | 0 0 0 1 |

It does not really matter which moment is called the 'init' moment. Once an 'init' moment is determined then the follow-on states are completely set. Also, the generated symbols on output 105 are completely determined, and are equal to the content (in this case) of the last shift register element.

Assume that the received sequence is [1 1 0 1 0 1 1 0 0 1 0 0 0 1 1]. One would like to initiate an LFSR as shown in FIG. 1 one moment 6 after having received 5 symbols. Only four symbols are required to synchronize. Assume one uses the first 4 received symbols to synchronize. Further assume that the first symbol is generated at initial shift register state [u 0 0 0] [0 v 0 0] [0 0 w 0] [0 0 0 z] to generate a=[0 0 0 z]. One should keep in mind that [0 0 0 z] actually means [0≠0≠0≠z]. This means that a=(0≠0≠0≠z) or a=z. The symbol "≠" in these expressions is used as a notation for the binary function XOR, of which the switching table is provided above.

The second symbol is 'b'. From the above table one can read that b=[0 0 1 1] or b=(0≠0≠w≠z) or b=(w≠z). It was already determined that z=a. Thus, w=(a≠b).

The other equations will lead to v=(b≠c) and u=(c≠d). From the received sequence [a b c d]=[1 1 0 1]. This will lead to [u0 0 0]=[1 0 0 0]; [0 v0 0]=[0 1 0 0]; [0 0 w 0]=[0 0 0 0] and [0 0 0 z]=[0 0 0 1]. Thus the initial state of the shift register is [u v w z]=[1 1 0 1]. By applying the calculated initial values of the shift register elements one can check that indeed the provided m-sequence is generated. The required content of the shift register at moment 6 is

| 1 1 1 0 | 1 1 1 1 | 0 1 1 1 | 1 1 0 1 |
|---|---|---|---|

With u=1; v=1, w=0 and z=1 this will lead to LFSR state [0 1 0 1] to start running in sync with the received m-sequence. One may in a further embodiment apply a phase-lock-loop (PLL) circuit to derive the appropriate clock signals for the synchronized LFSR at the receiving side.

In one embodiment one may not want to rely on the local generator. For instance one may assume that the received and processed symbols of the k symbols can be used for synchronization at moment tp1, tp2, tp3, . . . etc. One can thus calculate and store the relevant states based on the k received symbols and initialize the sequence at the receiving side on these moments with the calculated states. These states will represent a small portion of the total states and can easily be stored in a memory. The advantage of this is that initiating a state is thus independent in calculation effort of the moment of initialization. Each state is retrieved from a memory and takes an execution of an expression to be finalized. The calculation of such a state in binary form is very simple. In essence it is an AND operation between the stored state and the calculated initial state.

For instance in the binary form of the FIG. 1 generator using the above state table, the third shift register element at moment 11 should have content [1 0 1 1]. One simply takes the AND between [1 0 1 1] and [a b c d] related to initial states [a 0 0 0], [0 b 0 0], [0 0 c 0] and [0 0 0 d], followed by the XOR of the result.

One may also recalculate all states as a function of 4 consecutive output symbols. This allows calculating a state of a shift register element directly from the value of 4 consecutive n-state symbols. In the binary case 4 consecutive symbols on output 105 in FIG. 1 are [a b c d]. In line with the binary LFSR state table: a=[0 0 0 1], b=[0 0 1 1], c=[0 1 1 1] and d=[1 1 1 1]. One may call the initial states [1 0 0 0]=u, [0 1 0 0]=v, [0 0 1 0]=w and [0 0 0 1]=z.

This leads to u=c+d; v=c+b, w=a+b, and z=a. One can thus represent the 4 shift register elements with initial states [1 1 0 0] [0 1 1 0] [0 0 1 1] [0 0 0 1] as function of the 4 consecutive symbols generated from the initial state. One can generate the following states in a similar way as provided earlier, but now using the states as function of the generated symbols.

The following table shows 15 shifts after initialization using the generated 4 symbols starting with the initial state as variables.

| symbol based | SR1 | SR2 | SR3 | SR4 | SG |
|---|---|---|---|---|---|
| init | 1 1 0 0 | 0 1 1 0 | 0 0 1 1 | 0 0 0 1 | 0 0 0 1 |
| 1 | 0 0 0 1 | 1 1 0 0 | 0 1 1 0 | 0 0 1 0 | 0 0 1 0 |
| 2 | 0 0 1 0 | 0 0 0 1 | 1 1 0 0 | 0 1 0 0 | 0 1 0 0 |
| 3 | 0 1 0 0 | 0 0 1 0 | 0 0 0 1 | 1 0 0 0 | 1 0 0 0 |
| 4 | 1 0 0 0 | 0 1 0 0 | 0 0 1 0 | 1 0 0 1 | 1 0 0 1 |
| 5 | 1 0 0 1 | 1 0 0 0 | 0 1 0 0 | 1 0 1 1 | 1 0 1 1 |
| 6 | 1 0 1 1 | 1 0 0 1 | 1 0 0 0 | 1 1 1 1 | 1 1 1 1 |
| 7 | 1 1 1 1 | 1 0 1 1 | 1 0 0 1 | 0 1 1 1 | 0 1 1 1 |
| 8 | 0 1 1 1 | 1 1 1 1 | 1 0 1 1 | 1 1 1 0 | 1 1 1 0 |
| 9 | 1 1 1 0 | 0 1 1 1 | 1 1 1 1 | 0 1 0 1 | 0 1 0 1 |
| 10 | 0 1 0 1 | 1 1 1 0 | 0 1 1 1 | 1 0 1 0 | 1 0 1 0 |
| 11 | 1 0 1 0 | 0 1 0 1 | 1 1 1 0 | 1 1 0 1 | 1 1 0 1 |
| 12 | 1 1 0 1 | 1 0 1 0 | 0 1 0 1 | 0 0 1 1 | 0 0 1 1 |
| 13 | 0 0 1 1 | 1 1 0 1 | 1 0 1 0 | 0 1 1 0 | 0 1 1 0 |
| 14 | 0 1 1 0 | 0 0 1 1 | 1 1 0 1 | 1 1 0 0 | 1 1 0 0 |
| 15 | 1 1 0 0 | 0 1 1 0 | 0 0 1 1 | 0 0 0 1 | 0 0 0 1 |

The above table shows how one can determine all LFSR states from the first k (in this case 4) generated binary symbols. One can see that at moment 15 the LFSR repeats the states. One can also see that after the first k (in the example k=4) symbols all other generated symbols are pre-determined. In fact, one can generate the symbols of the sequence in sync with a received sequence by applying the calculated output states using the values of the first 4 generated symbols.

The states of an LFSR at a certain moment can be determined by using the states as shown above an taking the AND of the symbols with the expression of the states.

The sequence as generated by the binary generator of FIG. 1 and received may be [1 1 0 1 0 1 1 0 0 1 0 0 0 1 1 1 1 0 1 0 1 1 0 0 1 0 0 0 1 1 . . . ]. The first 4 symbols are [1 1 0 1]. Keeping in mind that the generated symbols are represented as [d c b a] one has to apply [d c b a]=[1 0 1 1]. In accordance with an aspect of the present invention the initial state of an LFSR that generates the sequence is [1 1 0 0] [0 1 1 0] [0 0 1 1] [0 0 0 1] combined with AND of [1 0 1 1], leading to {[1 1 0 0] AND [1 0 1 1]}, {[0 1 1 0] AND [1 0 1 1]}, {[0 0 1 1] AND [1 0 1 1]}, {[0 0 0 1] AND [1 0 1 1]}. This leads to: [1 0 1 1], [0 0 1 0], [0 0 1 1] and [0 0 0 1]. By evaluating the XOR of the bits of each shift register state one gets: [1], [1], [0], [1]. Accordingly, the initial LFSR state is [1 1 0 1].

In a similar way a circuit can determine any symbol of the sequence. For instance the 4 consecutive symbols generated after the first 4 symbols are [1 0 0 1], [1 0 1 1] [1 1 1 1] and [0 1 1 1], wherein again the positions of the bits indicate [d c b a]. With [d c b a]=[1 0 1 1] a circuit or an expression can evaluate to {[1 0 0 1] AND [1 0 1 1]}, {[1 0 1 1] AND [1 0 1 1]}, {[1 1 1 1] AND [1 0 1 1]}, and { [0 1 1 1] AND [1 0 1 1]}. This leads to: [1 0 0 1], [1 0 1 1], [1 0 1 1] and [0 0 1 1]. Evaluating the XOR of the bits of a state leads to [0], [1], [1] and [0], which are of course the symbols as generated in the sequence.

As an illustration assume a binary sequence generator as shown in FIG. 1. Assume that for some reasons (of which one will be provided later) symbols generated on non consecutive moments are available. For instance of the repeating m-sequence [1 1 0 1 0 1 1 0 0 1 0 0 0 1 1 1 1 0 1 0 1 1 0 0 1 0 0 0 1 1 . . . ] only symbols that are spaced 3 symbols apart are available. Intervening symbols are not available. However, it is known that the available symbols are spaced 3 symbols.

To determine the states one can use the state based table of LFSR states at least 15 moments as provided above. Assume that 4 symbols are available: at moments init, 4, 8 and 12. Assume that the initial state of the LFSR at moment init is [u 0 0 0], [0 v 0 0], [0 0 w 0] and [0 0 0 z]. The generated symbols are: at t=init symbol a; at t=4 symbol b; at t=8 symbol c and at t=12 symbol d.

The table shows that a=[0 0 0 1], b=[1 1 1 0], c=[1 0 1 1] and d=[0 0 1 0]. Writing out the equations leads to:

$z = a;$ $w = d;$ $u = c + w + z = c + d + a;$ and $b = u + v + w \rightarrow v = b + u + w = b + c + d + a + d = c + b + a.$ This thus lead to initial LFSR state [u 0 0 0] [0 v 0 0] [0 0 w 0] [0 0 0 z] represented as [1 1 0 1] [0 1 1 1] [1 0 0 0] [0 0 0 1] in terms of [d c b a].

One can check this by determining the init, t=4, t=8 and t=12 symbols in [1 1 0 1 0 1 1 0 0 1 0 0 0 1 1 1 1 0 1 0 1 1 0 0 1 0 0 0 1 1 . . . ], which are [1], [0], [0] and [0], or [d c b a]=[0 0 0 1]. The initial state of the LFSR thus with [d c b a]=[0 0 0 1] can be evaluated by a circuit or an expression can evaluate to {[1 1 0 1] AND [0 0 0 1]}, { [0 1 1 1] AND [0 0 0 1]}, {[1 0 0 0] AND [0 0 0 1]}, and {[0 0 0 1] AND [0 0 0 1]}. This leads to: [0 0 0 1], [0 0 0 1], [0 0 0 0] and [0 0 0 1]. Evaluating the XOR of the bits of a state leads to [1], [1], [0] and [1], which is the initial state of the LFSR [1 1 0 1] to generate the sequence.

On the basis of the above a circuit can determine an initialization content for a moment defined by the receipt of the first symbol. In that case the initial state (for instance at moment 15) can be evaluated based on the received symbols and initiated at the right time. One can also generate all following symbols in sync with the received symbols based on the evaluated k symbols.

In a further embodiment one can express all states (and generated symbols) in terms of the k symbols received on non-consecutive moments. The table representing the states and generated symbols as a function of k non-consecutive received symbols is provided below.

| non-consecutive symbol based | SR1 | SR2 | SR3 | SR4 | SG |
|---|---|---|---|---|---|
| init | 1 1 0 1 | 0 1 1 1 | 1 0 0 0 | 0 0 0 1 | 0 0 0 1 |
| 1 | 0 0 0 1 | 1 1 0 1 | 0 1 1 1 | 1 0 0 1 | 1 0 0 1 |
| 2 | 1 0 0 1 | 0 0 0 1 | 1 1 0 1 | 1 1 1 0 | 1 1 1 0 |
| 3 | 1 1 1 0 | 1 0 0 1 | 0 0 0 1 | 0 0 1 1 | 0 0 1 1 |
| 4 | 0 0 1 1 | 1 1 1 0 | 1 0 0 1 | 0 0 1 0 | 0 0 1 0 |
| 5 | 0 0 1 0 | 0 0 1 1 | 1 1 1 0 | 1 0 1 1 | 1 0 1 1 |
| 6 | 1 0 1 1 | 0 0 1 0 | 0 0 1 1 | 0 1 0 1 | 0 1 0 1 |
| 7 | 0 1 0 1 | 1 0 1 1 | 0 0 1 0 | 0 1 1 0 | 0 1 1 0 |
| 8 | 0 1 1 0 | 0 1 0 1 | 1 0 1 1 | 0 1 0 0 | 0 1 0 0 |
| 9 | 0 1 0 0 | 0 1 1 0 | 0 1 0 1 | 1 1 1 1 | 1 1 1 1 |
| 10 | 1 1 1 1 | 0 1 0 0 | 0 1 1 0 | 1 0 1 0 | 1 0 1 0 |
| 11 | 1 0 1 0 | 1 1 1 1 | 0 1 0 0 | 1 1 0 0 | 1 1 0 0 |
| 12 | 1 1 0 0 | 1 0 1 0 | 1 1 1 1 | 1 0 0 0 | 1 0 0 0 |
| 13 | 1 0 0 0 | 1 1 0 0 | 1 0 1 0 | 0 1 1 1 | 0 1 1 1 |
| 14 | 0 1 1 1 | 1 0 0 0 | 1 1 0 0 | 1 1 0 1 | 1 1 0 1 |
| 15 | 1 1 0 1 | 0 1 1 1 | 1 0 0 0 | 0 0 0 1 | 0 0 0 1 |

The above table shows all possible binary state expressions based on a symbol [0 0 0 z] generated at moment init; [0 0 w 0] at moment 4; [0 v 0 0] at moment 8 and [u 0 0 0] at moment 12. The content of a 4-element shift register that is synchronous with the received symbols at moment 14 is thus [0*u+1*v+1*w+1*z]; [1*u+0*v+0*w+0*z]; [1*u+1*v+0*w+0*z]; and [1*u+1*v+0*w+1*z]. The coefficients of the equations as shown in the table can be stored in a memory and retrieved for execution.

Execution can be as simple as determining the AND between the retrieved coefficient word and the received 4 symbols and summing (XOR) the individual results to determine the required state of a shift register element.

One should keep in mind that an n-state LFSR of length k associated sequence is cyclic. The state at moment i is the same as for instance $i+(n^k-1)$.

A preferred embodiment of the present invention is to have a representation of an initial state stored and retrieved from a memory or implemented in a circuit so that the values of k received symbols will provide the correct initial setting of a sequence generator at a desired moment $t_{sync}$.

Figure 5:
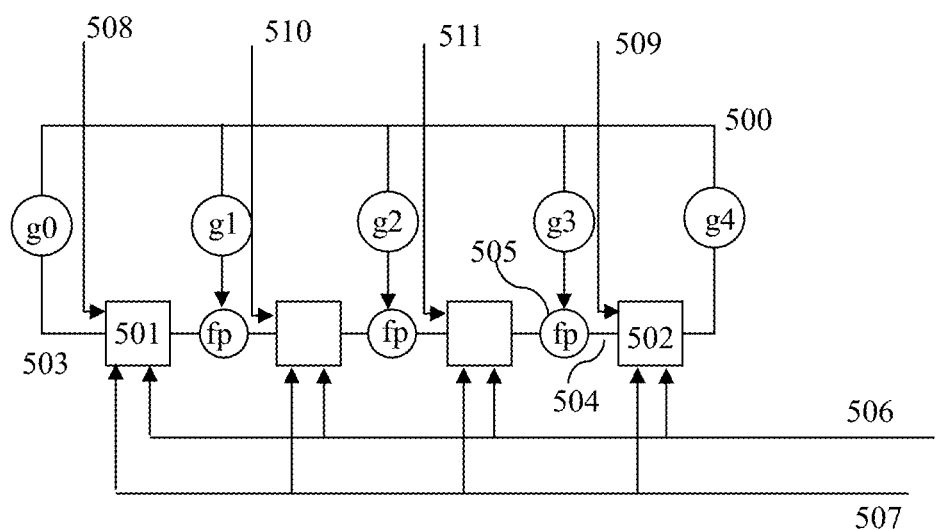
FIGS. 5-8 illustrate an LFSR with state corrective capabilities in accordance with an aspect of the present invention.

The new state of an LFSR may have to be entered into the shift register at a moment $t_{sync}$. It is assumed that the correct LFSR state for moment $t_{sync}$ has been determined for instance in accordance with an aspect of the present invention. A next step is then to make sure that the new state is entered at the correct time. This is illustrated in a first embodiment in diagram of FIG. 5. An LFSR 500 has k=4 shift register elements of which the first element 501 and last element 502 have been identified. The feedback into the LFSR takes place through n-state inverters g0, g1, g2, g3 and g4. In the binary example g0=1, g1=0, g1=0, g2=0, g3=1 and g4=1. In the binary case an inverter 0 means an open connection and an inverter 1 means a connection, so no actual multiplication or inversion takes place.

Signals are modified if required by a binary function fp, which may be the XOR function. Because in this example g1=0, g1=0 and g2=0, or these taps being open connections the functions fp connected to these taps do not perform any unique function as they merely pass on the signal of a preceding shift register element and they can be omitted in an actual circuit or implementation. The signal generated from element 502 is thus fed back to element 501 at input 503 and to implementation 505 of function fp at the input 504 of 502. The LFSR works under clock 506 which enables each shift register element to store the signal at its input.

In one embodiment each shift register element is also provided with a clock signal 507. Clock 506 and 507 may have the property that only one of these clock signals is active at the same time and thus are mutually exclusive. Each clock enables a shift register element to receive a signal from a related input. For instance, clock 506 enables element 501 to store the signal at input 503, while clock 507 enables a signal on input 508 to be stored in 501. The same applies to element 502. Clock 506 enables the signal on 504 to be stored in 502, while 507 enables a signal on 509 to be stored in 502.

By enabling 507 at the right time, while not enabling 506 on or around moment $t_{sync}$ and by providing signals related to the newly synchronized state on inputs 508 through 509 to the shift register elements, allows the updating and synchronization of the shift register. The inputs 510 and 511 under control of 507 are applied to the second and third shift register element respectively.

If shift register element 501 is desired to be in synchronized state $a_{sync}$ while it is also predicted that 501 is going to be in actual state $a_{act}$, then it is easy to see in the binary case that one should add or XOR a corrective signal $a_{cor}=a_{act}$ XOR $a_{sync}$ to actual state $a_{act}$. The final state is then State=$a_{act}$ XOR $a_{cor}=a_{act}$ XOR $a_{act}$ XOR $a_{sync}=a_{sync}$. This is of course the desired state.

Figure 6:
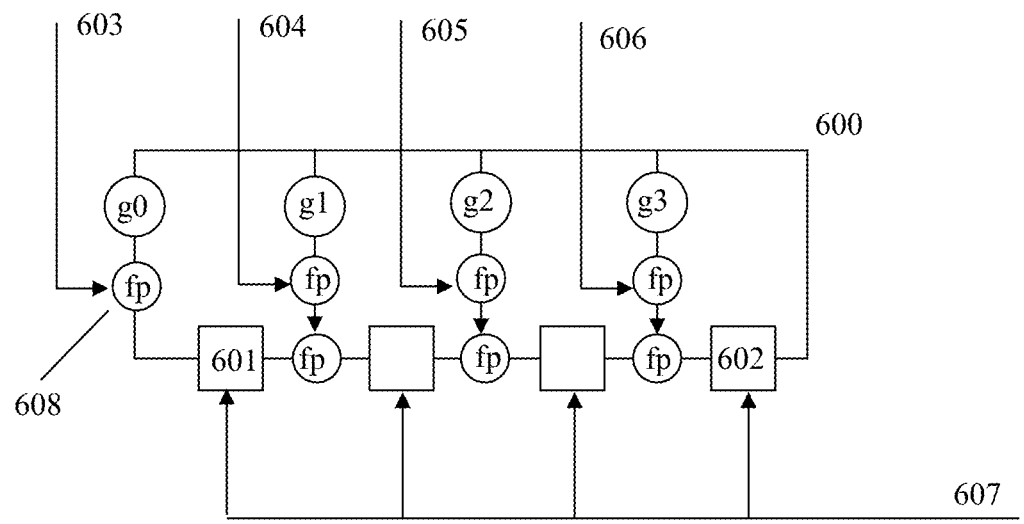

A diagram of one embodiment to achieve such an update of state is provided in FIG. 6 with an n-state LFSR 600 with inverters g0, g1, g2 and g3. The function fp of which one 608 is identified herein are n-state adders over GF(n). Configurations with different functions are also contemplated. Shift register elements 601 and 602 are identified. The LFSR works under a clock 607. Only at correct moment $t_{sync}$ or a related period are calculated corrective signals provided on inputs 603, 604, 605 and 606 respectively. At all other times the corrective signals are set to represent symbol zero. This ensures that only at moment $t_{sync}$ a corrective signal is processed (as a symbol 0 does not change an output of fp when fp is an adder over GF(n)).

Figure 7:
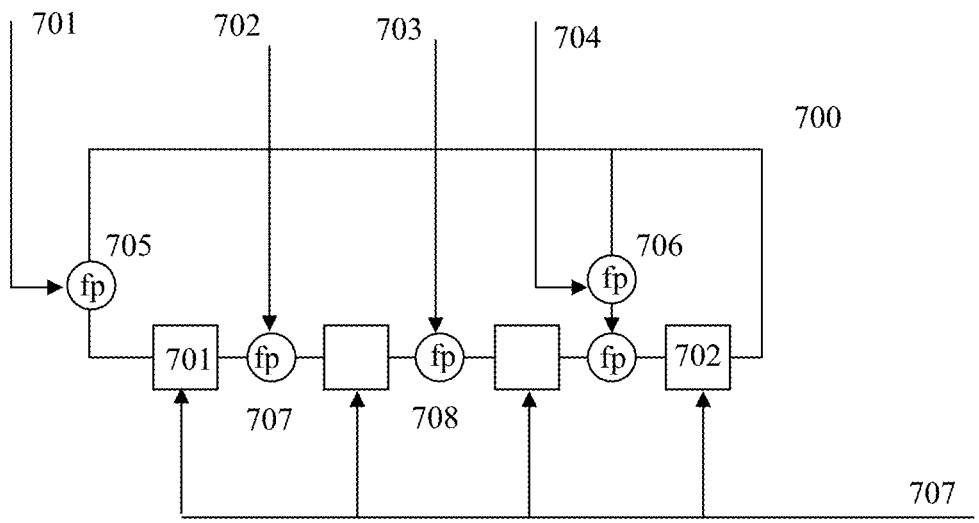

A diagram of the binary configuration is shown in FIG. 7. The LFSR 700 has additional functions fp 705 and 706 in feedback taps to enable XORing of inputs 701 and 704 with corrective signals with the feedback. Furthermore, functions fp 707 and 708 between shift register elements are provided to enable XORing of corrective signals on inputs 702 and 703 respectively. A clock signal 707 is provided.

Figure 8:
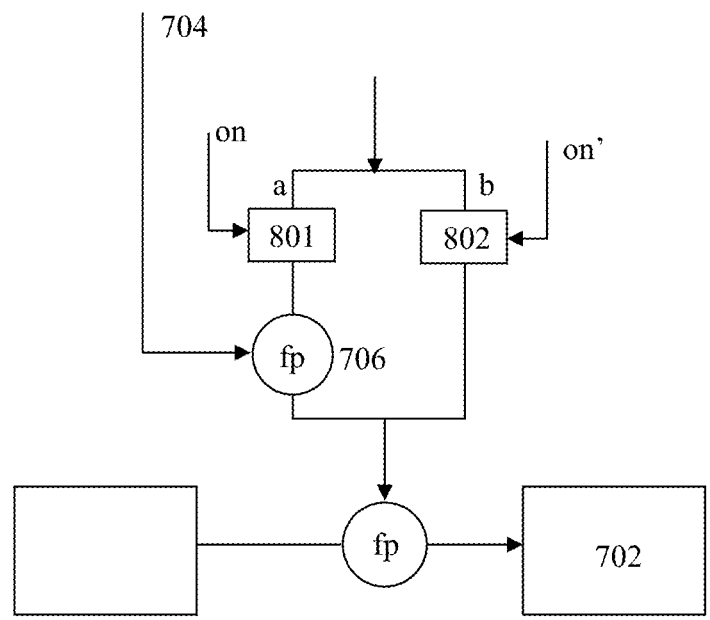

The insertion of function 707 and 708 do not affect the speed of the LFSR. However, the insertion of function fp 705 and 706 can potentially affect the speed of the LFSR and certainly the power consumption. This is because the functions fp 705 and 706 have first to be executed before other functions can be executed. One can limit the effect of 705 and 706 in an embodiment as shown in FIG. 8. The function fp 706 with corrective input 704 for instance is placed in a path 'a' that is enabled when a switch 801 is closed by a signal ON and a switch 802 is open. When the signal ON is not present (or ON') switch 801 is open and 802 is closed enabling a path 'b' that has no additional function fp.

Figure 3:
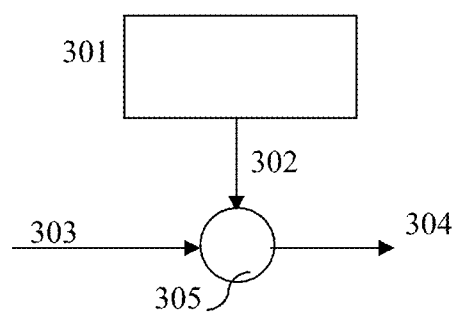
FIG. 3 is a diagram of an n-state scrambler/descrambler using an autonomous n-state sequence generator.

A reason for using non-consecutive symbols in a received sequence is the application of an LFSR based sequence generator in a scrambler and a corresponding descrambler. A diagram of a scrambler/descrambler is provided in FIG. 3. A sequence generator 301, which may be an LFSR associated sequence generator provides a sequence of n-state symbols on an input 302 of a scrambling/descrambling device 305 which implements a reversible n-state function 'sc'. A second input 303 provides another sequence of n-state symbols. A scrambled or descrambled sequence is provided on output 304. In the binary case 305 implements a self reversing function such as a XOR function. This means that the scrambler and descrambler both implement a XOR function in 305. This is not always the case for n>2. For instance a reversible but not self reversing n-state function 'sc' is used in a scrambler. The descrambler has to implement the descrambling function 'ds' which reverses 'sc'. For instance in the 4-state case, 'sc' can be the modulo-4 addition function. The reversing function then is 'ds' being the modulo-4 subtraction function.

In order for the descrambler to correctly descramble, the sequence provided on input 302 has to be in sync with input 302 at the descrambling side. In some cases (such as in Distributive Sample Scramblers) samples of the sequence generated by the sequence generator are transmitted to the descrambler.

Figure 2:
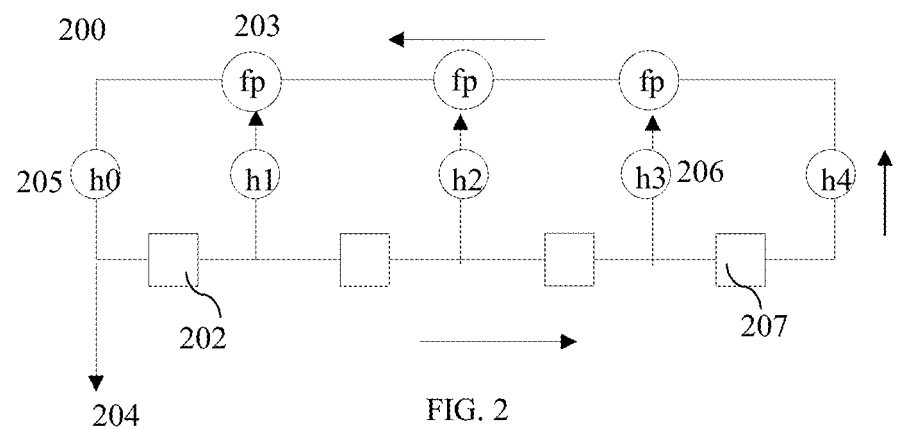

The examples provided are based on binary LFSRs in Galois configuration. Galois LFSRs are in general (with more than 1 feedback tap) faster than an LFSR as provided in Fibonacci configuration. A diagram of an n-state Fibonacci LFSR 200 is shown in FIG. 2. The LFSR 200 has k=4 shift registers. The taps are defined by n-state inverters [h0 h1 h2 h3 h4]. In general, one may assume h4 to be a straight through connection. The inverters may be multipliers over GF(n). In the binary case the inverters are in general either 1 (a connection) or 0 (open connection or interrupted connection). A sequence of generated n-state symbols may be generated on output 204. Shift register elements 202 and 207 are identified. Each of the shift register elements can receive, store and provide an n-state signal or a plurality of signals representing an n-state symbol with n≥2. Feedback takes place through an implementation of an n-state logic function fp of which 203 is identified in FIG. 2. Feedback inverters 205 (h0) and 206 (h3) are also identified. These inverters may be any n-state inverters, but preferably n-state reversible inverters. For convenience of calculations, the n-state inverters are assumed to be multipliers over GF(n). In the binary case for convenience an inverter is 0 (open connection) or 1 (connection). In the binary case h0=1. In the binary case function fp is generally either the XOR or EQUAL function to generate an m-sequence. The circuit is under control of a clock signal which is not shown but is assumed.

Figure 9:
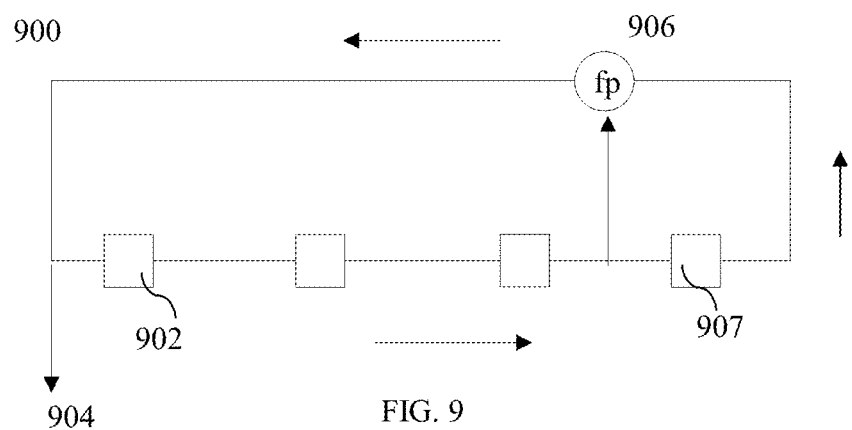
FIG. 9 is a diagram of an LFSR.

FIG. 9 shows a diagram of a binary m-sequence generator 900 of a repetitive binary m-sequence of 15 symbols generated on 904 by a 4-state binary LFSR of which elements 902 and 907 are identified. The feedback function fp identified as 906 can be a XOR or an EQUAL function. The following table shows the consecutive states of the shift register elements as a function of the initial states after a shift starting with initial state [1 0 0 0]; [0 1 0 0]; [0 0 1 0]; and [0 0 0 1] for the 4 shift register elements using fp is XOR.

| state based Fib. LFSR | SR1 | SR2 | SR3 | SR4 | SG |
|---|---|---|---|---|---|
| init | 1 0 0 0 | 0 1 0 0 | 0 0 1 0 | 0 0 0 1 | 1 0 0 0 |
| 1 | 0 0 1 1 | 1 0 0 0 | 0 1 0 0 | 0 0 1 0 | 0 0 1 1 |
| 2 | 0 1 1 0 | 0 0 1 1 | 1 0 0 0 | 0 1 0 0 | 0 1 1 0 |
| 3 | 1 1 0 0 | 0 1 1 0 | 0 0 1 1 | 1 0 0 0 | 1 1 0 0 |
| 4 | 1 0 1 1 | 1 1 0 0 | 0 1 1 0 | 0 0 1 1 | 1 0 1 1 |
| 5 | 0 1 0 1 | 1 0 1 1 | 1 1 0 0 | 0 1 1 0 | 0 1 0 1 |
| 6 | 1 0 1 0 | 0 1 0 1 | 1 0 1 1 | 1 1 0 0 | 1 0 1 0 |
| 7 | 0 1 1 1 | 1 0 1 0 | 0 1 0 1 | 1 0 1 1 | 0 1 1 1 |
| 8 | 1 1 1 0 | 0 1 1 1 | 1 0 1 0 | 0 1 0 1 | 1 1 1 0 |
| 9 | 1 1 1 1 | 1 1 1 0 | 0 1 1 1 | 1 0 1 0 | 1 1 1 1 |
| 10 | 1 1 0 1 | 1 1 1 1 | 1 1 1 0 | 0 1 1 1 | 1 1 0 1 |
| 11 | 1 0 0 1 | 1 1 0 1 | 1 1 1 1 | 1 1 1 0 | 1 0 0 1 |
| 12 | 0 0 0 1 | 1 0 0 1 | 1 1 0 1 | 1 1 1 1 | 0 0 0 1 |
| 13 | 0 0 1 0 | 0 0 0 1 | 1 0 0 1 | 1 1 0 1 | 0 0 1 0 |
| 14 | 0 1 0 0 | 0 0 1 0 | 0 0 0 1 | 1 0 0 1 | 0 1 0 0 |
| 15 | 1 0 0 0 | 0 1 0 0 | 0 0 1 0 | 0 0 0 1 | 1 0 0 0 |

The column SG shows the generated symbols as a function of the initial states. It shows that the states repeat after 15 shifts. A circuit can now determine all states and generated symbols after receiving 4 generated symbols.

Figure 10:
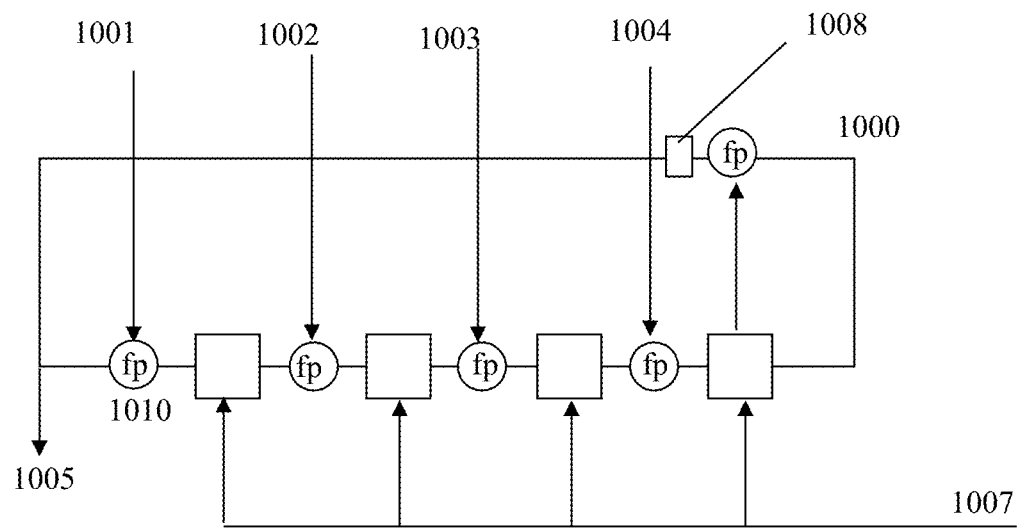
FIG. 10 is a diagram of an LFSR in accordance with an aspect of the present invention.

One can apply the same or at least similar circuits as provided above to determine synchronization of a sequence generator at a receiving side. One can also determine a corrective sequence to be entered into the shift register at a moment $t_{sync}$ to synchronize the LFSR with a transmitting side. This is illustrated in FIG. 10 with an LFSR 1000. The shift register is provided with devices implemented function fp (XOR for instance) of which 1010 is identified. A clock signal 1007 is also identified. The devices have inputs 1001, 1002, 1003 and 1004 respectively which are provided with corrective signals at the correct moment. A switch 1008 may be applied to disable feedback at the moment of update. After update a synchronized sequence is provided on 1005.

Non-Binary n-State LFSR

In order to demonstrate the apparatus and methods as provided above for n>2 as an illustrative example an 8-state case with the 8-state Galois configuration [g0 g1 g2 g3 g4]=[4 2 1 2 1] of FIG. 1 will be applied to generate an 8-state m-sequence of 4095 of 8-state symbols. The inverters are multipliers over GF(8) and the function fp are the addition over GF(8) whereof the truth tables are also provided above. This sequence has 4095 8-state symbols before it repeats itself. For illustrative purposes only, 25 consecutive states of the LFSR will be provided. However, it should be clear that all states can be generated easily.

The following table provides the first 25 consecutive states of the LFSR and the generated symbols as a function of an initial LFSR state [1 0 0 0]; [0 1 0 0]; [0 0 1 0] and [0 0 0 1]. The initial state generates symbol [0 0 0 1].

| Galois LFSR register states | SR1 | SR2 | SR3 | SR4 | GS |
|---|---|---|---|---|---|
| int | 1 0 0 0 | 0 1 0 0 | 0 0 1 0 | 0 0 0 1 | 0 0 0 1 |
| 1 | 0 0 0 4 | 1 0 0 2 | 0 1 0 1 | 0 0 1 2 | 0 0 1 2 |
| 2 | 0 0 4 5 | 0 0 2 6 | 1 0 1 0 | 0 1 2 7 | 0 1 2 7 |
| 3 | 0 4 5 3 | 0 2 6 6 | 0 1 0 2 | 1 2 7 1 | 1 2 7 1 |
| 4 | 4 5 3 4 | 2 6 6 5 | 1 0 2 5 | 2 7 1 0 | 2 7 1 0 |
| 5 | 5 3 4 0 | 6 6 5 4 | 0 2 5 5 | 7 1 0 5 | 7 1 0 5 |
| 6 | 3 4 0 1 | 6 5 4 6 | 2 5 5 7 | 1 0 5 1 | 1 0 5 1 |
| 7 | 4 0 1 4 | 5 4 6 4 | 5 5 7 5 | 0 5 1 6 | 0 5 1 6 |
| 8 | 0 1 4 2 | 4 6 4 5 | 5 7 5 3 | 5 1 6 4 | 5 1 6 4 |
| 9 | 1 4 2 7 | 6 4 5 3 | 7 5 3 7 | 1 6 4 2 | 1 6 4 2 |
| 10 | 4 2 7 5 | 4 5 3 1 | 5 3 7 5 | 6 4 2 1 | 6 4 2 1 |
| 11 | 2 7 5 4 | 5 3 1 3 | 3 7 5 0 | 4 2 1 3 | 4 2 1 3 |
| 12 | 7 5 4 6 | 3 1 3 0 | 7 5 0 0 | 2 1 3 4 | 2 1 3 4 |
| 13 | 5 4 6 7 | 1 3 0 1 | 5 0 0 4 | 1 3 4 5 | 1 3 4 5 |
| 14 | 4 6 7 1 | 3 0 1 2 | 0 0 4 6 | 3 4 5 3 | 3 4 5 3 |
| 15 | 6 7 1 6 | 0 1 2 2 | 0 4 6 5 | 4 5 3 3 | 4 5 3 3 |
| 16 | 7 1 6 6 | 1 2 2 3 | 4 6 5 5 | 5 3 3 7 | 5 3 3 7 |
| 17 | 1 6 6 3 | 2 2 3 5 | 6 5 5 1 | 3 3 7 6 | 3 3 7 6 |
| 18 | 6 6 3 2 | 2 3 5 1 | 5 5 1 1 | 3 7 6 3 | 3 7 6 3 |
| 19 | 6 3 2 6 | 3 5 1 1 | 5 1 1 7 | 7 6 3 2 | 7 6 3 2 |
| 20 | 3 2 6 5 | 5 1 1 4 | 1 1 7 4 | 6 3 2 1 | 6 3 2 1 |
| 21 | 2 6 5 4 | 1 1 4 3 | 1 7 4 2 | 3 2 1 1 | 3 2 1 1 |
| 22 | 6 5 4 4 | 1 4 3 1 | 7 4 2 7 | 2 1 1 0 | 2 1 1 0 |
| 23 | 5 4 4 0 | 4 3 1 4 | 4 2 7 1 | 1 1 0 7 | 1 1 0 7 |
| 24 | 4 4 0 3 | 3 1 4 1 | 2 7 1 5 | 1 0 7 0 | 1 0 7 0 |

The representation means that the initial state is [u 0 0 0], [0 v 0 0], [0 0 w 0] and [0 0 0 z]. A number representation herein indicates the coefficient of an n-state switching expression. For instance, [1 0 0 0] represents 1*u+0*v+ 0*w+0*z as an expression over GF(8) with + being the addition over GF(8) and * being the multiplication over GF(8). These operations are commutative, associative and distributive. Furthermore a+ a in GF(8) is 0. And + over GF(8) is self reversing. This all makes processing of symbols to determine synchronization states very simple. However, the use of other reversible n-state functions and reversible n-state inverters is also possible to generate an m-sequence and to determine synchronization states. How to reverse these functions and inverters is described by the inventor in U.S. patent application Ser. No. 11/566,725 filed on Dec. 5, 2006 which is incorporated herein by reference in its entirety.

The state [4 4 0 3] of the first shift register element at moment 24 thus represents an 8-state expression 4*u+4*v+ 0*w+3*z over GF(8). Assume that one receives 4 consecutive 8-state symbols 6, 5, 4 and 3 that are part of a sequence generated by the 8-state sequence generator of FIG. 1 with the settings as provided above. One may say that a=6=[0 0 0 1]; b=5=[0 0 1 2]; c=4=[0 1 2 7] and d=3=[1 2 7 1]. This leads to the following expressions:

$$a=0+0+0+z;$$

$$b=0+0+w+2*z;$$

$$c=0+v+2*w+7*z; \text{ and}$$

$$d=u+2*v+7*w+z.$$

The reverse of multiplying with 2 in GF(8) is 7; the reverse of 3 is 6; the reverse of 4 is 5; the reverse of 5 is 4; the reverse of 6 is 3; the reverse of 7 is 2 and the reverse of 1 is 1. Using the truth tables of addition and multiplication over GF(8) as provided above leads to:

$$u=2*a+1*b+2*c+1*d \text{ or } [2\ 1\ 2\ 1];$$

$$v=1*a+2*b+1*c+0*d \text{ or } [1\ 2\ 1\ 0];$$

$w=2*a+1*b+0*c+0*d$ or [2 1 0 0]; and $z=1*a+0*b+0*c+0*d$ or [1 0 0 0].

With [a b c d]=[6 5 4 3] the initial state of the LFSR should thus be:

$u=(2*6+1*5+2*4+1*3)=7+5+5+3=7+0+3=1$;

$v=(1*6+2*5+1*4+0*3)=6+6+4+0=4$;

$w=(2*6+1*5+0*4+0*3)=7+5=4$; and $z=a=6$.

One can then generate a shift register table wherein the initial state is represented as [2 1 2 1] [1 2 1 0] [2 1 0 0] and [1 0 0 0], wherein the positions represent [a b c d] being the first 4 generated s8-state symbols from the initial state. The following table shows the first 10 states of an 8-state k-stage LFSR expressed as the first k generated 8-state symbols.

| SG based Gal. LFSR | SR1 | SR2 | SR3 | SR4 | SG |
|---|---|---|---|---|---|
| init | 2 1 2 1 | 1 2 1 0 | 2 1 0 0 | 1 0 0 0 | 1 0 0 0 |
| 1 | 4 0 0 0 | 0 1 2 1 | 0 2 1 0 | 0 1 0 0 | 0 1 0 0 |
| 2 | 0 4 0 0 | 4 2 0 0 | 0 0 2 1 | 0 0 1 0 | 0 0 1 0 |
| 3 | 0 0 4 0 | 0 4 2 0 | 4 2 1 0 | 0 0 0 1 | 0 0 0 1 |
| 4 | 0 0 0 4 | 0 0 4 2 | 0 4 2 1 | 4 2 1 2 | 4 2 1 2 |
| 5 | 7 5 4 5 | 5 3 2 6 | 4 2 2 0 | 5 6 0 7 | 5 6 0 7 |
| 6 | 1 2 0 3 | 2 4 4 6 | 0 4 2 2 | 3 6 2 1 | 3 6 2 1 |
| 7 | 6 2 5 3 | 2 6 3 5 | 5 3 1 5 | 4 5 5 0 | 4 5 5 0 |
| 8 | 7 1 1 0 | 1 7 1 4 | 1 1 2 5 | 0 4 5 5 | 0 4 5 5 |
| 9 | 0 7 1 1 | 7 6 5 6 | 1 5 6 7 | 1 6 7 1 | 1 6 7 1 |

Because the expressed states are unique, one can use for instance an addressable memory as provided in FIG. 4 wherein a generated symbol associated with a k-state n-state LFSR is uniquely defined by an address formed by k n-state symbols generated by a generator. One important criterion for synchronization is from what address to start generating symbols at a certain moment $t_{sync}$. The above methods and apparatus provide the tools to calculate such an address or setting of an LFSR.

In the above example 4 consecutively generated 8-state symbols were used to calculate an initial state. The states where further recoded into a representation using the generated symbols as the determining elements. One can apply the same approach to non-consecutively received n-state symbols. For instance, assume that 4 symbols were received (sampled) 2 symbols apart being 6, 5, 4 and 3. Set the first symbol to be generated at moment int, and others at moment 3, 6 and 9. The following table shows all LFSR states and generated 8-state symbols as a function of 4 non-consecutively generated 8-state symbols as received by a receiver.

| SG based Gal. LFSR | SR1 | SR2 | SR3 | SR4 | SG |
|---|---|---|---|---|---|
| int | 5 7 0 3 | 4 4 2 1 | 2 3 4 6 | 1 0 0 0 | 1 0 0 0 |
| 1 | 4 0 0 0 | 3 7 0 3 | 2 4 2 1 | 0 3 4 6 | 0 3 4 6 |
| 2 | 0 6 7 2 | 4 4 5 7 | 3 1 4 4 | 2 0 3 3 | 2 0 3 3 |
| 3 | 5 0 6 6 | 3 6 5 1 | 1 4 2 1 | 0 1 0 0 | 0 1 0 0 |
| 4 | 0 4 0 0 | 5 2 6 6 | 3 5 5 1 | 1 1 2 1 | 1 1 2 1 |
| 5 | 4 4 5 4 | 2 1 3 2 | 6 4 7 5 | 5 3 2 4 | 5 3 2 4 |
| 6 | 1 6 5 7 | 3 0 2 7 | 3 7 5 1 | 0 0 1 0 | 0 0 1 0 |
| 7 | 0 0 4 0 | 1 6 3 7 | 3 0 4 7 | 3 7 3 1 | 3 7 3 1 |
| 8 | 6 3 6 4 | 4 1 0 2 | 7 2 0 3 | 6 1 0 6 | 6 1 0 6 |
| 9 | 2 4 0 2 | 2 5 6 5 | 3 0 0 7 | 0 0 0 1 | 0 0 0 1 |
| 10 | 0 0 0 4 | 2 4 0 0 | 2 5 6 6 | 3 0 0 6 | 3 0 0 6 |
| 11 | 6 0 0 2 | 4 0 0 5 | 5 4 0 6 | 1 5 6 2 | 1 5 6 2 |

Using this table one can, for instance, calculate the symbol (or the LFSR state) on moment 11. The 8-state symbol on moment 11 is determined by the expression $sym=1*a+5*b+6*c+2*d$ wherein a=6 generated at moment int, b=5 generated at moment 3, c=4 generated at moment 6 and d=3 generated at moment 9, which allows a circuit implementing functions multiplication and addition over GF(8) to calculate all states and generated symbols. One may also use the intermediary step of calculating the initial LFSR state at moment int for instance and use the earlier table to determine the symbol to be generated at moment 11.

As before, one can determine all states based on the expressions for the received symbols, which can be named [0 0 0 v]; [0 0 w 0]; [0 x 0 0]; and [y 0 0 0]. By using the earlier state tables one can thus create the equations:

$0+0+0+d=v$;

$a+2b+7c+d=w$;

$a+5c+0+d=x$; and $a+6b+4c+2v=y$.

By solving the above equations one will get:

$d=v$;

$c=2v+3w+4x+6y$;

$b=4v+4w+2x+y$; and $a=5v+7w+0+3y$.

It should be clear that it is not required that the symbol samples are evenly spaced. However, it is easier to locate the symbol samples if they always have the same position relative to each other in a received signal.

Using the above table one can, for instance, calculate the symbol (or the LFSR state) on moment 11. The 8-state symbol on moment 11 is determined by the expression $sym=1*a+5*b+6*c+2*d$ wherein a=6 generated at moment int, b=5 generated at moment 3, c=4 generated at moment 6 and d=3 generated at moment 9, which allows a circuit implementing functions multiplication and addition over GF(8) to calculate all states and generated symbols. One may also use the intermediary step of calculating the initial LFSR state at moment int for instance and use the earlier table to determine the symbol to be generated at moment 11.

Figure 34:
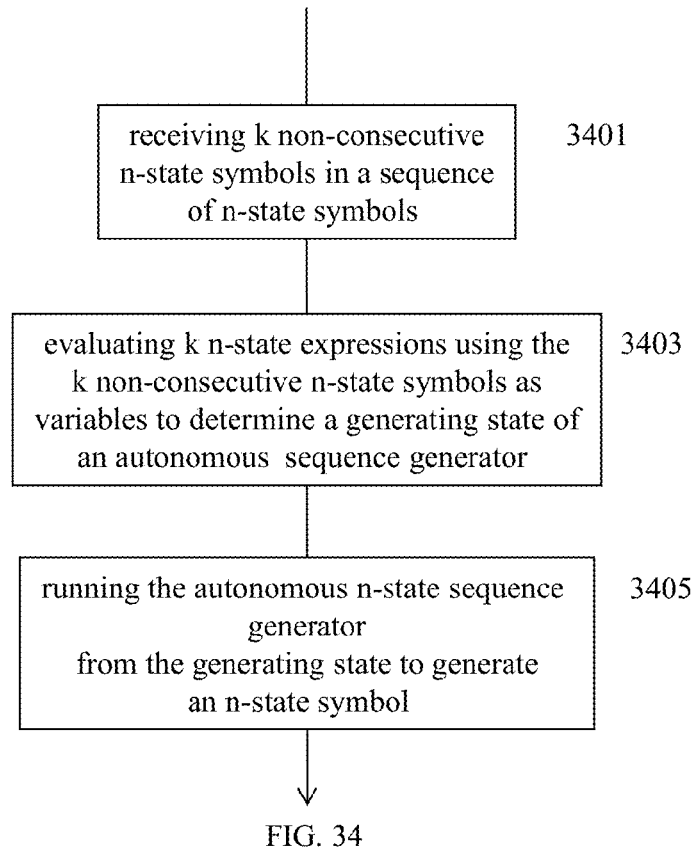
FIG. 34 illustrates steps preformed in accordance with various aspects of the present invention.

FIG. 34 illustrates the above steps, wherein step 3401 describes receiving the k non-consecutive n-state symbols; step 3403 describes evaluating the n-state expressions to determine individual n-state symbols of a desired generating state of the sequence generator; and step 3405 describes applying the generating state to the sequence generator to generate an n-state symbol.

An apparatus can be synchronized by generating the correct n-state symbols as of the synchronized moment. One can also synchronize an LFSR by loading the correct LFSR state corresponding to the synchronization moment. One can also add a corrective signal to a shift register content to correct the out-of-sync state at a certain moment to the correct synchronized state. The procedure or apparatus is similar to the one in the binary case as illustrated in FIG. 6. One may assume that a number of clock pulses will have to pass to allow the synchronization apparatus to generate the corrective or correct states.

In one embodiment, the apparatus receives k n-state symbols and determines the correct state on synchronization moment $t_{sync}$ which may be q clock pulses in the future. Assume that one register should have the state determined by s1*a1+s2*b1+s3*c1+s4*d1 based on received symbols a1, b1, c1, and d1. Furthermore, assume that based on locally generated symbols a2, b2, c2 and d2 the apparatus determines that at $t_{sync}$ the out-of-sync state of the local LFSR is determined by q1*a2+q2*b2+q3*c2+q4*d2. The corrective signal to put the LFSR shift register element in the correct state at $t_{sync}$ is determined by {s1*a1+s2*b1+s3*c1+s4*d1+q1*a2+q2*b2+q3*c2+q4*d2} wherein + and * are operations over GF(8) in the example, keeping in mind that subtraction in GF(8) is the same as addition as addition over GF(8) is a self reversing function.

In accordance with a further aspect of the present invention, one can predict from the table what the next sample symbol of the LFSR should be. For instance, after k sample symbols have been received related to a sequence that is based on a k-shift register element based LFSR, then the k+1 sample is fully determined. If that prediction is wrong, the LFSRs or the LFSR programs are out of sync and the synchronization process starts, for instance using the most recent sample symbol as the start of the re-sync process.

Herein, the sequences in one aspect of the present invention are related to an LFSR based sequence generator. This does not mean that the sequences actually have to be generated by an LFSR. They may also be retrieved from a memory. They may also be generated by an n-state expression that implements the LFSR for instance on a processor. However, even if the symbols are not generated by an LFSR the relations between the symbols in such a sequence can still be determined by the earlier herein provided methods.

Processor based sequence generators have an advantage in that "entering" a new state in a shift register element is achieved by calculating or retrieving that state and assigning it to the shift register element.

One known approach in synchronization is determining an offset between a current state of the decoder and a required state and adding such an offset to the current state. Such an approach is for instance disclosed in U.S. Pat. No. 5,245,661 issued on Sep. 14, 1993 to Lee et al. which is incorporated herein by reference. In a related manner "masks" are determined that can be used to update the LFSRs.

Synchronization of a sequence generator in a receiver with that of a transmitter is required for instance to make sure that a received spread spectrum signal can be correctly decoded. Accordingly, the methods and systems as disclosed herein are in accordance with an aspect of the present invention applied in or are part of a communication receiver, which is preferably a wireless receiver, and more preferably a mobile wireless communication receiver such as a mobile computing device, a PDA, a cell phone, a smart phone, an eReader, or a tablet.

The above examples are illustrated for an 8-state LFSR in Galois configuration. It should be clear that the approach also applies to Fibonacci configuration n-state LFSRs, which are fully contemplated.

The above n-state examples are based on an 8-state 4-stage LFSR with functions defined in GF(8). It should be clear that the aspects of the inventions as disclosed herein apply to k-stage n-state LFSRs with n≥2 and k≥2 and for n>2 and k>2. Switching functions applied herein are additions and multipliers over GF(n). In one embodiment $n=2^m$ with m≥1 and with m>1. This allows especially the adders to be implemented with binary XOR or EQUAL functions. However, other implementations are also contemplated. For instance, in one embodiment the addition over GF(n) can be replaced with a modulo-n addition. The addition, over GF(n) in the examples, has an inverter at least one input. Such a function can be reduced to a single function having no inverter at an input. This aspect is disclosed, for instance, in U.S. Non-Provisional patent application Ser. No. 10/935, 960, filed on Sep. 8, 2004, entitled TERNARY AND MULTI-VALUE DIGITAL SCRAMBLERS, DESCRAMBLERS AND SEQUENCE GENERATORS now U.S. Pat. No. 7,643,632 issued on Jan. 5, 2010 which is incorporated herein in its entirety. In a further embodiment reversible n-state switching or logic functions are used that do not generate a state 0, when two inputs are 0, which excludes additions. Reversible inverters in a further embodiment herein are not multipliers over GF(n).

It is again pointed out that the methods and apparatus for generated a sequence are associated with an n-state LFSR. However, no real LFSR has to be applied as each LFSR state can be expressed and evaluated by individual expressions or n-state switching expressions implemented with n-state or binary devices. It should also be clear that each state can be evaluated without first evaluating a preceding or succeeding state, which allows all states including comparative states to be determined concurrently. The methods and aspects of the present invention can be implemented in a processor. They can also be implemented in parallel processors that determine an LFSR states concurrently. A processor may be a programmable processor with a memory to store and provide instructions that perform the steps herein provided. A processor may also be customized or hard wired circuitry that performs one or more instructions. Such circuitry can be Field Programmable Gates Arrays (FPGA) circuitry for instance. The aspects of the present invention may also be provided as a set of instructions that are part of a library, which can be selected by a user to program an FPGA circuit to create a processor that performs instructions to execute aspects of the present invention.

The coefficients of the expressions may be stored in a memory. They may also be hardwired in a circuit such as a FPGA. The coefficient may also be provided in a permanent storage device such as a Read Only Memory and the like. No matter how provided, the coefficients are available to be processed in combination with corresponding symbols and as such are assumed to be implemented in a circuit.

For instance, in the 4-element example over GF(8) as provided above or in the case of the 4-element binary example 4 n-state symbols (with n being 2 or greater) are required to determine the new content of the shift register at a synchronization moment. The states are determined by 4 n-state expressions that each has at maximum 4 terms. If it is fixed that only one synchronization moment is required then only these expressions have to be implemented and not the whole table. One may want to implement larger parts or even the whole table if one wants to determine based on other events when the synchronization has to take place.

In yet a further embodiment, the whole table can be generated by a procedure that applies substitution as explained above. A program can also be instructed to select the appropriate moment of synchronization and its related expressions. For instance, at a start of a communication, a receiver receives data that may include one or more of the following: data that determines a structure of an n-state LFSR, for instance a set of coefficients that determines the states, data related to a starting content, data related to a position of a symbol that is generated by a sequence generator at a transmitting side in a transmitted sequence of symbols, a time delay or a time in a frame that determines a moment of synchronization of the sequence generator at the receiving side. The receiver may also receive data that determines an expression to calculate the content of a corresponding LFSR at the moment of synchronization. A processor may also be programmed to calculate the relevant LFSR states based on received information, for instance to generate all or part of the tables as provided herein. This means that a receiver may operate in different or changing environments that apply different sequences.

It was already noted that one may store a sequence in a memory. Such a memory in one embodiment of the present invention is an addressable memory wherein a symbol in the sequence has an address that is related to a corresponding state of the related LFSR. Accordingly, as one aspect of the present invention, a content of the related LFSR for a synchronization moment is determined. This content is then related to an address in the addressable memory, for instance by adding an offset address that determines the actual address in the memory. At the moment of synchronization, the processor starts using symbols generated from the addressable memory, starting with the newly determined address at the synchronization moment. In general, addresses will be consecutive for consecutive symbols. However, this is not required and a translation table can be created in case of non-consecutive addresses to generate the correct consecutive symbols.

The n-state functions such as the adder and the multipliers over GF(n) can be implemented in different ways. In a first embodiment, a truth table of an n-state function is stored in an addressable memory. An input to such a memory is a signal representing an n-state symbol. An output of such a memory is a state of the truth table dependent on the input. Signals may be binary signals or non-binary signals. N-state truth tables may also be implemented by active switching circuits. For instance, adders and multipliers over $GF(n^m)$ with m>1 can be implemented with binary circuits, which is known in the art.

The encoding, reverse encoding, error location and error correction aspects that are provided herein can be applied in different kind of systems wherein symbols are transmitted and/or received and/or processed as signals. Many of these systems require processing of symbols at a speed that requires processors working at a clock rate of at least 1 kHz or at least 1 Mhz. This means that humans cannot reasonably perform the steps provided herein as one or more aspects of the present invention and processing circuitry, which can be electronic or other type of processing circuitry, is required. An n-state symbol with n>2 can in one embodiment be represented by a plurality of signals, for instance binary signals. An n-state symbol in another embodiment can also be represented as an n-state signal. A processor thus herein is assumed to be comprised of binary or n-state switching circuitry to implement at least one binary or n-state switching function.

Figure 11:
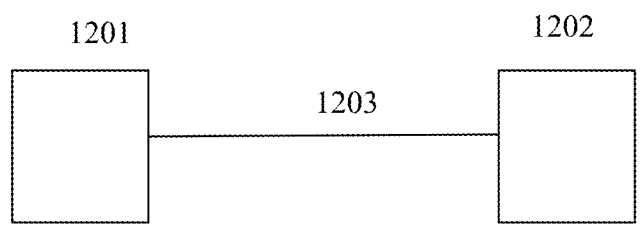
FIGS. 11 and 12 illustrate a system in accordance with an aspect of the present invention
Figure 12:
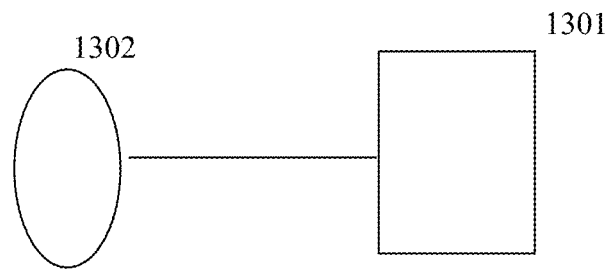

A system that applies aspects of the invention as provided herein is a communication system as shown in FIG. 11, including at least two devices that communicate of which a first device 1201 transmits n-state symbols which can be binary symbols or symbols with n>2 over a channel 1203 and a second device 1202 receives and synchronizes with n-state symbols transmitted by the first device. Devices in such a communication system in one embodiment transmit over a wireless channel 1203. In a further embodiment, the devices transmit at least over part of a transmission channel over a wired transmission channel 1203, which may be an optical fiber medium or a metallic medium. A system in another embodiment is a data storage system as shown in FIG. 12 wherein a device 1301 reads n-state symbols from a medium 1302. Such a medium in one embodiment is an electronic memory. In a further embodiment a storage medium 1302 is a magnetic medium. In yet a further embodiment, a storage medium is an optical, an electro-optical, or a magneto-optical medium. In yet a further embodiment, a storage medium is a medium that can store n-state symbols and is enabled to be read by a reader to read the n-state symbols from the medium.

The synchronization steps and apparatus may also be applied to synchronize parts inside a computing device. Thus, the synchronizations methods and apparatus can also be part of a computing device.

An n-state symbol can be represented by a plurality of binary symbols or by a single n-state symbol or is a binary symbol. A symbol on a medium is in one embodiment a modification of the medium at a certain location which can be called a mark. A mark can be a change in an electronic, magnetic, optical, chemical, quantum-mechanical, biological, or mechanical property or a combination thereof. A mark can also be represented by a logical state of a device, which may be reflected in a dynamical switching property such as exhibited by a memory latch. A mark can also be represented by a physical state of a material.

The n-state k-stage synchronized sequence generators in one embodiment generate an m-sequence. In another embodiment, the n-state k-state sequence generator generates a sequence which is shorter than an m-sequence. A sequence of $n^k-1$ symbols generated by such a generator may contain 2 or more distinguishable sequences. One can still synchronize such sequences with the methods and apparatus as provided herein. Such synchronization is fully contemplated and should be apparent to one of ordinary skill.

Generating states, as well as to be generated symbols are expressed as single n-state expressions which can be executed by a processor or a circuit. The expressions are specifically not expressed as a matrix or as a multiplication or a power of matrices, as these require additional processing and slow down the synchronization process. In a matrix process a variable may be applied more than once in an expression and again requires intermediate steps that slow down the evaluation process, which is circumvented in the present approach.

An expression herein that determines a shift register element state or a symbol is an expression that contains only a single term that depends on a specific variable, which is a received n-state symbol. As is well known, a matrix may contain 2 or more terms that depend on a specific variable.

In one embodiment the expressions are represented and stored in memory as coefficients of an expression. Symbol values are the variables of such expressions. Coefficients and variables correspond to positions of symbols in a memory. For instance a k variable expression can be saved as n-state memory [c1 c2 c3 c4] corresponding to n-state symbols [x1 x2 x3 x4] representing the linear n-state expression c1*x1+c2*x2+c3*x3+c4*x4, wherein k=4 in this example. Linear expression herein means wherein a symbol is used as a variable to the power 1 only. The function + is a reversible n-state function having at least 2 inputs and 1 output. The function* is a reversible n-state inverter applied to its corresponding symbol. In one embodiment + is an addition over GF(n) and* is a multiplier over GF(n).

Consecutively generated symbols herein means symbols directly following each other without any intervening symbols. For instance, if symbols are generated only on moments 1, 2, 3, 4 and 5 for instance and the 5 generated symbols are a, b, c, d and e generated on moments 1, 2, 3, 4 and 5 respectively then [a b c d e] are consecutive symbols. Symbols a and c, for instance, are not considered consecutive symbols herein.

Figure 13:
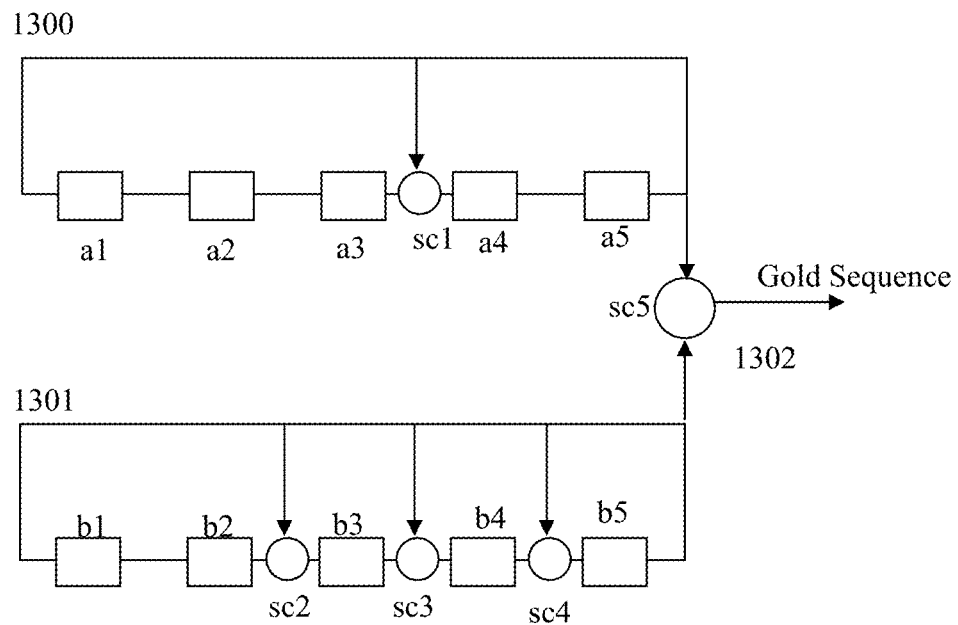
FIG. 13 is a diagram of a binary Gold sequence generator.

Synchronization of Binary and Non-Binary Combination or Composition Sequences and their Generators The above dealt with sequences related to at least a single LFSR. It is known that binary and non-binary sequences can be generated by at least two sequence generators and combined through an n-state logic device. Examples of those sequences are binary and non-binary Gold sequences and Kasami sequences. These sequences are for instance used for their cross correlation properties. It is assumed that Kasami codes and their generators are known to one of ordinary skill. Background on Kasami codes can for instance be found in U.S. Patent Appl. Pub. Ser. No. 20090250576 to Fullerton et al. published on Oct. 8 2009, which is incorporated herein by reference. FIG. 13 provides a diagram of a Gold sequence, consisting of an LFSR 1300 and 1301 of which the outputs are connected through an n-state switching function 1302. The LFSR 1300 has 5 shift register elements with a content [a1 a2 a3 a4 a5] and an n-state switching function sc1, wherein n=2 or n>2 (such as n=8). The LFSR 1301 has 5 shift register elements with a content [b1 b2 b3 b4 b5] and an n-state switching functions sc2, sc3 and sc4, wherein n=2 or n>2 (such as n=8). The outputs of 1300 and 1301 of n-state symbols are inputted on a device or an implementation determined by n-state switching function sc5, which provides on an output an n-state Gold sequence.

In the binary case sc1, sc2, sc3, sc4 and sc5 are all for example XOR functions, though any of these functions may also be an '=' function. An LFSR may be characterized by its taps and the n-state inverters or n-valued multipliers in these taps. The input into the first shift register element and the output from the last shift register element are also considered taps. A tap in the binary case is a '1' or a connection and a '0' is lack of connection. LFSR 1300 can be represented as [1 0 0 1 0 1] and 1301 as [1 0 1 1 1 1].

Figure 14:
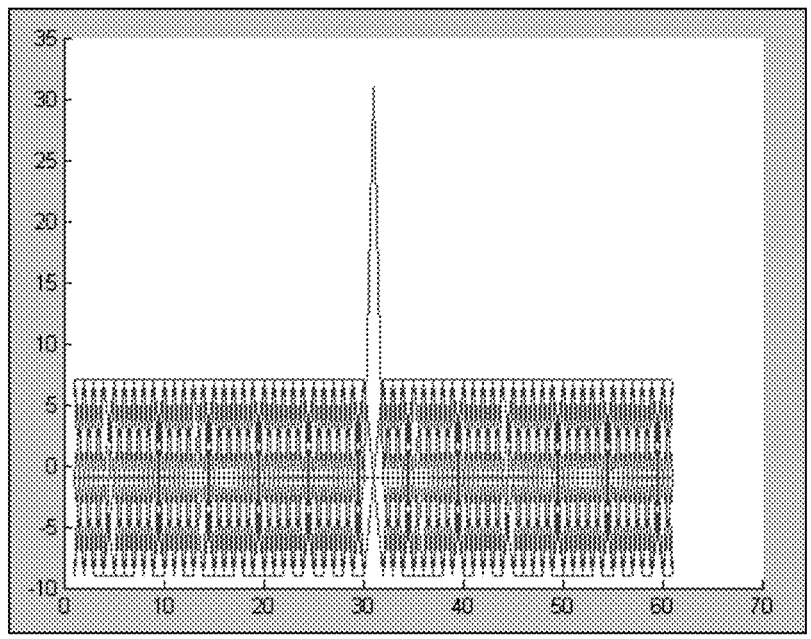
FIG. 14 is a correlation graph.

The Gold sequence has a non-repeating length of 31 symbols. An overlay of an auto-correlation graph of a binary Gold sequence and about 20 other binary Gold sequence generated by the generator of FIG. 13 is shown in FIG. 14.

Each of the LFSRs has its own table that determines its LFSR states as was shown before above. The state table for LFSR 1300 is shown below.

| cycle 1300 | SR 1 | | | | | SR2 | | | | | SR3 | | | | | SR4 | | | | | SR5 | | | | |
|---|---|---|---|---|---|---|---|---|---|---|---|---|---|---|---|---|---|---|---|---|---|---|---|---|---|
| 0  | 1 | 0 | 0 | 0 | 0 | 1 | 0 | 0 | 0 | 0 | 1 | 0 | 0 | 0 | 0 | 1 | 0 | 0 | 0 | 0 | 0 | 0 | 0 | 0 | 1 |
| 1  | 0 | 0 | 0 | 0 | 1 | 1 | 0 | 0 | 0 | 0 | 1 | 0 | 0 | 0 | 0 | 1 | 0 | 1 | 0 | 0 | 0 | 0 | 1 | 0 |
| 2  | 0 | 0 | 0 | 1 | 0 | 0 | 0 | 0 | 1 | 1 | 0 | 0 | 0 | 0 | 1 | 0 | 1 | 0 | 0 | 0 | 1 | 0 | 1 |
| 3  | 0 | 0 | 1 | 0 | 1 | 0 | 0 | 0 | 1 | 0 | 0 | 0 | 0 | 1 | 1 | 0 | 1 | 0 | 1 | 0 | 1 | 0 | 1 | 0 |
| 4  | 0 | 1 | 0 | 1 | 0 | 0 | 0 | 1 | 0 | 1 | 0 | 0 | 1 | 0 | 0 | 1 | 0 | 1 | 1 | 0 | 1 | 0 | 1 |
| 5  | 1 | 0 | 1 | 0 | 1 | 0 | 1 | 0 | 1 | 0 | 0 | 1 | 0 | 1 | 1 | 0 | 1 | 1 | 1 | 0 | 1 | 0 | 1 | 1 |
| 6  | 0 | 1 | 0 | 1 | 1 | 1 | 0 | 1 | 0 | 1 | 0 | 1 | 0 | 0 | 1 | 1 | 1 | 0 | 1 | 0 | 1 | 1 | 1 |
| 7  | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 8  | 0 | 1 | 1 | 1 | 0 | 1 | 0 | 1 | 1 | 0 | 1 | 0 | 1 | 1 | 1 | 0 | 1 | 1 | 1 | 1 | 0 | 1 |
| 9  | 1 | 1 | 1 | 0 | 1 | 0 | 1 | 1 | 0 | 1 | 0 | 1 | 1 | 1 | 0 | 1 | 1 | 0 | 1 | 1 | 0 | 1 | 1 |
| 10 | 1 | 1 | 0 | 1 | 1 | 1 | 1 | 1 | 0 | 1 | 0 | 1 | 1 | 1 | 0 | 0 | 1 | 1 | 0 | 0 | 1 | 0 | 1 | 1 | 0 |

In the above table [1 0 0 0 0]=[a1 0 0 0 0]; [0 1 0 0 0]=[0 a2 0 0 0]; etc. The state table for LFSR 1301 is shown below.

| cycle 1301 | SR 1 | | | | | SR2 | | | | | SR3 | | | | | SR4 | | | | | SR5 | | | | |
|---|---|---|---|---|---|---|---|---|---|---|---|---|---|---|---|---|---|---|---|---|---|---|---|---|---|
| 0  | 1 | 0 | 0 | 0 | 0 | 1 | 0 | 0 | 0 | 0 | 1 | 0 | 0 | 0 | 0 | 1 | 0 | 0 | 0 | 0 | 0 | 0 | 0 | 0 | 1 |
| 1  | 0 | 0 | 0 | 0 | 1 | 1 | 0 | 0 | 0 | 0 | 1 | 0 | 0 | 1 | 0 | 0 | 1 | 0 | 1 | 0 | 0 | 0 | 0 | 1 | 1 |
| 2  | 0 | 0 | 0 | 1 | 1 | 0 | 0 | 0 | 0 | 1 | 1 | 0 | 0 | 1 | 1 | 0 | 1 | 0 | 1 | 0 | 0 | 0 | 1 | 1 | 0 |
| 3  | 0 | 0 | 1 | 1 | 0 | 0 | 0 | 0 | 1 | 1 | 0 | 0 | 1 | 1 | 1 | 1 | 0 | 1 | 0 | 1 | 0 | 1 | 1 | 0 | 0 |
| 4  | 0 | 1 | 1 | 0 | 0 | 0 | 0 | 1 | 1 | 0 | 0 | 1 | 1 | 1 | 1 | 0 | 1 | 0 | 1 | 1 | 1 | 1 | 0 | 0 | 1 |
| 5  | 1 | 1 | 0 | 0 | 1 | 0 | 1 | 1 | 0 | 0 | 1 | 1 | 1 | 1 | 1 | 0 | 1 | 1 | 1 | 0 | 1 | 0 | 0 | 1 | 0 |
| 6  | 1 | 0 | 0 | 1 | 0 | 1 | 1 | 0 | 0 | 1 | 1 | 1 | 1 | 0 | 0 | 1 | 1 | 0 | 1 | 0 | 0 | 1 | 0 | 0 | 0 |
| 7  | 0 | 0 | 1 | 0 | 0 | 1 | 0 | 0 | 1 | 0 | 1 | 1 | 0 | 1 | 1 | 1 | 0 | 1 | 0 | 0 | 1 | 0 | 0 | 0 | 1 |
| 8  | 0 | 1 | 0 | 0 | 1 | 0 | 0 | 1 | 0 | 0 | 1 | 1 | 0 | 1 | 1 | 1 | 0 | 1 | 0 | 0 | 0 | 1 | 0 | 0 | 1 | 1 |
| 9  | 1 | 0 | 0 | 1 | 1 | 0 | 1 | 0 | 0 | 1 | 1 | 0 | 1 | 1 | 1 | 0 | 1 | 0 | 0 | 0 | 0 | 0 | 1 | 1 |
| 10 | 0 | 0 | 1 | 1 | 1 | 1 | 0 | 0 | 1 | 1 | 0 | 1 | 1 | 1 | 0 | 1 | 0 | 0 | 0 | 0 | 1 | 1 | 1 | 1 |

In the above table [1 0 0 0 0]=[b1 0 0 0 0]; [0 1 0 0 0]=[0b2 0 0 0]; etc. As before, one can translate back the states of the LFSRs to outputted symbols [u v w x y].

Accordingly, each symbol in the Gold Sequence is related to 2 symbols, outputted by 1300 and 1301, respectively. This clearly means that determining a synchronization state for the Gold Sequence requires two times 5 symbols. This allows the determination of n LFSR state of 1300 and 1301 at a moment k, determined by for instance the last of 10 synchronization symbols received by a receiver with synchronization capabilities. The synchronization symbols may be provided in pairs, each pair providing symbols n1 and n2 generated at the same time by 1300 and 1301, respectively. However, symbols may also be generated at different times, as long as the receiver is able to determine when a synchronization symbol is received and to which LFSR it belongs. A pair (n1 n2) has some advantages herein, as one may always assign n1 to 1300 and n2 to 1301. But other arrangements are possible and have been fully contemplated and work as well in creating a synchronization point.

A listing of Matlab script to determine the above table is shown in FIG. 15. All arrays and array or matrix operations are in origin 1 and the binary states are represented as 1 and 2.

are several ways to determine the next synchronization state of the LFSR. In a first embodiment one can provide an expression that expresses the individual states of the synchronization point as a function of received (sample) symbols.

In another embodiment, one can store an LFSR state table as provided above and in a first step calculate the initial state of the LFSR based on the received symbols and then calculate the actual individual states of the LFSR at the desired synchronization moment. This means that one has to know what the relative position of the sample symbols is, relative to a first symbol. This can be known, for instance because of the way that sampling is implemented. Or a received sample symbol is provided with data that for instance provides its distance to a previous sample symbol.

The initial states can then be calculated for instance by applying Cramer's rule wherein (in the 5-element shift register case) initial states [a1 a2 a3 a4 a5] in [a1 0 0 0 0]; [0 a2 0 0 0]; [0 0 a3 0 0]; [0 0 0 a4 0]; and [0 0 0 0 a5] are unknowns and received symbols [u v w x y] on moments 1, 1+t1, 1+t2, 1+t3, and 1+t4 are known.

Illustrative Matlab script for solving initial states in provided in FIGS. 16-18. FIG. 16 illustrates an implementation of solving a determinant as part of Cramer's rule, using the appropriate binary functions. FIG. 17 illustrates an implementation in Matlab to determine initials state after 5 consecutive symbols have been received. It is assumed that the received symbols are [2 1 2 2 2] (or [1 0 1 1 1] in origin 1). The following table shows the output states of the LFSR that determine the output.

| moment | | | | | |
|---|---|---|---|---|---|
| 1 | 1 | 1 | 1 | 1 | 2 |
| 2 | 1 | 1 | 1 | 2 | 1 |
| 3 | 1 | 1 | 2 | 1 | 2 |
| 4 | 1 | 2 | 1 | 2 | 1 |
| 5 | 2 | 1 | 2 | 1 | 2 |

The binary value of the above determinant is 1. The state a1 is determined by evaluating the above determinant wherein the first column is replaced by [2 1 2 2 2] etc, in accordance with Cramer's rule. The result is [a1 a2 a3 a4 a5]=[1 2 1 1 2]. One can check that this is correct by evaluating the rows of the above table. One can then evaluate the synchronization state on the desired moment by evaluating the relevant row of the earlier provided table.

FIG. 18 illustrates the procedure for symbols [2 1 2 2 2] received at moments 1, 4, 7, 10 and 13. The relevant output states are provided in the following table:

| moment | | | | | |
|---|---|---|---|---|---|
| 1 | 1 | 1 | 1 | 1 | 2 |
| 4 | 1 | 2 | 1 | 2 | 1 |
| 7 | 2 | 1 | 2 | 2 | 2 |
| 10 | 2 | 2 | 1 | 2 | 2 |
| 13 | 2 | 2 | 1 | 1 | 1 |

The required initial states are then [1 2 2 2 2]. Based on that one can determine the states on the synchronization moment.

The above process can be repeated for the second LFSR when one is synchronizing a combination sequence such as a Gold sequence.

Figure 19:
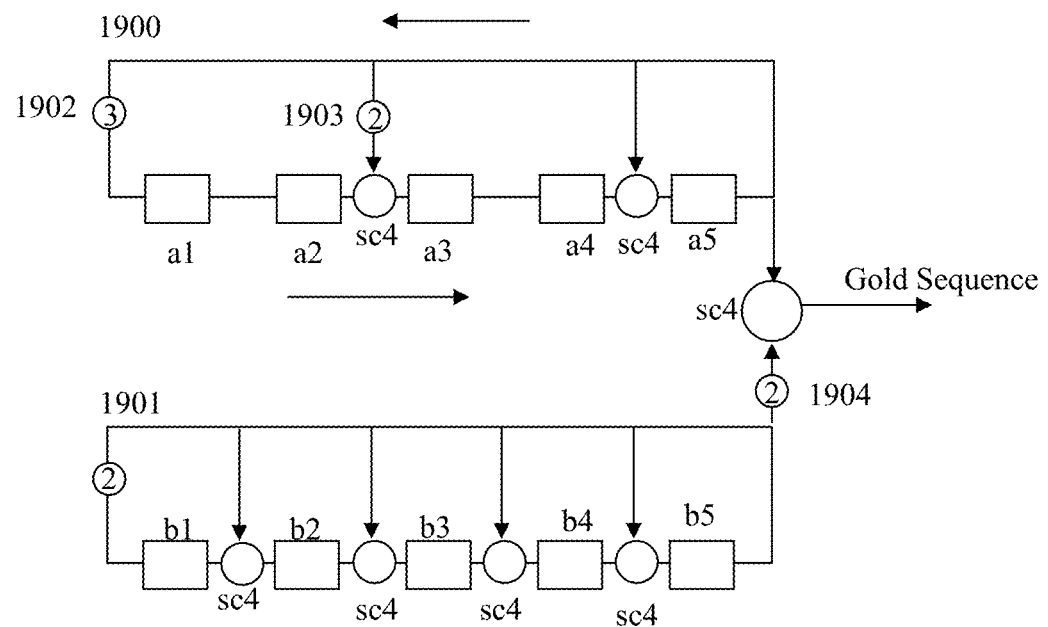
FIG. 19 is a diagram of a non-binary Gold sequence generator.

FIG. 19 is a diagram that illustrates a non-binary combination sequence generator, which in this illustrative example is a 4-state Gold sequence generator. The inventor has shown in U.S. Pat. No. 7,580,472 issued on Aug. 25, 2009 to Lablans, and which is incorporated herein by reference, how to create non-binary sequences such as Gold sequences. FIG. 19 shows a first 4-state 5-element sequence generator 1900, determined by multipliers [3 0 2 0 1 1] and additions sc4 all over GF(4) and a second sequence generator 1901 determined by multipliers [2 1 1 1 1 1 1] and addition sc4 all over GF(4). The output of 1901 is inverter by a 4-state inverter 1904, which is a multiplier 2 over GF(4) which is then added by an addition sc4 over GF(4) with the output of 1900 to generate a Gold sequence. Required clock signals should be assumed, though not specifically drawn, to avoid obscuring other details.

Figure 20:
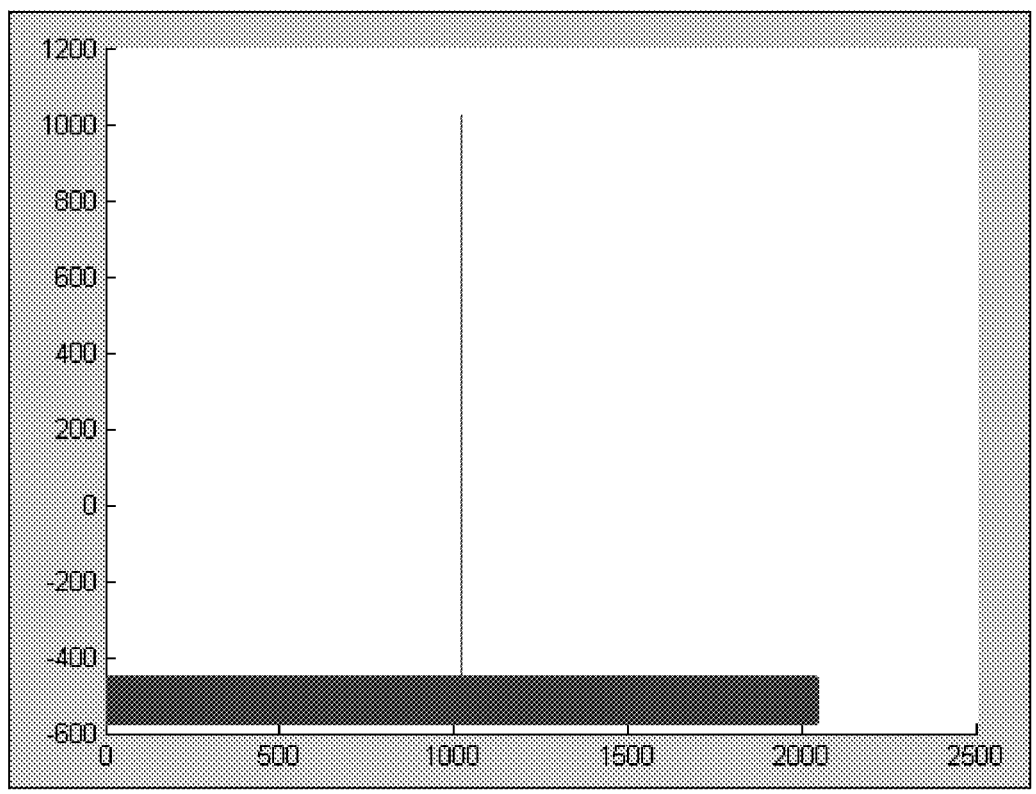
FIG. 20 is another correlation graph.

FIG. 20 shows a correlation graph of 19 different cross-correlated sequences generated by the generator of FIG. 19 and an overlay of one auto-correlation graph of a sequence generated by the generator. All generated sequences by 1900 and 1901 are maximum-length sequences, as determined by an auto-correlation graph that is flat, except for one high peak that indicates alignment. Correlation is determined by comparing two symbols and only adding a term to a correlation sum when symbols are identical. By using a term that is independent of the state of the symbols, as explained by the inventor in for instance the above cited U.S. Pat. No. 7,580,472 one obtains a clear indication of maximum length. The 'known' correlation method which uses a multiplication of symbol values in general creates a correlation graph with side lobes, which may be more difficult to interpret if one is searching for attractive n-state sequences. However, the use of known correlation techniques may be preferred to detect an n-state sequence among a plurality of m-state sequences.

The inverter 1904 herein is used for illustrative purposes, to demonstrate that one may use different ways to combine n-state sequences. The function sc4, which is an addition over GF(4) and multiplier 2 over GF(4) which may be represented by inverter [0 1 2 3]→[0 2 3 1] can be replaced by a single non-commutative truth table which may be implemented as a single look-up table in a memory. The same applies to any other n-state n by n truth table with at least one inverter at an input. For instance a set of truth tables which may further include n-state inverters may be stored in a memory. They may be provided with an identifying code which is known both to the receiver and the transmitter. By transmitting such a code which is associated with a synchronization time, for instance by providing an external instruction thereto, a receiver will implement the relevant function and/or inverter at the appropriate moment.

FIG. 21 shows a listing of Matlab script to determine a table of LFSR states for the sequence generator 1900. The following table provides the first 10 LFSR states.

| cycle 1900 | SR 1 | | | | | | SR2 | | | | | | SR3 | | | | | | SR4 | | | | | | SR5 | | | | |
|---|---|---|---|---|---|---|---|---|---|---|---|---|---|---|---|---|---|---|---|---|---|---|---|---|---|---|---|---|---|
| 0  | 1 | 0 | 0 | 0 | 0 | 0 | 1 | 0 | 0 | 0 | 0 | 0 | 1 | 0 | 0 | 0 | 0 | 0 | 1 | 0 | 0 | 0 | 0 | 0 | 1 |
| 1  | 0 | 0 | 0 | 0 | 3 | 1 | 0 | 0 | 0 | 0 | 0 | 1 | 0 | 0 | 0 | 2 | 0 | 0 | 1 | 0 | 0 | 0 | 0 | 1 | 1 |
| 2  | 0 | 0 | 0 | 3 | 3 | 0 | 0 | 0 | 0 | 3 | 1 | 0 | 0 | 2 | 2 | 0 | 1 | 0 | 0 | 2 | 0 | 0 | 1 | 1 | 1 |
| 3  | 0 | 0 | 3 | 3 | 3 | 0 | 0 | 0 | 3 | 3 | 0 | 0 | 2 | 2 | 1 | 1 | 0 | 0 | 2 | 2 | 0 | 1 | 1 | 1 | 3 |
| 4  | 0 | 3 | 3 | 3 | 2 | 0 | 0 | 3 | 3 | 3 | 0 | 2 | 2 | 1 | 2 | 0 | 0 | 2 | 2 | 1 | 1 | 1 | 1 | 3 | 1 |
| 5  | 3 | 3 | 3 | 2 | 3 | 0 | 3 | 3 | 3 | 2 | 2 | 2 | 1 | 2 | 1 | 0 | 2 | 2 | 1 | 2 | 1 | 1 | 3 | 1 | 0 |
| 6  | 3 | 3 | 2 | 3 | 0 | 3 | 3 | 3 | 2 | 3 | 2 | 1 | 2 | 1 | 2 | 2 | 2 | 1 | 2 | 1 | 1 | 3 | 1 | 0 | 2 |
| 7  | 3 | 2 | 3 | 0 | 1 | 3 | 3 | 2 | 3 | 0 | 1 | 2 | 1 | 2 | 0 | 2 | 1 | 2 | 1 | 2 | 3 | 1 | 0 | 2 | 3 |
| 8  | 2 | 3 | 0 | 1 | 2 | 3 | 2 | 3 | 0 | 1 | 2 | 1 | 2 | 0 | 1 | 1 | 2 | 1 | 2 | 0 | 1 | 0 | 2 | 3 | 1 |
| 9  | 3 | 0 | 1 | 2 | 3 | 2 | 3 | 0 | 1 | 2 | 2 | 0 | 1 | 3 | 0 | 2 | 1 | 2 | 0 | 1 | 0 | 2 | 3 | 1 | 1 |
| 10 | 0 | 1 | 2 | 3 | 4 | 3 | 0 | 1 | 2 | 3 | 0 | 1 | 3 | 0 | 3 | 1 | 2 | 0 | 1 | 3 | 2 | 3 | 1 | 1 | 0 |

The initial LFSR states can be determined again in accordance with Cramer's rule. For instance, assume that 5 consecutive 4-state symbols are received related to the first 5 states of the LFSR. These 5 symbols are [2 1 3 4 2] (or [1 0 2 3 1] in origin 0). The determining equations are provided by the first 5 output states (of SR5) which are provided in the following table.

| moment | | | | | |
|---|---|---|---|---|---|
| 1 | 1 | 1 | 1 | 1 | 2 |
| 2 | 1 | 1 | 1 | 2 | 2 |
| 3 | 1 | 1 | 2 | 2 | 2 |
| 4 | 1 | 2 | 2 | 2 | 4 |
| 5 | 2 | 2 | 2 | 4 | 2 |

The determinant can be evaluated by the procedure as illustrated by a Matlab listing in FIG. 22. The determinant of the above matrix is 1. Cramer's rule is then evaluated by replacing the relevant columns by $[2\ 1\ 3\ 4\ 2]^T$ and determining the determinant. This is illustrated by the Matlab script listing in FIG. 23. This will generate the initial states [2 3 2 1 1] (or [1 2 1 0 0] in origin 0). The initial state of the LFSR is then {[1 0 0 0 0]; [0 2 0 0 0]; [0 0 1 0 0]; [0 0 0 0 0] and [0 0 0 0]}. One can easily check these results by evaluating the expressions $c1*a1+c2*a2+c3*a3+c4*a4+c5*a5$ wherein [c1 c2 c3 c4 c5] are provided by the states of SR5 and [a1 a2 a3 a4 a5] is the just evaluated initial state vector. The operations '*' and '+' are the multiplication and addition over GF(4).

A similar approach can be used when the symbols do not represent consecutive states. Furthermore, the initial state and the state tables now allow determining the LFSR state on a synchronization moment.

The above in one embodiment of the present invention is applied to synchronize two or more LFSRs that are used or can be used for instance for generating an n-state Gold sequence.

Code Hopping

The above methods can be easily implemented and are extremely fast. As an aspect of the present invention the above described methods are part of a code hopping method. That is: a receiver is instructed to jump on a defined moment to initialize an LFSR state that is different from the state that would establish previous synchronization. For instance, the LFSR determines a synchronization state based on received symbols. However, rather than implementing the evaluated synchronization states the LFSR implements new and different LFSR states which coincides with the same states that are being implemented at the transmitting side.

For instance, a receiver receives a series of k symbols representing k consecutive LFSR states and prepares for synchronization on moment (k+1). However, instead of loading the appropriate states to continue the LFSR from state on moment k to moment k+1, the LFSR is instructed to load the LFSR states related to a moment p rather than (k+1). At the same time, the transmitter also changes to this new LFSR state, and accordingly, the transmitter and receiver are synchronized. Code hopping can be useful for several situations, of which one is that an external and potentially unauthorized receiver that is listening in to data transmission will lose synchronization with the transmitter. If 'state hopping' only happens once and the transmitter continues to send synchronization symbols with predetermined positions, the opportunity exists to re-synchronize again rapidly. However, a transmitter may 'hop' continuously, each time before completing two complete series of synchronization symbols. The receiver may be programmed with instructions that tell it when to synchronize. Synchronization may also take place after different number of symbols, for instance a first sync after k symbols, a second sync after k+p1 symbols, a third sync after k+p2 symbols and the like.

How the LFSR hops through states may be determined by a programmed rule. Such a rule may be determined by a sequence and in a manner as disclosed in U.S. Pat. No. 7,930,331 issued on Apr. 19, 2011, which is incorporated herein by reference. Such a rule can be implemented in different receivers and allow these receivers to have orthogonal codes relative to each other. It also allows a transmitter to assign a code (by assigning an LFSR synchronization state) to a receiver that connects to a network that is orthogonal to receivers that are already operating in the network.

For instance, a quality measure between a transmitter and receiver may determine that the selected code is not optimal based on interfering signals. The transmitter may determine a code that is assumed to provide better quality. In yet a further embodiment of the present invention, a transmitter may provide the receiver with instructions to initiate a completely different LFSR, either with the same number of shift register elements, but with different taps. The receiver may also be instructed to initialize and use an LFSR with a different number of shift register elements, and includes the synchronizing states. It was already shown that an LFSR, for instance LFSR 1300 or 1900 are determined by a vector of coefficients. A transmitter may provide a receiver with a vector of coefficients that defines a new LFSR. A device may hop through different LFSRs based on external instructions or by internally programmed instructions. The synchronization steps are described for a receiver. In accordance with an aspect of the present invention these methods apply to the receiving side of a receiver. In general a receiver also has transmitting capabilities. In accordance with a further aspect of the present invention the methods as provided herein also apply to the transmitting side of a receiver. Furthermore, in accordance with an aspect of the present invention, the methods provided herein apply to a transmitting device on a transmitter in a network and to the receiving side of a transmitter in a network.

A distinction between a transmitter and a receiver in a network in accordance with an aspect of the present invention is that the transmitter may take care of a plurality of receivers and may have additional network management and code and synchronization capabilities. A receiver usually acts in a following mode, following instructions of the transmitter. However, on some occasions a receiver, based for instance on a quality measure, may determine a lack of quality and request a change of code properties or initializes these changes, which are followed by the transmitter in some cases.

Thus, as one or more aspects of the present invention a method is provided for binary code hopping for sequences of binary symbols, wherein a symbol is represented by a signal. In accordance with an aspect of the present invention a sequence is generated by a single sequence generator. As an aspect of the present invention a binary code hop is created by modifying a synchronization state of a generator. As an aspect of the present invention a binary code hop is created by changing taps in an LFSR. As an aspect of the present invention a binary code hop is created by changing the length or number of shift register elements of an equivalent LFSR. As an aspect of the present invention a binary code hop is related to a combination sequence such as a Gold sequence. As an aspect of the present invention a binary code hop is created by changing the generating states and/or the configuration and/or the length of the LFSR of one or more of the constituting LFSRs of the combined generators. As an aspect of the present invention a binary code hop is part of a series of code hops related to a plurality of devices in such a way that the hopping rules of each of the devices create orthogonal codes and/or at least different codes.

Furthermore, as one or more aspects of the present invention a method is provided for code hopping for sequences of non-binary symbols, wherein a non-binary symbol is represented by a single or a plurality of signals. In accordance with an aspect of the present invention a non-binary sequence is generated by a single sequence generator. As an aspect of the present invention a non-binary code hop is created by modifying a synchronization state of the sequence generator. As an aspect of the present invention a non-binary code hop is created by changing taps or by changing inverters or multipliers in an LFSR. As an aspect of the present invention a non-binary code hop is created by changing the length or number of shift register elements of an equivalent LFSR. As an aspect of the present invention a non-binary code hop is related to a combination sequence such as a non-binary Gold sequence. As an aspect of the present invention a non-binary code hop is created by changing the generating states and/or the configuration and/or the length of the LFSR of one or more of the constituting LFSRs of the combined generators. As an aspect of the present invention a non-binary code hop is part of a series of code hops related to a plurality of devices in such a way that the hopping rules of each of the devices create orthogonal codes and/or at least different non-binary codes.

One additional difference between binary and non-binary methods is in the combining of the constituting sequences. In the non-binary case such combining uses at least an implementation of at least an n by n n-state switching function. The combining function may be defined over a finite field GF(n). However, that is not required. In general the combining function has to be a reversible n-state function. In one embodiment a combination n-state sequence may be created by combining at least three sequences. Furthermore, each of the inputs of the n-state combining function may be provided with an n-state multiplier or an n-state inverter which is preferably reversible. A non-binary code hop in a non-binary combination function may thus include modifying or inserting or removing a multiplier or n-state inverter at an input or output of the combining function. A non-binary code hop may also exist of modifying the combining function, for instance from one reversible n-state function into another n-state reversible n-state function, wherein an n-state combining function may have a non-commutative truth table. A combination non-binary sequence may be a non-binary Gold sequence before and after a code hop.

Figure 24:
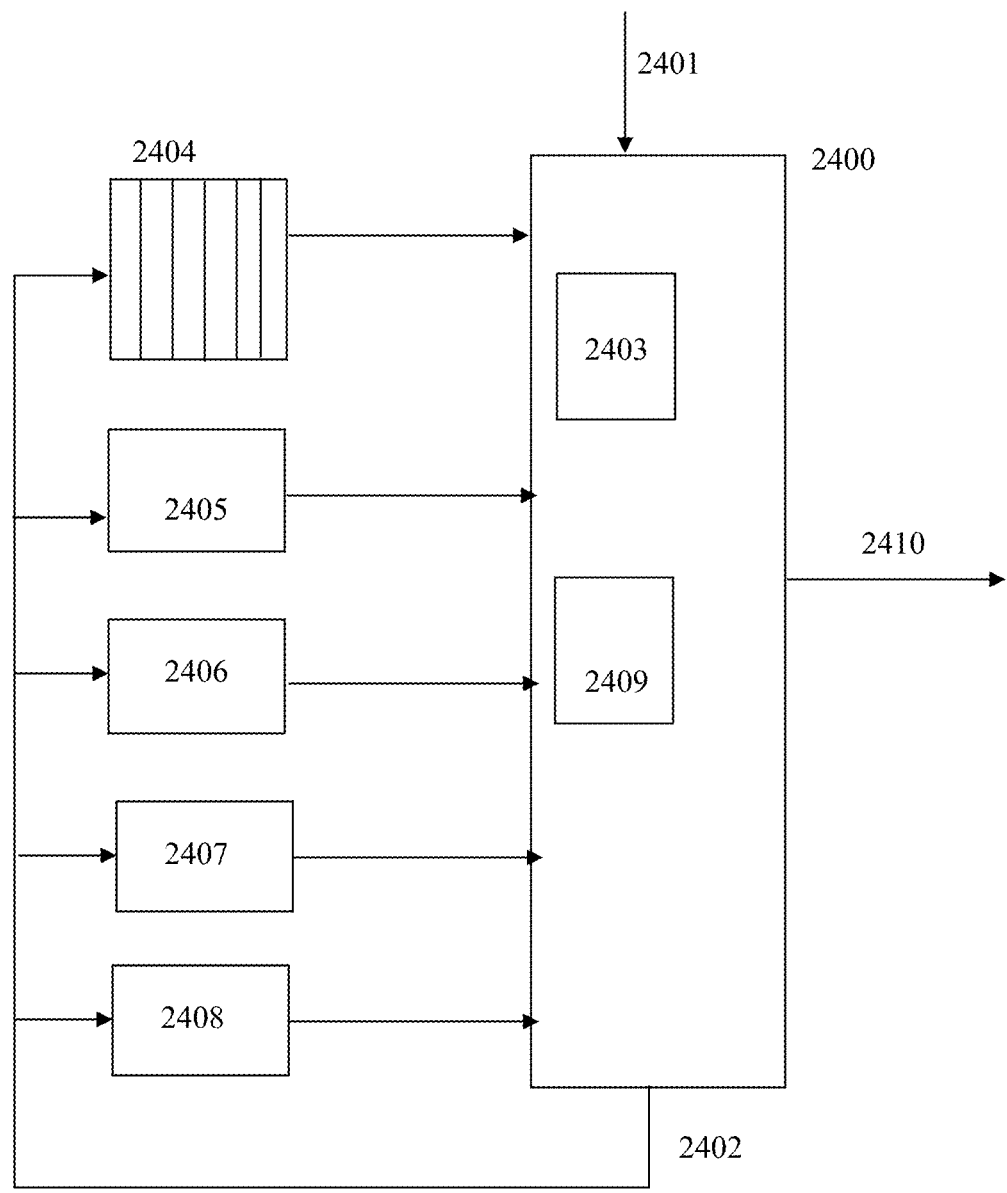
FIG. 24 is a diagram of a system in accordance with at least one aspect of the present invention.

FIG. 24 illustrates a code hopping device 2400 that is part of a communication device. The code hopping device has a processor 2403 that implements an LFSR related sequence generator, which may be a generator for binary or non-binary sequences. The sequence is provided on an output 2410 and can be used for purposes such as coding, decoding, scrambling, descrambling, opening a lock or any other useful purpose.

The processor sends, when required request for data, for instance to build or to synchronize a sequence generator to memories 2404, 2405, 2406 and 2407. There can be more memories or there can be fewer memories. The number of 4 memories or 4 partitions of memories is only provided as an illustrative example. For instance, memory 2404 in one embodiment of the present invention contains 1 or more tables related to an LFSR that provides for instance the coefficients of expressions that determine a synchronization position of an LFSR. System 2400 may receive on input 2401 data that reflects sample symbols for a synchronization moment. The processor 2403 provides an instruction on 2402 to 2404 to provide correct coefficients to calculate the synchronization states.

Data on 2401 may contain instructions for a modified synchronization or even to reconfigure the LFSR. For instance 2401 may contain data to hop code by creating new LFSR coefficients without changing the length of the LFSR. Processor 2403 may obtain these coefficients from memory 2405 and which will be received by 2403 to reconfigure the LFSR by providing instructions via 2402. An instruction for the correct synchronization state may be provided via 2402 simultaneously or near simultaneously to memory 2404.

Data on 2401 may contain instructions for a completely new LFSR, with a changed length and new coefficients. The design of such a new LFSR may be contained in 2407 and instructions to provide these LFSR data are provided through 2402. These data are in one embodiment provided to 2403 which will implement the new LFSR and may get required synchronization data from 2404.

Data on 2401 may contain data to change a design of a composition sequence such as a non-binary n-state Gold sequence. Relevant truth table for n-state functions to combine at least two n-state sequences are in one embodiment of the present invention stored in memory 2408 and at least one table is provided to processor 2403 after a request over 2402.

Much of the processing power in this example is performed by processor 2403. In a further embodiment of the present invention, processing functions of 2403 are distributed to other, parallel, processors, which are controlled by 2403.

In yet a further embodiment of the present invention, the code hopping for a session, such as during a connection with a counterpart device, is determined by a set of instructions stored in 2409, which sets forth how and when code hopping takes place. In that case 2409 replaces much of the instructions that were provided by 2401 and 2401 may provide at least only the sample symbols for synchronization. Instructions in 2409 may be pre-programmed and are known to a counterpart device to comply with data that is synchronous and understandable to 2400. In a further embodiment the instructions in 2409 are provided as part of an initialization or an update of a communication session or as part of device maintenance, for instance when it enters a cell in a cellular phone system.

In accordance with a further aspect of the present invention, code hopping includes a change in state of the LFSR. That is, the LFSR changes from an n-state operation into a p-state operation, wherein n and p are different integers greater than 1. For instance, an LFSR changes from binary mode into non-binary mode, or from non-binary mode into binary mode or from a first non-binary mode into a second non-binary mode. For instance, the LFSR changes from a binary LFSR into a 4-state LFSR. Or the LFSR changes from a 4-state mode into an 8-state mode, or from a 5-state mode into a 4-state mode, for instance. The LFSR in those cases applies shift register elements that can hold an n-state symbol and applies n-state switching or logic functions. A non-binary symbol may be represented by a plurality of binary symbols and signals.

In accordance with yet a further aspect, code hopping includes changing the clock rate with which a binary or non-binary LFSR generates symbols on an output. For instance a symbol rate changes from f1 n-state symbols per second to f2 n-state symbols per second, wherein f1 and f2 are different rates. For instance f1 is about 1000 symbols per second and f2 is about 1050 symbols per second, or f1 is about 1,000,000 symbols per second and f2 is about 500,000 symbols per second. Or f1 is about 1 billion symbols per second and f2 is about 2 billion symbols per second. Clearly, the processor works at a speed that cannot be even remotely approached by human capability.

A change in symbol rate may be combined with a change in state of the symbols, but such a combination is not required. It is noted that a change of symbol rate and a change of generating binary symbols in case of a binary circuit may be two separate occurrences. For instance one may code hop between a binary code and a 4-state code with the same symbol rate. However, if a 4-state symbol is represented by 2 bits and the output of the generator provides serial bit streams, then the bit rate will be at least doubled while the symbol rate stays the same.

In accordance with yet another aspect of the present invention, a code hop includes a hop between an n-state symbol and a p-state symbol with n and p being integers greater than 1 and p being different from n with an output providing a binary representation of the p-state and n-state symbol with an equal bit-rate on an output.

The code hopping and/or synchronization methods as provided herein as an aspect of the present invention, as they apply to binary or non-binary sequences are applied in different applications. An application, in accordance with an aspect of the present invention, is in a data storage system as part of writing or retrieving data. The storage system, in accordance with an aspect of the present invention, is a media player, which contains audio data and/or video data. An application, in accordance with an aspect of the present invention, is in a communication system, which may be in a receiver or a transmitter. The communication system, in accordance with an aspect of the present invention, is a wired communication system and the code hopping and/or synchronization is performed on or as part of a computer that is connected to a network, which may be the Internet. The communication system, in accordance with an aspect of the present invention, is a wireless communication system. In accordance with an aspect of the present invention, the code hopping and/or synchronization is performed on or as part of a mobile or a fixed computing device that is connected to a wireless network, which may be connected to the Internet. The device may be a PDA, a smart phone, a cellular phone, a tablet computer, an eReader, a router, or a media player. The device connected to a wireless network may also be a fixed computing device that for instance controls a cell or a set environment in a wireless network. For instance the device may be a router in a home or a building or a vehicle. The device in a wireless application may also be a portable or a fixed controller of a lock or a mechanism that is enabled to generate a binary sequence or a non-binary sequence that opens or closes the lock or the mechanism. Herein, the terms value, state, n-valued, n-state, n-valued logic, n-state logic, and n-state switching are used. The terms value and state are assumed to be identical. The same applies to logic and switching. A logic is assumed to be identical to switching and a logic table is identical to a switching table.

Accordingly, it is possible and very easy to synchronize combination type sequences. One merely inputs received symbols in appropriate expressions, evaluates these expressions and re-initializes the relevant LFSRs at the relevant moment with these synchronization values. In an alternative embodiment, one can use the synchronization states of at least two LFSRs as a basis of an address for a stored symbol of a combination type of sequence and use this address to find the correct symbol at the synchronization moment.

In one embodiment of the present invention, a receiver receives symbols that allow it to synchronize with a transmitter. This appears to imply that all received symbols must have been already generated. The symbols may in one embodiment not be generated symbols, but a symbol that represents a state of an LFSR at a certain moment. If those moments are known to the receiver and it is known to the receiver what the moment of synchronization is, then a symbol may also be a future state of an LFSR or a future generated symbol by the LFSR. LFSR based generators are cyclic and thus a symbol in the past is a symbol in the future for an LFSR.

Figure 25:
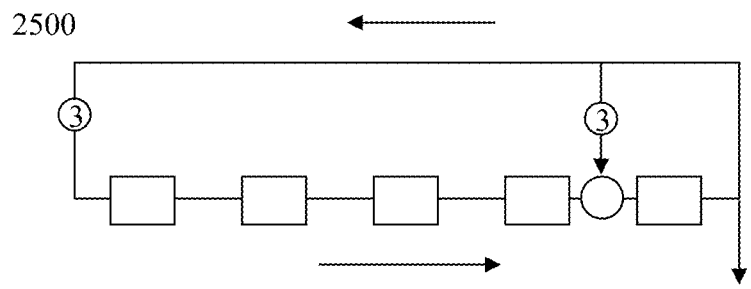
FIGS. 25-26 illustrate LFSRs in accordance with an aspect of the present invention.
Figure 26:
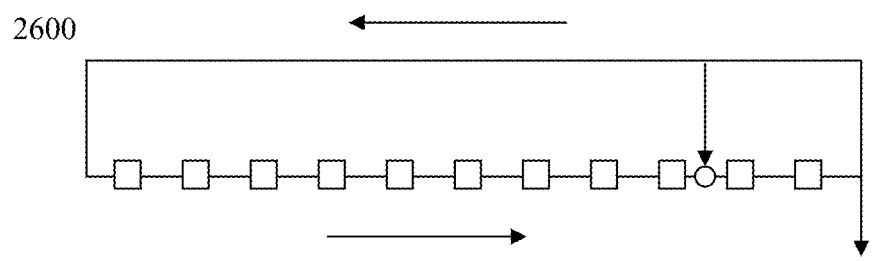

FIGS. 25 and 26 are diagrams that illustrate two different ways to generate different sequences. Sequence generator 2500 of FIG. 25 is a 4-state 5-stage sequence generator. It generates a 4-state m-sequence of length 1023 4-state symbols. By representing each 4-state symbol by 2 bits one generates a sequence of 2046 bits. FIG. 26 2600 shows a binary 11-stage sequence generator, which can generate a binary sequence of 2047 bits. One can reduce the sequence of 2600 to 2046 bits and correlate it with the equivalent binary sequence of 2500. One will find that the two sequences are uncorrelated. In accordance with an aspect of the present invention a code hop exits of a switch between sequence generators. Each sequence generated by an LFSR can be detected by an equivalent n-state LFSR based descrambler. This aspect is disclosed in U.S. Pat. No. 7,580,472 to Lablans issued on Aug. 25, 2009 which is incorporated herein by reference.

A simple way to detect the presence of the sequence generated by 2500 is to have the same sequence generator at the receiver and start at the same initial state. The locally generated sequence and a received sequence are then combined by a function scomp4 of which the truth table is provided below followed by an accumulator.

| scomp4 | 0 | 1 | 2 | 3 |
|--------|---|---|---|---|
| 0 | 0 | 1 | 1 | 1 |
| 1 | 1 | 0 | 1 | 1 |
| 2 | 1 | 1 | 0 | 1 |
| 3 | 1 | 1 | 1 | 0 |

If both sequences are identical then the device implementing 'scomp4' will only generate 0s and the accumulated value is 0. If another sequence was received then the accumulated value will be greater than 1. One may also use the Fibonacci configuration of the sequence generator and a corresponding self-synchronizing descrambler.

Rolling codes are known and are for instance applied in car locks. Such rolling codes are disclosed in for instance U.S. Pat. No. 7,623,663 to Farris et al. and issued on Nov. 24, 2009 which is incorporated herein by reference. The problem with some of the rolling codes is that the lock and/or the opening device have to remember a last locking code to open the lock with the new code. In accordance with an aspect of the present invention a lock is provided with a method by the opener to detect a code to open the lock. This illustrated in FIG. 27. A locking/unlocking system is applied to lock or unlock for instance a bolt or lock or a motor or other mechanism 2704 that is related to an object or structure 2703. For instance 2704 is a bolt in a door of a car 2703. The device 2704 may also be a relays in a starting-motor 2703. The bolt 2704 may also be part of a lock in a door 2703. The device 2704 may also be a motor in a garage door opener 2703. The opening system contains a keying or opening/closing instruction transmitting device 2700, which is preferably a mobile and portable device and a receiver 2702. The transmitting device 2700 and the receiving device 2702 are able to communicate, preferably wirelessly. At least device 2700 is able to transmit, for instance via antenna 2712, to receiving device 2702, by receiving antenna 2714. In a further embodiment 2702 is enabled to transmit to 2700 and 2700 is enabled to receive and process the received signal.

The device 2700 has a coder 2707 which includes a transmitter and all functions to condition the signal for transmission. In a further embodiment of the present invention 2707 also is a receiver with sufficient receiving and detection capabilities. In one embodiment of the present invention the processor 2707 has access to memories 2705 and 2706. Memory 2705 contains the coefficients (taps, length of LFSR, state of LFSR and values of multipliers for n-state with n>2) of an LFSR based generator from which 2707 can implement in program the LFSR. Memory 2706 contains a code that determines the initial state of the LFSR. A configuration of an LFSR in 2705 has a specific address, and is directly associated with a corresponding address of the corresponding initial state in 2706. It is preferable to apply LFSRs with sufficient number of initial states. In one embodiment of the present invention one may have at least 1000 possible initial states per LFSR and at least 500 possible LFSR configurations. It is noted that the above examples use m-sequence generators. However, for at least the embodiment of FIG. 27 this is not required and thus over 500 different configurations for a 11-state binary LFSRs are possible. The same applies to the 5-stage 4-state LFSR. These numbers greatly increase for higher values of n. For instance, for an 8-state 5-stage LFSR there are over 25,000 different configurations and over 25,000 initial states. Larger numbers of shift register elements or a higher value logic such as an 256-state logic will dramatically increase the number of configurations. Even more configurations are possible if one interleaves or combines the symbols of two different or more sequence generators.

Figure 28:
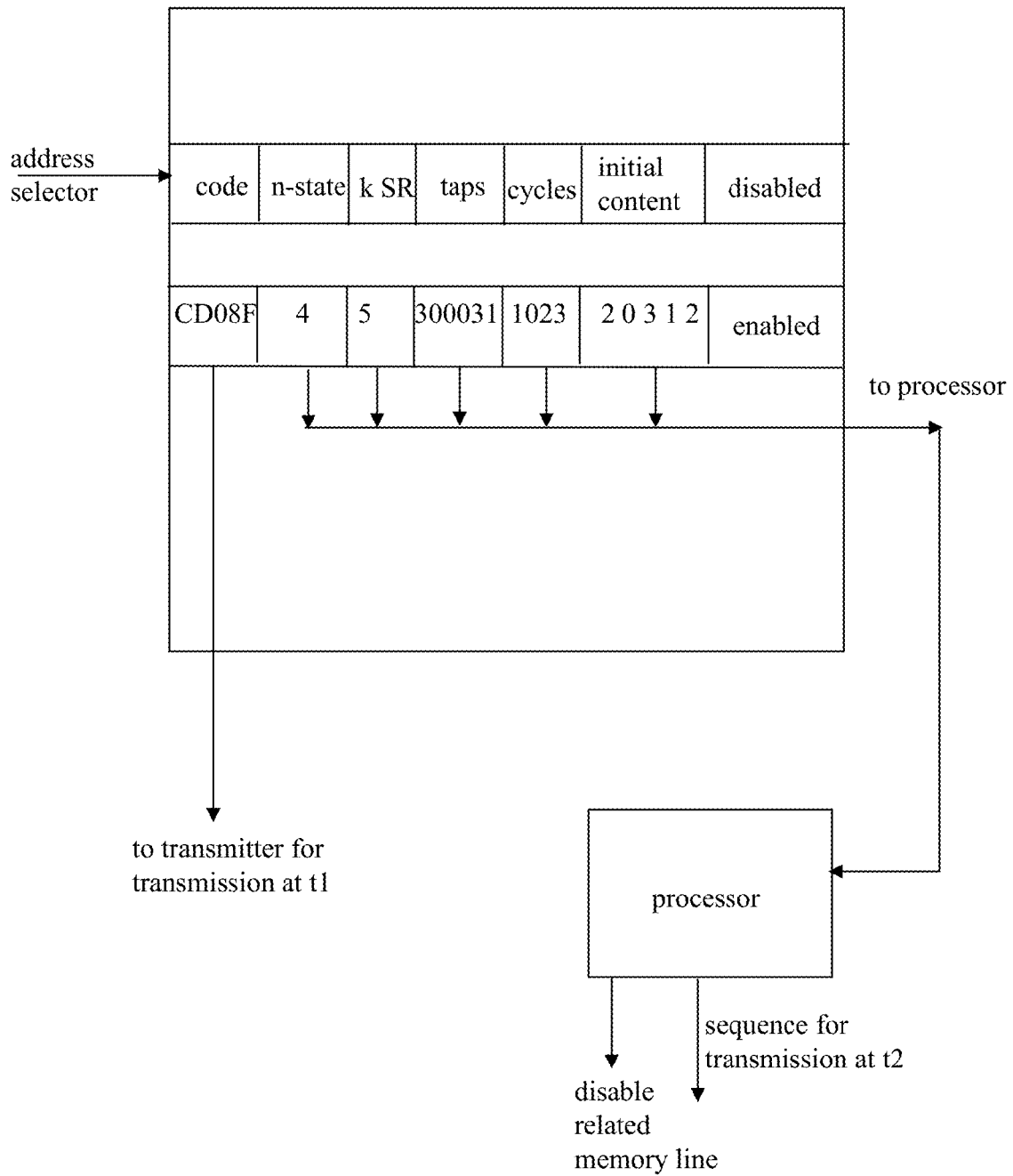

In one embodiment of the present invention different configurations are randomized in order and initial states are randomized. For instance assume that one has k1 generator configurations and k2 initial LFSR states. Assume that k3 different combinations of configurations and initial states are required. In one embodiment of the present invention one generates a first set of k1 different codes and a second set of k2 different codes and a set of k3 different codes. One orders the k1 configurations numbered from 1:k1 and the k2 initial states form 1:k2. Then one randomizes the k1 different codes and the k2 different codes. Next, each configuration is assigned to a first complying initial state, and is then assigned one of the randomized k3 codes. The table is stored in two memories, one in the transmitting device and one in the receiving device. This is illustrated in FIG. 28. In the opening or transmitting device an address selector selects a line in the memory. The address selector may step randomly through the memory to select a first enabled code. After using a code the code will be disabled or erased so it cannot be used anymore. A code herein is a set of symbols, either binary symbols or non-binary symbols, which are represented by signals. A sequence herein is also a set of symbols, either binary or non-binary, that may be determined or generated by a sequence generator, each symbol being represented by a signal. Devices and machines herein operate on signals and generate signals.

Randomization programs are well known. In one example one can generate a sequence of at least 100,000 5-bytes random numbers out of over 1 billion numbers, for instance by initializing a 5-element 256 state m-sequence LFSR with an initial state and generate 100,000 different 5-byte states by running the LFSR for 100,000 cycles. These 5-byte numbers are indexed as 1 through 100,000. One then takes a next at least 5-byte 256 state LFSR and generates that LFSR from a non-zero state for at least 100,000 cycles. In one example, the index 1 of the list of 5-byte random numbers is assigned the first 5-byte state of the second LFSR and so forth. This creates a list of 100,000 random 5-byte numbers. One can use several scrambling passes with different LFSRs to randomize. One can do the same with the configuration and initial states of the LFSR based sequence generators, and match a 5-byte number with a configuration and an initial state.

The randomized codes are stored in an order in a table, wherein a code is an address to a content which is the associated configuration and initial state. Accordingly, one can select a code in the table and find a corresponding LFSR configuration and initial state. As stated above, a code may also correspond to multiple LFSR configurations each with its own initial state. The data in these tables may include: number of shift register elements, the state n, the taps and the corresponding multipliers or inverters and the initial state, as well as the number of clock cycles that the LFSR will run, and possibly other properties. For instance, one line has a code [CD08F] which corresponds to a 4-state LFSR with 5 shift register elements and the configuration [300031] which is initialized with [2 0 3 1 2] and will be run to generate 1023 4-state symbols, for instance as 2046 binary symbols. This is of course an LFSR as shown in FIG. 25. The code will be provided to the transmitter to be sent at a time (or a time delay) t1. At time t2 (or time delay t2) the transmitter will transmit the sequence to the receiver.

The receiver has a similar construction, with a difference that the memory is code content addressable, for instance by using a translation table. The receiver will implement a decoder that will for instance only generate symbols 0 if the correct sequence is received and decoded.

Figure 29:
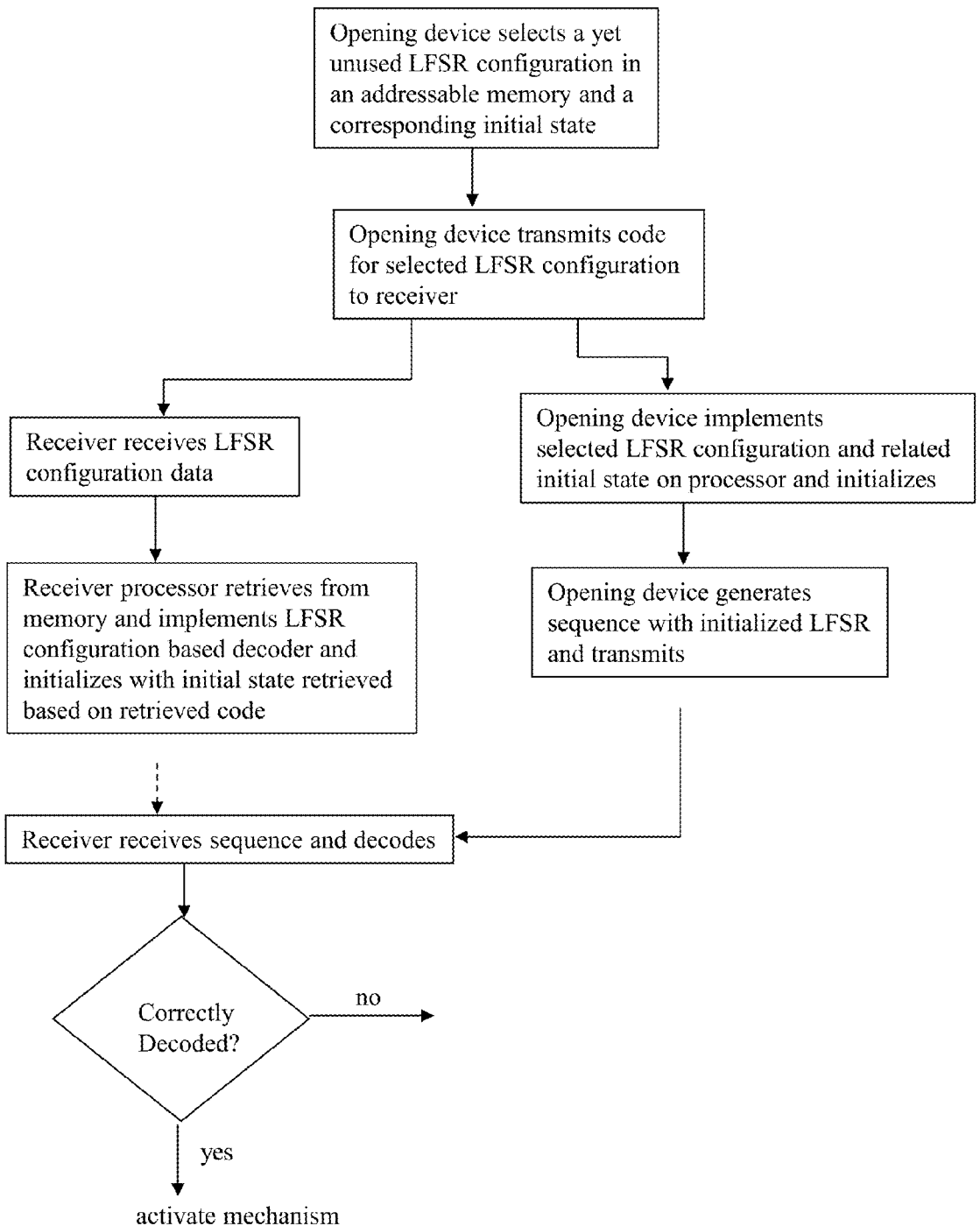
FIG. 29 illustrates steps in accordance with an aspect of the present invention.

The steps of coder and decoder are illustrated in FIG. 29. If the correct sequence is decoded, the decoder sends a signal to either a bolt, a relays or any other mechanism that will be activated. Thus a door, a structure or a lock can be opened or closed or some mechanism can be started or stopped. After receiving a code, the related configuration or memory address will be disabled. A malfeasant may for instance send a correct ID code but will generally be unable to follow up with the correct sequence. By disabling an ID code after it has been used once, one cannot try by brute force to crack a code.

A malfeasant may try to disable all codes by sending each ID of them to a receiver. One can address this issue by creating a code of at least 5 bytes, which covers over a trillion different codes. By selecting at random of codes of at least 5 bytes it is impossible for a malfeasant to generate all possible codes in a reasonable time. If the receiver is set and required to wait at least for instance 0.5 sec, or least 1 second to process a new code, then a malfeasant has to generate all codes for about 30,000 days or a 100 years to generate all possible 5 bytes ID codes. It is again emphasized that one may generate an ID code that is accepted by a receiver, but it is extremely unlikely that a correct follow-up sequence will be generated.

By using a sequence generator which generates long sequences, the chance to generate a correct sequence without having set-up information is extremely and infinitesimally small. One can generate very long sequences by using limited stored data. It is noted that one can also generate off-line different sequences, for instance of 5 bytes, which are then 40 bits long, which can be stored in memory and assigned a unique ID code. While these stored sequences are much smaller than the sequences that are generated in real time, they are still difficult to predict. For instance 100,000 different codes, each having a 5 bytes ID and a 5 bytes sequence, require 1 Meg bytes in storage, which is nowadays a fairly small part of the large memory that is currently available to mobile computing devices. Accordingly, storing an ID and a related sequence and exchanges ID codes and stored sequences with a receiving device is part of a method to open or close a lock or start or stop a mechanism provided in accordance with an aspect of the present invention.

In one embodiment of the present invention an ID code and the sequence are transmitted with an intermediate pause. One may also buffer the sequence at the receiving side, allowing to send the ID, virtually instantly followed by the sequence. In a further embodiment of the present invention a wake-up signal is received and processed by a processor, as an indication to a processor to prepare for either an ID code, or a sequence or any other signal that requires a preparation time for the processor.

Accordingly, a method and system are provided wherein a key instructs a lock on an opening method that is highly secure. Current technologies provide memories with a size in GigaBytes range, for instance 1 Gbyte, 10 GByte, 16 GByte, 64 GByte, 256 GByte and higher than 256 GByte. Within current technologies it is possible to store at least 1 billion different sequence generator configurations and corresponding IDs on a memory in a transmitting devices and at least the same number of detector device configurations and corresponding IDs on a receiving device. In a further embodiment a generator configuration and a detector configuration is replaced by an actual unique sequence of at least 5 bytes, but preferably of more than 5 bytes, preferably of at least 10 bytes long, more preferably of at least 25 bytes long and most preferably of at least 50 bytes long. That means that in one embodiment of the present invention an activation system has at least one billion different activation codes (initial code plus corresponding activating sequence). Both in the embodiments wherein generator and detector configurations are applied, as the embodiment wherein the actual sequences are stored in the transmitting and receiving device are highly unlikely to be predicted and cracked. Disabling previously applied codes further prevents re-use of codes and sequences. The extremely large number of possible codes and sequences and randomization of combinations of codes (IDs) with sequences or sequence generators/detectors renders prediction of a sequence following a code extremely unlikely, thus providing a high level of security.

In a further embodiment of the present invention one can generate the coding table for the opener and the content addressable table for the receiver off-line on a computer and store the tables on for instance a USB memory device. The opener table can be uploaded to opener 2700 via a USB port 2715 and the content addressable table to the receiver via USB port 2717.

In a further embodiment of the present invention one can reverse some of the steps of the opening code. That is: in a first step an opener sends a request to a receiver for an opening sequence. In response, the processor 2708 selects a code and sends it to the opener. In that case 2700 has the content addressable memory. However, 2700 still will generate the sequence and 2702 will still receive and decode the sequence.

In a further embodiment the receiver 2700 is a portable and mobile and wireless computing device such as a cell phone, a smart phone, a tablet such as an iPAD®, a Personal Digital Assistant (PDA), an eReader, a laptop computer or a dedicated opener that is enabled to perform steps of the present invention.

A problem with a portable and mobile device is that it can easily be stolen. If important opening sequences, for instance for a car, a home or an office are stored on the device without protection, a malfeasant can easily open all doors using a stolen device. One can protect all code generating sequences by using some secret password. However, in many cases that defies the convenience of quickly opening a lock, for instance opening a garage door from a car.

In a further aspect of the present invention the opener has a sensor which is enabled to decode a pattern that is provided as a physical signal, such as a video signal, an acoustical signal or a pressure signal. The sensor thus is a camera, a microphone or a touch screen. The problem with acoustical and visible signals is that these signals can easily be stolen by a malfeasant. Thus, in accordance with an aspect of the present invention, an opener is provided with a touch-screen that can be programmed to learn a touch pattern provided by a user and detect the pattern with a high accuracy as a code to enable the generation of a start of the process that will open/close a lock or start/stop a mechanism.

Figure 30:
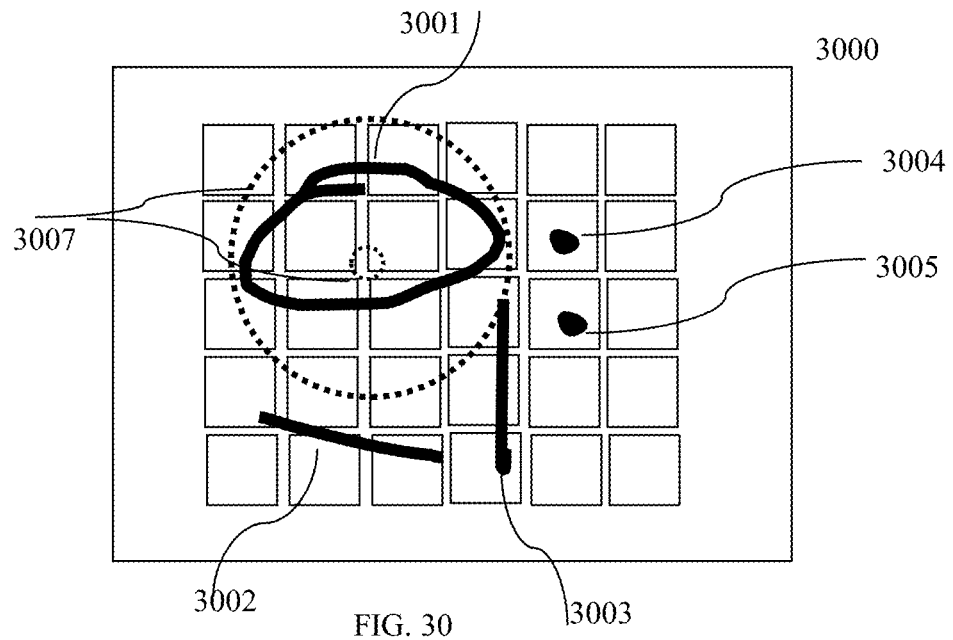
FIGS. 30-31 illustrate touch diagrams.
Figure 31:
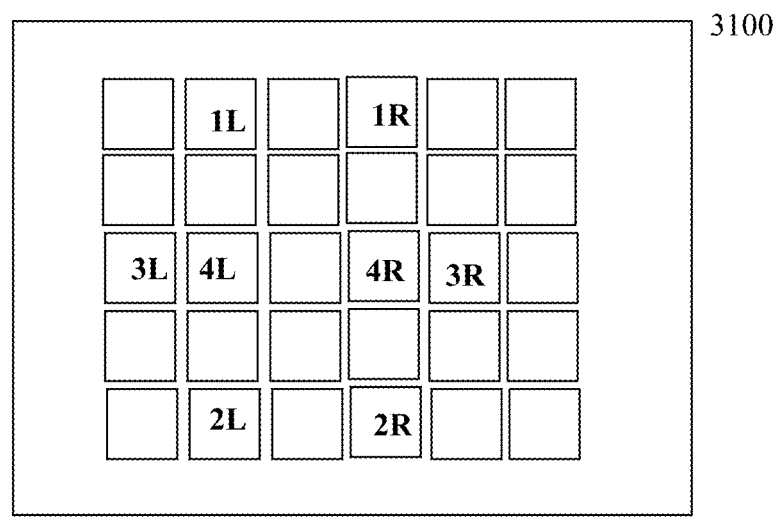

This is illustrated in FIGS. 30 and 31. For instance in FIG. 30 a touch screen 3000 is enabled to detect and follow a tactile movement on the screen. The squares imply a certain resolution of the screen. It is assumed that the touch-screen has a sufficient resolution to detect any drawn pattern at a very rapid rate. This requires that in one embodiment of the present invention the touch screen has a responsiveness of less than 10 ms; that in one embodiment of the present invention the touch screen has a responsiveness of less than 5 ms; and that in one embodiment of the present invention the touch screen has a responsiveness of not more than 1 ms. A responsiveness means that after a tactile input the touched section restores from the tactile touch and is ready to receive another signal.

For instance a computing device can be programmed to receive, and detect a circle (3001) a tap (3004 and 3005) a horizontal line (3002) and a vertical line (3003) for instance. The computing device can be trained to learn the patterns within certain scales. For instance the circle is learned with a diameter between 1 and 3 cm, while the orientation of drawing is clockwise, and the time of completion is less than 40 ms. Similar restrictions can be applied to the other patterns. Furthermore, the pattern has to be completed in a specific order (3001, 3002, 3003, 3004 and 3005) and within a certain time, or with predefined pauses. Other patterns are of course possible and may include triangles (in different orientations) rectangles, free squiggles, use of multiple fingers or touch points at the same time, etc. This allows a fairly complex pattern to be performed by a user in a very short time. Different patterns can be learned for different opening events or different locks. Once the pattern is recognized, the device will authorize and initiate the process for generating an opening code.

In one embodiment of the present invention the sensor is a touchpad and has no screen function.

In at least one aspect of the present invention the processor does not determine a relative position of the patterns on the touch screen or touch pad. In accordance with another aspect of the present invention, a processor also determines at least a relative position of the drawn tactile patterns. In accordance with one aspect of the present invention, the touch screen or touch pad does not represent a keyboard during touching.

A further aspect of the present invention is illustrated in FIG. 31. Herein a touch screen or a touch pad detects a touch of at least two different objects, which may be fingers, and which touch the pad or screen substantially at the same time. FIG. 31 illustrates a touch pattern of two fingers in a pattern (1L,1R), followed by (2L,2R), then by (3L,3R) and ended with (4L,4R). An additional requirement may be a relative position of the touches. Yet a further requirement may be a timing of touching.

Figure 32:
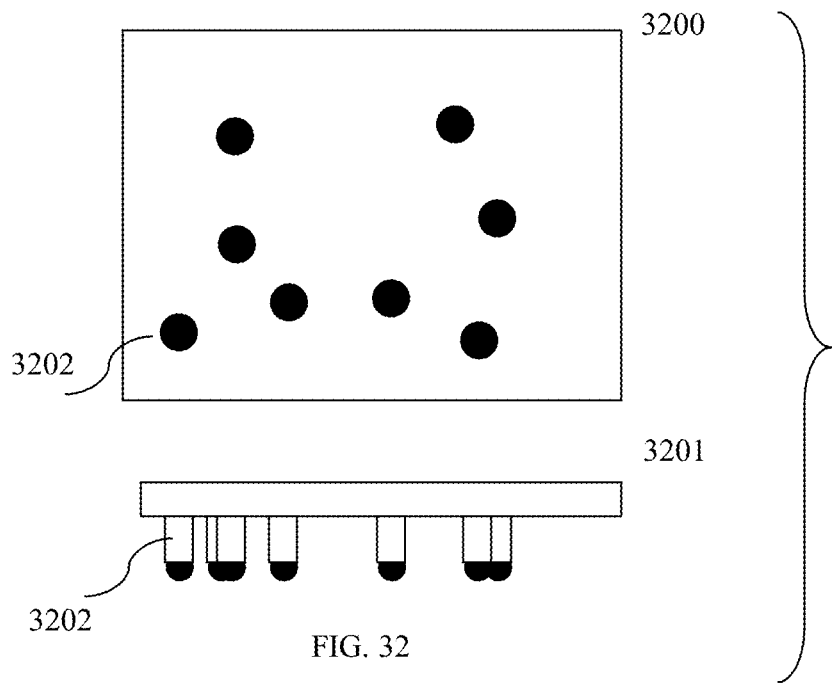
FIG. 32 illustrates a tool in accordance with an aspect of the present invention; a FIG. 33 illustrates a processor based system enabled to perform steps in accordance with at least one aspect of the present invention.

FIG. 32 illustrates an embodiment of the present invention wherein a touch tool is applied. The touch tool shown as 3200 from a view upon the bottom and 3201 from the side has multiple pins of which 3202 is identified that stick out and when pressed upon a touch screen or touch pad will simultaneously or substantially simultaneously activate a pattern. The pins may be provided with a spring loaded or flexible part that touches the pad. The pins can be moved around the pad, so as to create different patterns of multiple pins. The tool may have two or three pins that serve as a fixed orientation for the processor to distinguish and detect a specific pattern. Based on the sensitivity and resolution of the pad the tool can be small, for instance having a surface of about 1 cm$^2$, to about 4 cm$^2$ or to about 9 cm$^2$, or any size that will meet the requirements of the touch pad. The tool has at minimum 3 pins, preferably 7 pins, more preferably about 10 pins. Furthermore, the tool has at least 9 free positions that can hold a pin, and more preferably 16 or more positions to hold a pin. In one embodiment, one can buy a prefabricated tool with fixed positions of the pins. The computing device learns the pattern, and the tool is used to activate the device. After a certain time, one uses a new prefabricated tool with a different pattern. In one embodiment of the present invention all pins have substantially the same cross sectional shape and cross-sectional size. In a further embodiment of the present invention the cross-sectional shape of at least two pins are different, and also the cross-sectional size of at least two pins are different.

As a further aspect of the present invention a touch pad or touch screen of sufficient recovery speed and sensitivity is used to detect a drumming pattern to activate a locking/unlocking process. For instance, a user may train the processor to recognize a drum beat on the touch pad which contains a series of triplets followed by single strokes separated by pauses. One can train the processor only to accept a specific drum pattern completed within a certain time, wherein the notes are adequately and evenly spaced or wherein specific finger patterns (one, two, three or more fingers) are detected.

The requirements can be expanded to drum beats, or patterns that are virtually impossible for humans to perform with one hand. In that case a tool is provided that performs the tasks as required.

In accordance with a further aspect of the present invention the successful completion, or repetition of a given touch pattern, be it is shape, movement, order, number of fingers, timing, complexity etc. may be implemented as a game or an application on a computer or a mobile computing device. One may record a certain pattern on a pad and provide it as a challenge to other users to repeat the given patterns with the required accuracy and/or speed for instance by posting it on a social website. In accordance with a further aspect of the present invention a training program is provided that trains a human on a touch screen a beat or a touch pattern. For instance, a processor may draw on a touch screen, initially in a slow sequence, a pattern, allowing a person to track with a finger. Tempo and complexity may be increased as a user demonstrates mastering a pattern at a slow rate. Ultimately, a computer draws on a touch screen a pattern that has to be followed by a user with one or more fingers. This, in one embodiment of the present invention, can be shown on a touch screen of a computing device, and allows a user to follow the pattern shown by the computer.

In one embodiment of the present invention, the computing device with the touch screen is connected to a network. This allows at least two users connected to the network to have a contest. As a first aspect of the present invention a first user provides a pattern that is recorded by a computer and has to be repeated by a second user. The computer may indicate where and how the second user fails to follow the pattern. This allows the second user to adjust. It should be clear that one can hold a context wherein at least two users demonstrate a capability to make up and execute a (complex) pattern on a touch pad and a capability of a second user to repeat such a pattern. One may also challenge the first user to repeat the pattern that was applied as a challenge. The touching patterns from each of the users can be recorded and shown to viewers who are also connected to the network. In a further embodiment of the present invention a pattern is executed on a touch pad and may be perform with one finger, two fingers, one hand or two or more hands. In yet a further embodiment of the present invention the patterns are performed on a touch pad and shown on a separate screen.

Clearly, very complex touching patterns are possible on at least one touch pad, which may be a touch screen. The complexity of a touching pattern may be caused by its shape (lines, geometric shapes like circles, rectangles, triangles, crosses, relative angles of lines), the speed and/or relative position of touching, number of required concurrent touch points, distance between touch points, order of touch points, timing of touch points, number of different touch pads, for instance at least two at the same time and/or any combination of the above and other limitations that determine a touching complexity.

A pattern may be stored in a computer memory and replayed on a screen, showing lines, points, figures or other indications including providing a sound signal to allow a user to learn the pattern. Such a display by a computer may include displaying only part of a pattern, preferably at a lower than a final speed, allowing a user to learn the pattern. The speed and number of elements of a pattern may increase as a user continues to try to repeat the pattern as displayed by the computer. The learning may also be a competitive activity, either against another uses or against the computer, wherein the repeating of displayed patterns continues until a user makes a mistake in a repeat, either by not being timely or by touching a pad with a wrong pattern element in a series of pattern elements. In a further embodiment of the present invention, a computer sets an accuracy for a pattern, either in time, location, order, and/or shape. For instance circle shape may be required to be between an outer circle and an inner circle as shown in FIG. 30 with boundaries 3007.

Figure 33:
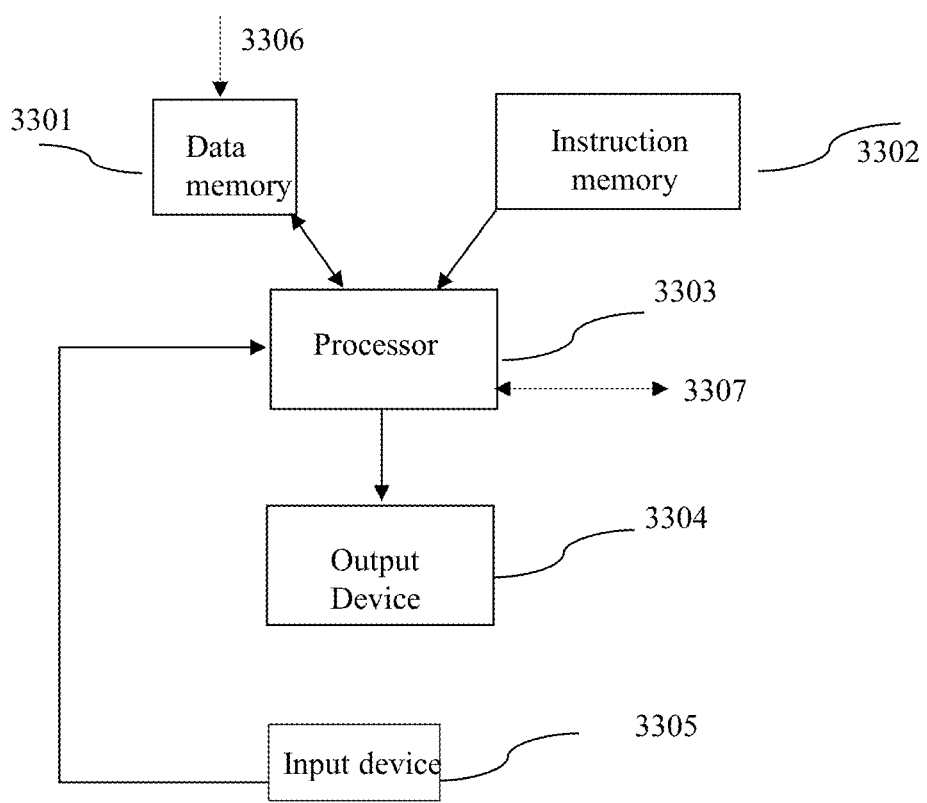

In a further embodiment of the present invention, steps of the methods as provided herein are programmed and executed on a processor, which is part of a computing device. The methods as provided herein are in one embodiment of the present invention implemented on a system or a computer device. A system illustrated in FIG. 33 and as described herein is enabled for receiving, processing and generating data. The system is provided with data that can be stored on a memory 3301. Data may be obtained from a sensor or may be provided from a data source. Data may be provided on an input 3306. The processor is also provided or programmed with an instruction set or program executing the methods of the present invention is stored on a memory 3302 and is provided to the processor 3303, which executes the instructions of 3302 to process the data from 3301. Data, such as an image or any other signal resulting from the processor can be outputted on an output device 3304, which may be a display to display data or a loudspeaker to provide an acoustic signal. The processor also has a communication channel 3307 to receive external data from a communication device and to transmit data, for instance to an external device. The system in one embodiment of the present invention has an input device 3305, which may be a keyboard, a mouse, a touch pad or any other device that can generated data to be provided to processor 3303. The processor can be dedicated hardware. However, the processor can also be a CPU or any other computing device that can execute the instructions of 3302. Accordingly, the system as illustrated in FIG. 33 provides a system for data processing resulting from a sensor or any other data source and is enabled to execute the steps of the methods as provided herein as an aspect of the present invention.

Figure 27:
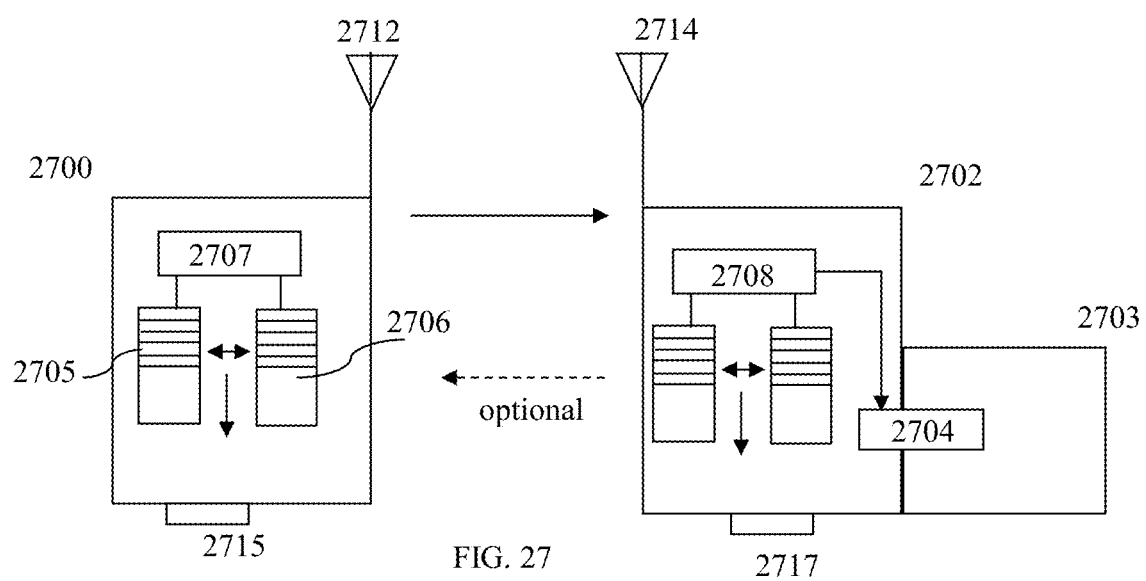
FIGS. 27 and 28 are diagrams of a sequence generating system in accordance with an aspect of the present invention.

It should be clear that the mechanism as illustrated in for instance FIG. 27 can be used for locking and unlocking of a lock by activating a mechanism. It is known that malfeasants may try to steal a signal or a code. Aspects of the present invention prevent that as all codes and sequences are preferably used only once. One known attack method is to jam the receiver and to intercept the signals transmitted by the transmitter, which is preferably a portable and mobile transmitter. When the mechanism is not activated due to the jamming, a user may be compelled to activate the transmitter again, thus generating a new code. The expectation by the malfeasant is that the jammed code can be used later as not being recognized and processed by the receiver. In accordance with an aspect of the present invention, all codes in the transmitter and in the receiver are ordered in a specific order. Thus, when a receiver receives a new code, it corresponds to a specific order of arrangements in the list of codes, and thus sequence detectors, in its memory. In accordance with an aspect of the present invention, the receiver de-activates all codes and thus sequence detectors that precede a current code. This renders code stealing by jamming as useless, as these codes will have been deactivated after a user sends the current code that is not jammed.

Figure 35:
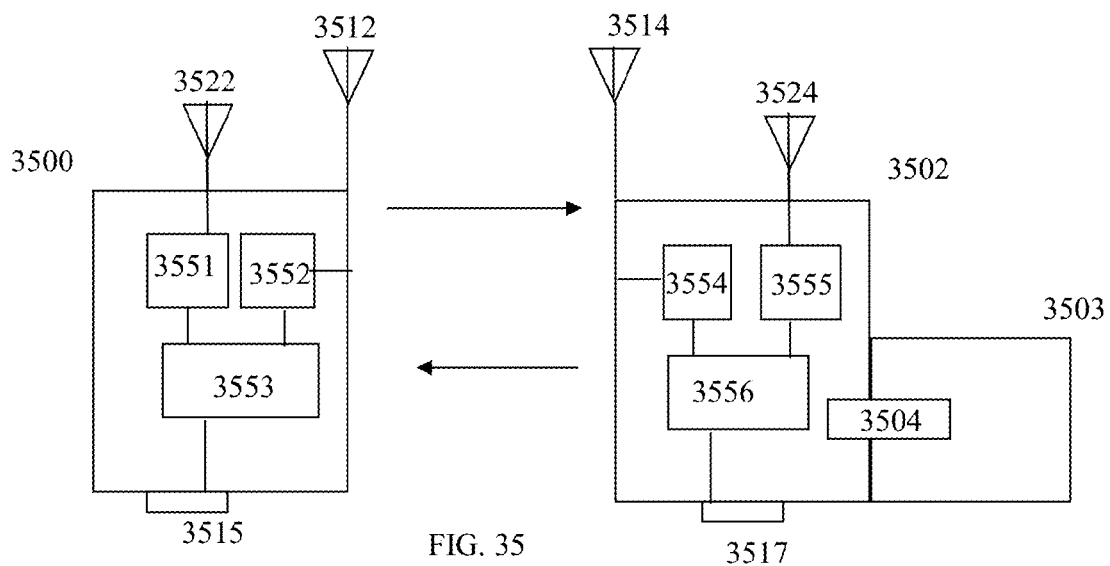
FIG. 35 illustrates a system in accordance with aspects of the present invention.

In accordance with an aspect of the present invention both the devices 2700 and 2702 which were called transmitter and receiver, respectively can both transmit and receive signals as illustrated in FIG. 35. Device 3500 can transmit and receive and device 3502 can receive and transmit. Devices 3500 and 3502 can exchange data via antenna 3512 with transmitter/receiver 3552 and antenna 3514 with transmitter/receiver 3554. In a further embodiment of the present invention devices 3500 and 3502 have antenna 3522 with transmitter/receiver 3551 and antenna 3524 with transmitter/receiver 3555 to exchange signals with a remote station. The transceiver 3551 and 3552 preferably work on different frequency bands and also preferably with different modulation methods to make jamming more difficult. For instance antenna 3522 is an antenna for a wireless telephone network or a WiFi connection and antenna 3512 is for a local direct channel. The same applies for the counterpart transceivers in 3502. The transceivers are connected to a processor/memory 3553 in 3500 and to a processor memory 3556 in 3502. An interface 3504 may be a hard physical interface such as a bolt in a lock or a motor that is activated after the previously explained steps to unlock a device 3503, which may be a car door, a garage door, a starter engine or any other mechanism. If 3503 is a stationary object, the communication system 3555 and antenna 3524 may be replaced with a wired rather than a wireless communication system.

Devices 3500 and 3503 in one embodiment also have hard mechanical connectors 3515 and 3517 that allow each device to be connected to each other or to another device with corresponding connectors. For instance 3500 may be a compute stick with connector 3515 that can be mounted on a receiving structure or connector 3517. The absence of wireless signals provides a barrier to stealing signals.

Device 3503 may be part of a computing device, such as a memory or a processor or any other electronic device that needs to be unlocked using the steps provided earlier. The device 3503 may for instance be disables as being non-responsive or being disconnected from power until a correct sequence is detected.

The ability to send and receive of the devices allows in one embodiment of the present invention the use of an additional code that confirms receipt of the sequence or of any code. The devices 3500 and 3502 inform each other with unique codes corresponding to a specific unlocking code, that a proper signal has been received. If such a confirmation signal is not received either 3500 and/or 3502 will stop with processing a specific code or sequence.

Thus, there are actually three communication channels between 3500 and 3502. One channel is a direct wireless channel, another channel is a channel via a server which may be wireless or partially wireless and one channel is a direct channel that is difficult to intercept via direct connectors. The direct connectors may be galvanic; they may also be non-galvanic like optical.

In one embodiment of the present invention the confirmation code is transmitted via the separate channel to a remote server. While the server may not be aware of the sequence and sequence detector that are activated, it is aware that an unlocking is in progress. It may send instructions to stop the progress of unlocking if not validated responses are detected from either 3500 or 3502.

In accordance with yet a further aspect of the present invention, the original alert code that determines the sequence detector is not sent from 3500 to 3502, but 3500 sends via 3522 a message to a central server a code that indicates that a device 3503 associated with 3502 needs to be opened. The central server sends a unique code for a sequence generator to device 3500 and a unique code corresponding to the sequence generator to device 3502. Timing of transmitting the sequence via 3512 to 3514 can be set and monitored by the central server. Potential malfeasant interference or jamming or other interference can be detected and an operator of 3500 is alerted. As a consequence, the user may switch to a hard connector unlocking using 3515 and 3517.

In one embodiment of the present invention may duplicate the initial exchange of codes via the two wireless channels. That is: 3500 transmits a code to 3502 via antennas 3512 and 3514. However, at the same time an alert is sent to a server via 3522 and 3502 receives via 3524 an alert that a code has been transmitted by 3500. Device 3502 has to respond via 3524 to the server that the alert has been received as well as the code from 3512. In response to the answer from 3502 the server transmits a signal or message to 3500 to confirm that 3502 has received the code and to continue with preparing to receive and detect the sequence.

The existence of a second channel also allows to determine the moments and times of transmission and even temporarily stop transmission at moments determined at the server and instructed to 3500 and 3502. In accordance with an aspect of the present invention, the server may use the existing channels to loop a code or message to itself via 3522 to 3512 to 3514 to 3524 to itself and from itself to 3524 to 3514 to 3512 to 3522 to itself, to check that all channels are open and to check transmission times to make sure that the signals are not delayed or retransmitted by a malfeasant or non-authorized device. The device that initiates the activation or opening of another device such as device 2700 in FIG. 27 or device 3500 in FIG. 35 may be called the opener herein. The opener in one embodiment of the present invention is a dedicated device such as a key fob or a dedicated housing. It may contain a push button to start initiation. It may also contain a small screen or indicators such as LEDs to indicate a status or progress of the activation sequence. In one embodiment of the present invention, the opening device is a smartphone or other mobile and portable computing device. In one embodiment of the present invention, the opening device is a wearable mobile device such as integrated in a head or spectacles frame. In one embodiment of the present invention, the opening device is a wearable mobile device such as smart watch that a user wears around a part of the arm like a watch.

A smartphone herein is a mobile and portable wireless communication and computing device with a processor and a memory storing data and instructions, at least one wireless communication system for transmission and receiving of wireless signals and preferably two wireless communication systems: one for local communication, such as Bluetooth or WiFi and one system for communication with a wireless telephone network, an antenna, a display screen, preferably a touch screen enabled to receive user input, a power source such as a battery, preferably a GPS receiver, a gyroscope, accelerometers, a digital compass, a microphone, a loudspeaker, a camera and other devices that would be beneficial. Examples of smartphones are the iPhone® marketed by Apple® and the Galaxy® marketed by Samsung® and others. A smartwatches such as marketed by Apple as the Apple Watch and Android smartwatches in one embodiment of the present invention are configured and enabled to perform the steps of the present invention.

In one embodiment of the present invention the device that is to be opened detects or is made aware of a presence of the opener and requests the opener to start the opening sequence. In one embodiment of the present invention the opening device has to be unlocked for starting the opening sequence. This unlocking can take place by some typed in code or pattern on the device or a recognition of the user from sound or image data. Such recognition may be based on voice recognition on the mobile device or a unique bio signature such as a fingerprint. It may also depend on recognition of an image of for instance the face of the user of the opener.

In accordance with an aspect of the present invention, recognition takes place on the side of the device that needs to be activated. For instance if the to be activated device is a lock in a door such as a car door, a house door or other entry, a camera or a microphone is attached to the structure to photograph a user who seeks entry. The processor inside the to be activated structure, such as 3556, or a processor inside a remote server is programmed and trained to recognize a validated user, for instance from voice or image data. In one embodiment of the present invention, once the user is recognized or validated the opener device is unlocked remotely, by a signal from the to be opened device or by the remote server, to start the activation of the opening sequence.

The choice to involve a remote server or the to be opened device to provide critical permissions and data depends on the location of the device to be opened. In some cases the remote server may be out of range or not reachable by wireless communication.

In one embodiment of the present invention both the opener and the to be opened device have a GPS (global positioning system) capability. Activation of a mechanism is only possible when the two devices are within a defined range of each other. The GPS system on the opener is in one embodiment of the present invention used as a validation code. GPS locations of the opener device over a series of predetermined moments are stored on the opener device and on a remote server and may be called a spatial-time (GPS) status of the device. Preferably, the GPS device is highly accurate and determine a location within preferably 10 meters, more preferably within a meter of actual location and most preferably within 10 cm of accuracy of the actual location. The GPS may sample the location once an hour or more often or less often and stores the GPS coordinates of the locations on the device and provides the GPS coordinates to the remote server. With a high accuracy, the GPS coordinates or at least the most detailed part of such coordinates, are completely random. One may store for instance 10 locations as a validation code. One may also store more or fewer location codes. The device can be validated by comparing the GPS locations of predetermined moments stored on the mobile opener device with the GPS locations of predetermined moments stored on the remote server. The comparison may take place at the device to be opened or at the remote server or at the opener device.

GPS coordinates can be determined at several levels of precision. For instance, it is possible to determine GPS coordinates of a GPS receiver with an accuracy of 6 decimal digits, after the period. For instance a GPS receiver may be determined to be at 40.783193 decimal degrees North (latitude) and at −74.501578 decimal degrees (longitude) West in GPS coordinates. Moving the receiver at the same longitude to latitude 40.783194 corresponds to a movement of about 19 cm. Moving the receiver at the same latitude 40.783193 from longitude −74.501578 to longitude −74.501579 corresponds to a movement of about 9 cm. Accordingly, even minor movements generate very different GPS coordinates. When the GPS coordinates have been determined they are stored on a memory in the receiving device and they are sent to a remote server. In accordance with an aspect of the present invention the relevant part of the GPS coordinates is stored on the device and transmitted to a remote server at the same time, at about the same time or at least within 5 minutes of being determined.

It is not required to be accurate in determining the actual GPS coordinates, as long as different GPS coordinates are generated when relatively small distances have been moved, wherein a change in coordinates should be established when the device moves at least preferably at least 1 meter, more preferably at least 50 cm and most preferably at least 20 cm. Because actual accuracy is not important for the aspect of validation, but perhaps for other aspects, the device in one embodiment of the present invention determines or uses a first established set of coordinates and calculates or estimates GPS coordinates using a gyroscope and/or accelerometers and/or a digital compass that is or are part of the device. Such methods are explained in for instance U.S. patent application Ser. No. 13/522,329 to Chen et al. filed on Feb. 14, 2011 and which is incorporated herein by reference. GPS receivers, gyroscopes, accelerometers, digital compass, step detectors, heart rate detectors, blood pressure meters, sound level meters, thermometers, pressure meters, and all other devices that can measure environmental variables are captured herein by the term sensor unless indicated differently.

The purpose of the validation step is to provide unique variable data that is unique or appears to be randomly generated by the user and is either impossible or extremely difficult to predict. Generating the GPS coordinates would largely meet that requirement, because at the level of positional change (within 20 cm) it is usually impossible to predict where a user would be at any moment within a 20 cm accuracy. It is pointed out that it is the unpredictable variability that is important and not necessarily the accuracy of the determination. In one embodiment of the present invention readings from other sensors or sensing elements can be used to determine a validation sequence. One such sensor is a digital compass in a device such as a smartphone; one such sensor is an accelerometer in a device such as a smartphone; one such sensor is a sound level meter in a device such as a smartphone, other sensors are also fully contemplated. All sensors have in common that even over a limited time data is generated that is different from a previous data sampling. The data is related to the device such as a smartphone or a smartwatch or any other mobile and portable wireless computing device that can measure physical conditions and transmits data to a server.

In one embodiment of the present invention personal health data, such as number of heartbeats, paces walked, or even blood pressure is used as validation data and whereof a series of data points is taken over time and stored on the device and transmitted to a remote server. The rate of taking storing and transmission of data points is preferably over long enough a period to secure variability, such as one per 4 hours, or once per 2 hours, or once per hour, or once per half hour or even higher. All data points in one embodiment of the present invention are provided with a time stamp and/or a GPS stamp of the smartphone or related device. The number of datapoints to validate the device is in one embodiment of the present invention 10 or less datapoints and in another embodiment of the present invention greater than 10 datapoints.

One is never entirely sure that data transmitted from the mobile device to the remote server is not intercepted by a malfeasant or unexpected or unknown source. In accordance with an aspect of the present invention an additional security step is provided to assure privacy and in which publicly available variable data is locally received at the mobile device and at the remote server. In one embodiment of the present invention, both devices are connected to the Internet and download data with a timestamp that is known to be variable. For instance, that data may be a value of stock price of a share on the stock exchange or an exchange rate for currency exchange. However, these quotes are usually invariable over holidays and weekends. Variable values are generated by weather stations such as operated by the National Oceanic and Atmospheric Administration (NOAA) and generate variable data at least every 6 minutes.

Both the mobile device and the remote server can access the web site to download a line of data established at a predefined moment as an independent validation stamp to be attached to the recorded sensor data from the mobile device. Because the independent data source was previously determined and not transmitted over a communication channel an outside source, a malfeasant cannot know, without hacking into one of the devices what the independent stamp is. There are hundreds of NOAA weather stations that can be alternately accessed.

In one embodiment of the present invention a website is created that streams random or pseudo-random numbers provided with a time stamp. For instance the listed streamed number is updated and changed at least every second, at least every 2 seconds, at least every 30 second, at least every minute, at least 5 minutes or at least every 15 minutes. Preferably a number of websites running different random or pseudo-random number generators is operated. For instance 10, 50 or at least 100 websites from which the numbers are accessed independently by a remote server and a mobile device. In one embodiment of the present invention two or more, 10 or more, or 100 or more random number generators, which may be LFSR based sequence generators are operated and accessible.

To further secure the independent stamp, in one embodiment of the present invention the data is modified, for instance multiplied or added or by any other operation, to hide its original meaning before it is included as a validation stamp.

By exchanging the validation data, the mobile device can be validated by either the processor in the to be opened device or by a remote server.

The aspects of the present invention are not limited to a specific unlocking or activating or opening or closing mechanism. The steps may be applied to unlocking and locking of doors, including garage doors, building doors, vehicle doors, engines, motors both rotating and linear or any other actuator that can be actuated by a signal. The aspects can also be applied to activating or deactivating a processor that requires a form of validation or code to progress or stop with activities. For instance, steps including the validation steps, as provided above, in accordance with an aspect of the present invention is applied are applied to access a website or an account on a website.

The steps provided herein are to be executed by processors, which may be programmable logic circuits or customized dedicated circuits. The instruction may be stored in a memory which may be a RAM, ROM or any other memory that can be created and read by a processor. The steps of the present invention may be programmed in a programming language such as C++, Swift, Objective C, Java, Matlab or any other programming language that is appropriate. The developed code of the steps is transformed into a set of instructions that is used by a processor to perform the actual steps. Such transformations of programs into executable instructions is known, for instance by using compilers. Accordingly, by executing the instructions that perform the steps as provided herein with one or more aspects of the invention a general type processor is transformed into a dedicated machine that can open, activate, unlock, deactivate or stop a mechanism in a manner based on a structure that is believed not to exist prior to this invention.

Processors, memories, computers and storage devices all work with signals as inputs and outputs. Processors, and thus computers, herein are switching machines that process signals from one or more inputs to at least one output. The processing between inputs and outputs can be represented by a switching or logic table. These switching or logic tables, as provided earlier above herein are represented by symbols usually arranged in a vector for inverters and a matrix for a 2-input switching table. Input and output symbols represent input and output signals. Because of the programmability of computers and the abilities of programmed computers it is often assumed that processors specifically or computers more in general are processing symbols.

Processors do not process symbols, they process signals. To arrive at the concept of symbols, input and output transducers are required. For instance one input device is a keyboard that generates signals by activating individual keys. Each key on a keyboard represents a symbol, like a letter or a digit or any other character. When a key on a keyboard is activated a signal is generated that is provided to the processor for processing. The signal generated by an activated key may be a single signal or a plurality of signals, such as a byte of 8 bits, each bit being an individual binary signal. Because of preset switching and processing rules, a byte representing a symbol, in many cases representing an ASCII character, is processed appropriately by the processor. However, the processor in that case processes the byte, being a set of signals and not a character and not a symbol.

After processing by the processor the same symbols may be produced on an output, as being retrieved from a memory or storage device, or may have been modified, for instance if the signal represent digits in a number and the processing is done in accordance with switching rules that can be interpreted by humans as addition. The output signals provided on an output have to be presented in a form that is understandable as symbols or characters. This can take place by activating elements of a nixie tube, by activating lighting elements such as LEDs, by activating graphical elements on a screen that represent symbols or characters or by generating by a printer pre-programmed print patterns that represent characters. No symbols exist inside a processor, only signals or storage phenomena such as charges that represent a signal, magnetic domains or optical marks that represent characters or symbols.

Symbols are required for human understanding. What exist within computers are the signals. Accordingly the term symbol herein is understood to represent or to be equivalent to the term signal. Because of the equivalence, when the term symbol is used herein, it is designated to be identical to a signal so it is processed by a switching machine.

In accordance with an aspect of the present invention, a sequence generator is a message digest methods, or hashing method, such as but not limited to SHA-1, SHA-2 or SHA-3 and as known in the literature. For instance the Secure Hash Standard of NIST in NIST FIPS 180-4, defines a family of message digests, including: SHA-1, SHA-224, SHA-256, SHA-384, SHA-512, etc. The SHA methods are part of the Secure Hashing Algorithm family of message digests. The message digests generate digests from a message that can be fixed or variable in length and can be hundreds of bits or even 1024 bits or more. This is an attractive way to generate and detect sequences from a small code of for instance 5 bytes. However, one way to attack such digests when using known digest methods is to create libraries of digests of small codes. This may render the sequence predictable and thus unsecure and thus the locking or mechanism opening/closing sensitive to malfeasant attacks. In accordance with an aspect of the present invention, a code of an opening sequence is associated with an n-state reversible inverter. In general hashing methods such as the SHA family operate on packets of limited length, for instance on 8-bit bytes. In that case one may select n=256. There are 256 ! (factorial 256) different 256-state reversible inverters. In accordance with an aspect of the present invention, a bit-wise binary XOR operation on k bits (with $2 \hat{} k=n$) is then replaced by an n-state operation (which is not a bitwise XOR operation) on n-state symbols wherein a packet of k bits represents an n-state operation.

It is described in for instance the Ser. No. 15/244,985 and the Ser. No. 15/442,556 applications, incorporated herein by reference, how the modifications of switching functions takes place. One modification is called the Lab-transform, wherein n-state input symbols are modified by the n-state reversible inverter and then be processed by an n-state two-input switching function (such as equivalent bit-wise XORing for instance) and the output is inverted by the reversing n-state inverter that reverses the n-state inverter so that the combination of the n-state inverter and its reversing inverter is identity. The basic flow of data processing of the hashing such as provided in the SHA standards remains unchanged. However, the provided modification generates a completely unpredictable digest that cannot be reconstructed without knowledge of the n-state inverters. An activation code configuration may be an ID-code of for instance 5 or 10 or 20 or 50 or 100 bytes or more than 100 bytes. A transmitter sends the ID-code to a receiver that is part of an activation mechanism. Each ID-code is associated with an n-state inverter that is stored on a memory or is represented by a rule that determines the n-state inverter and the rule is stored. After sending an ID-code the transmission device generates a digest or hash value of the ID-code in accordance with an n-state switching function in the hash method that is determined by the n-state inverter. The receiving device has stored in memory the same corresponding hash configurations as in the transmitting device and is thus configured to generate the same hash value as will be received from the transmitter and after detecting identical locally generated and received hash value, activates the mechanism. In one embodiment of the present invention, an n-state inverter is used only one time and the configuration is disabled after usage. The above modification applies to any hashing or message digest method that operates on packets or groups of bits. Each group of bits or other group of p-state symbols can be processed as an n-state symbol with of course n>p.

Figure 36:
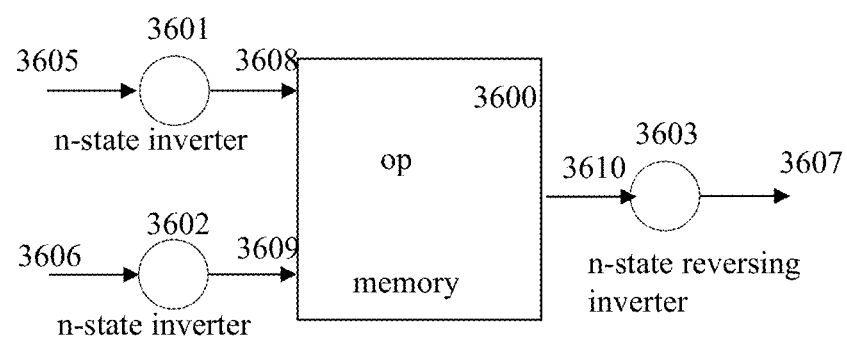
FIG. 36 illustrates a Lab-transformation in accordance with an aspect of the present invention.

The device illustrated in FIG. 36 transforms the n-state switching table implemented on 3600 that characterizes the device between inputs 3608 and 3609 and output 3610 to a device with a transformed n-state switching table that characterizes the device between inputs 3605 and 3606 and output 3607. The terminology is used herein that says that the original n-state switching table as stored and realized in memory or realized in a circuit is 'transformed' to a new or Lab-transformed n-state switching table that characterizes the device in FIG. 36 between 3605, 3606 and 3607. The transformation takes place by the n-state inverters 3601 and 3602 and its reversing inverter 3603. In one embodiment of the present invention inverter 3603 may not be used. In one embodiment of the present invention at least one of 3601, 3602 and 3603 is an identity inverter. In one embodiment of the present invention two of 3601, 3602 and 3603 is an identity inverter. The n-state inverter transformed n-state switching device or function in one embodiment of the present invention replaces k bitwise XOR devices as used in known and/or standard hashing or message digest methods. In that case $n=2^k$. For instance 8 XOR devices or functions form a 256-state addition over a finite field GF(256). The modification of the addition over GF(256) with at least one 256-state reversible inverter or a complete Lab-transformed addition over GF(256) will create a new switching function that completely modifies the digest or hash of a message compared to the standard hash.

A Lab-transformed n-state switching table is a first n-state n by n switching table transformed by using identical n-state reversible inverters to transform first and second inputs to the first n-state n by n switching table and transforms the output with a reversing inverter to the n-state reversible inverter that combined with the n-state reversible inverter forms an n-state identity inverter. An input to a table is an index or address of a row or a column of a 2-dimensional n by n table. For convenience a top input of a 2-input device such as in FIG. 36 corresponds with a row index of an n-state switching table and a bottom input corresponds to a column index of the n-state switching table. Inputs on a device receive a signal, not a symbol or a state. The symbol or state indication is merely used for convenience to represent that a symbol represents a signal and that different symbols indicate different signals.

In one embodiment of the present invention, the inverter used for modification is determined by external circumstances such as a GPS location and/or a temperature and/or a date and/or a time. This requires that corresponding transmitting and receiving devices are synchronized to use the same inverters. Furthermore padding may be used to enhance the length of a code for which the digest is determined. Preferably a code for which a digest is determined is padded, preferably in an interleaved way so that building digest libraries is less useful. Furthermore, assignment of inverters to a code is randomized so that two different (and unmatched) system will not use the same combination of codes and corresponding inverters.

The following patent applications, including the specifications, claims and drawings, are hereby incorporated by reference herein, as if they were fully set forth herein: (1) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Non-Provisional patent application Ser. No. 10/936,181, filed Sep. 8, 2004, entitled TERNARY AND HIGHER MULTI-VALUE SCRAMBLERS/DESCRAMBLERS; (3) U.S. Non-Provisional patent application Ser. No. 10/912,954, filed Aug. 6, 2004, entitled TERNARY AND HIGHER MULTI-VALUE SCRAMBLERS/DESCRAMBLERS; (4) U.S. Non-Provisional patent application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA; (5) U.S. Non-Provisional patent application Ser. No. 11/000,218, filed Nov. 30, 2004, entitled SINGLE AND COMPOSITE BINARY AND MULTI-VALUED LOGIC FUNCTIONS FROM GATES AND INVERTERS; (6) U.S. Non-Provisional patent application Ser. No. 11/065,836 filed Feb. 25, 2005, entitled GENERATION AND DETECTION OF NON-BINARY DIGITAL SEQUENCES; (7) U.S. Non-Provisional patent application Ser. No. 11/139,835 filed May 27, 2005, entitled Multi-Valued Digital Information Retaining Elements and Memory Devices; (8) U.S. Non-Provisional patent application Ser. No. 12/137,945 filed on Jun. 12, 2008, entitled Methods and Systems for Processing of n-State Symbols with XOR and EQUALITY Binary Functions; (9) U.S. Non-Provisional patent application Ser. No. 11/679,316, filed on Feb. 27, 2007, entitled METHODS AND APPARATUS IN FINITE FIELD POLYNOMIAL IMPLEMENTATIONS; (10) U.S. Non-Provisional patent application Ser. No. 11/696,261, filed on Apr. 4, 2007, entitled BINARY AND N-VALUED LFSR AND LFCSR BASED SCRAMBLERS, DESCRAMBLERS, SEQUENCE GENERATORS AND DETECTORS IN GALOIS CONFIGURATION; (11) U.S. Non-Provisional patent application Ser. No. 11/964,507 filed on Dec. 26, 2007, entitled IMPLEMENTING LOGIC FUNCTIONS WITH NON-MAGNITUDE BASED PHYSICAL PHENOMENA; (12) U.S. Non-Provisional patent application Ser. No. 12/273,262, filed on Nov. 18, 2008, entitled Methods and Systems for N-state Symbol Processing with Binary Devices; (13) U.S. patent application Ser. No. 11/566,725, filed on Dec. 5, 2006, entitled ERROR CORRECTING DECODING FOR CONVOLUTIONAL AND RECURSIVE SYSTEMATIC CONVOLUTIONAL ENCODED SEQUENCES; (14) U.S. patent application Ser. No. 11/555,730 filed on Nov. 2, 2006, entitled SCRAMBLING AND SELF-SYNCHRONIZING DESCRAMBLING METHODS FOR BINARY AND NON-BINARY DIGITAL SIGNALS NOT USING LFSRs; (15) U.S. patent application Ser. No. 11/680,719 filed on Mar. 1, 2007, entitled MULTI-VALUED CHECK SYMBOL CALCULATION IN ERROR DETECTION AND CORRECTION; and (16) U.S. patent application Ser. No. 11/739,189 filed on Apr. 24, 2007, entitled ERROR CORRECTION BY SYMBOL RECONSTRUCTION IN BINARY AND MULTI-VALUED CYCLIC CODES.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims.

The invention claimed is:

1. An apparatus with a memory and a processor to activate a device of a remote apparatus with a first signal sequence detector by a sequence of signals, comprising:
   the processor of the apparatus configured to retrieve a first code from a plurality of codes, each code being represented by a set of symbols stored in the memory of the apparatus, the first code representing a first signal sequence generator and wherein each of the plurality of codes determines one of a plurality of signal sequence generators, and the first code activates the first signal sequence detector of the remote apparatus that detects the sequence of signals generated by the first signal sequence generator;

a transmitter in the apparatus configured to transmit the first code;

the transmitter in the apparatus configured to transmit the sequence of signals generated by the first signal sequence generator after the first code has been transmitted;

the device of the remote apparatus is enabled to be activated when the first signal sequence detector detects the sequence of signals generated by the first signal sequence detector; and the apparatus is configured to disable the first code and to disable the first signal sequence generator on the apparatus after transmission of the first code and the apparatus is configured to activate a next code in the plurality of codes for retrieval and to enable a next signal sequence generator in the plurality of signal sequence generators associated with the next code after transmission of the first code.

2. The apparatus of claim 1, wherein:
the next code becomes the first code and the next signal sequence generator becomes the first signal sequence generator.

3. The apparatus of claim 1, wherein:
each code in the plurality of codes determines a different sequence of signals.

4. The apparatus of claim 1, wherein:
each code in the plurality of codes corresponds to a different configuration of a sequence generator on the processor of the apparatus.

5. The apparatus of claim 4, wherein the memory contains at least 25,000 (twenty-five thousand) different generator configurations.

6. The apparatus of claim 5, wherein each generator configuration has at least 25,000 different initial generating states.

7. The apparatus of claim 1, wherein:
the apparatus is configured to be activated to transmit the first code and to configure the first signal sequence generator on the processor of the apparatus to generate the sequence of signals.

8. The apparatus of claim 1, wherein each code in the plurality of codes is at least 5 bytes long.

9. The apparatus of claim 1, further comprising:
a receiver of the remote apparatus enabled to wirelessly receive signals transmitted by the transmitter of the apparatus;

a processor of the remote apparatus is configured to retrieve from a memory of the remote apparatus based on the first code received by the receiver of the remote apparatus from the transmitter of the apparatus, a configuration of the first signal sequence detector and to execute instructions to detect the sequence of signals; and the processor of the remote apparatus is configured to determine with the first signal sequence detector that a received sequence of signals is the sequence of signals and to activate the device of the remote apparatus.

10. The apparatus of claim 9, wherein the processor of the remote apparatus is configured to disable the configuration of the first signal sequence detector after the first code has been received by the receiver.

11. The apparatus of claim 1, wherein:
the sequence of signals is generated by a shift register based sequence generator of which a configuration is stored in the memory of the apparatus.

12. The apparatus of claim 1, wherein:
the sequence of signals is generated by a modified Secure Hash Standard (SHA) message digest.

13. The apparatus of claim 1, wherein the device is one of the group consisting of a motor, a lock, a bolt and a processor that requires validation for an operation to proceed.

14. A method, comprising:
retrieving by a processor on an apparatus of a first code in a plurality of codes stored on a memory, each code in the plurality of codes being represented by one or more symbols, the first code identifying a signal sequence generator associated with the first code;

installing the signal sequence generator associated with the first code being installed on the processor after retrieving the first code from the memory and wherein each of the plurality of codes identifies a different signal sequence generator;

transmitting by a transmitter of the apparatus of the first code to a receiver of a remote device;

generating by the signal sequence generator associated with the first code of the sequence of signals;

transmitting by the transmitter the sequence of signals to the receiver of the remote device;

activating on a processor of the remote device a signal sequence detector associated with the first code received from the apparatus;

detecting by the signal sequence detector associated with the first code the sequence of signals received from the apparatus;

activating an element of the remote device after the sequence of signals has been detected by the signal sequence detector associated with the first code;

disabling for retrieval the first code on the memory of the apparatus and disabling the signal sequence generator associated with the first code;

disabling the signal sequence detector associated with the first code after the first code has been received by the receiver of the remote device; and the processor of the apparatus enabling a next code and a next signal sequence generator associated with the next code.

15. The method of claim 14, wherein the codes in the plurality of codes have an order and all codes in the ordered plurality of codes that precede in order a received code are disabled.

16. The method of claim 14, wherein the element of the remote device includes one of the group consisting of a motor, a lock, a bolt and a processor that requires validation.

17. The method of claim 14, wherein the first sequence of signals is generated by a modified Secure Hash Standard message digest.

18. A system, comprising:
a first device with a memory, a processor and a transmitter, the processor configured to retrieve a first code from a plurality of codes in the memory on the first device, each code in the plurality of codes being associated with a signal sequence generator, wherein each of the plurality of codes determines a signal sequence generator that generates a unique sequence of signals, and each code is represented by a set of symbols, wherein:

the transmitter in the first device is configured to transmit the first code;

the processor in the first device is configured to install a signal sequence generator associated with the first code and to generate a first sequence of signals;

the transmitter in the first device configured to transmit the first sequence of signals after the first code has been transmitted; and the processor in the first device configured to disable the first code and to disable the signal sequence generator associated with the first code after transmission of the first code and to enable a next code and a next signal sequence generator after transmission of the first code;

a second device that includes a receiver, a memory and a processor, wherein:

the receiver is enabled to receive the first code and the sequence of signals generated by the signal sequence generator associated with the first code;

the processor of the second device is configured to install a signal sequence detector associated with the first code, and the signal sequence detector associated with the first code is configured to detect the first sequence of signals generated by the signal sequence generator associated with the first code;

the processor of the second device is configured to activate an element of the second device after the signal sequence detector associated with the first code detects the first sequence of signals generated by the signal sequence generator associated with the first code, and the processor in the second device configured to disable the first code and to disable the signal sequence detector associated with the first code after reception of the first code and to enable a next code and a next signal sequence detector after disabling the first code.

19. The system of claim 18, wherein the element of the second device includes one of the group consisting of a lock, a motor, a bolt and a processor that requires activation.

20. The system of claim 18, wherein the first sequence of signals is generated by a modified Secure Hash Standard method executed by the processor of the first device.

* * * * *